United States Patent
Gerhard et al.

(10) Patent No.: US 9,236,578 B2
(45) Date of Patent: Jan. 12, 2016

(54) ORGANIC ELECTROLUMINESCENT DEVICE

(75) Inventors: Anja Gerhard, Egelsbach (DE); Philipp Stoessel, Frankfurt am Main (DE); Dominik Joosten, Frankfurt am Main (DE); Holger Heil, Frankfurt am Main (DE); Christof Pflumm, Darmstadt (DE); Susanne Heun, Bad Soden (DE)

(73) Assignee: Merck Patent GmbH (DE)

(*) Notice: Subject to any disclaimer, the term of this patent is extended or adjusted under 35 U.S.C. 154(b) by 176 days.

(21) Appl. No.: 13/812,341

(22) PCT Filed: Jun. 24, 2011

(86) PCT No.: PCT/EP2011/003134
§ 371 (c)(1),
(2), (4) Date: Mar. 20, 2013

(87) PCT Pub. No.: WO2012/013271
PCT Pub. Date: Feb. 2, 2012

(65) Prior Publication Data
US 2013/0168663 A1    Jul. 4, 2013

(30) Foreign Application Priority Data
Jul. 30, 2010  (EP) .................................... 10007953

(51) Int. Cl.
*H01L 51/50* (2006.01)
*H01L 51/00* (2006.01)

(52) U.S. Cl.
CPC ........ *H01L 51/5004* (2013.01); *H01L 51/0002* (2013.01); *H01L 51/5016* (2013.01); *H01L 51/5036* (2013.01); *H01L 51/0067* (2013.01); *H01L 51/0085* (2013.01)

(58) Field of Classification Search
CPC ........................ H01L 51/5004; H01L 51/0002
USPC .............. 257/40, E51.008, E51.018, E51.019
See application file for complete search history.

(56) References Cited

U.S. PATENT DOCUMENTS

| 7,541,100 B2* | 6/2009 | Park et al. ...................... 428/690 |
| 7,575,817 B2* | 8/2009 | Lyu et al. ...................... 428/690 |
| 7,683,536 B2 | 3/2010 | Forrest et al. |
| 8,080,934 B2* | 12/2011 | Kido et al. .................... 313/504 |
| 8,273,467 B2* | 9/2012 | Sano et al. ..................... 428/690 |
| 2003/0178619 A1* | 9/2003 | Forrest et al. .................... 257/40 |

(Continued)

FOREIGN PATENT DOCUMENTS

| DE | 10343910 A1 | 5/2005 |
| EP | 1998387 A1 | 12/2008 |

(Continued)

OTHER PUBLICATIONS

International Search Report for PCT/EP2011/003134 mailed Nov. 2, 2011.

(Continued)

*Primary Examiner* — Ida M Soward
(74) *Attorney, Agent, or Firm* — Drinker Biddle & Reath LLP

(57) ABSTRACT

The present invention relates to phosphorescent organic electroluminescent devices include at least one phosphorescent emitter and a matrix material in the emitting layer, where certain conditions must be satisfied for the positions of the triplet energy and the HOMO and LUMO.

19 Claims, 5 Drawing Sheets

(56) References Cited

U.S. PATENT DOCUMENTS

| | | | |
|---|---|---|---|
| 2005/0012451 A1 | 1/2005 | Yuki et al. | |
| 2005/0221118 A1* | 10/2005 | Brunner et al. | 428/690 |
| 2006/0008671 A1* | 1/2006 | Kwong et al. | 428/690 |
| 2006/0158104 A1 | 7/2006 | Iijima et al. | |
| 2007/0037010 A1 | 2/2007 | Vestweber et al. | |
| 2007/0114915 A1 | 5/2007 | Gerhard et al. | |
| 2007/0122655 A1* | 5/2007 | Deaton et al. | 428/690 |
| 2007/0187673 A1* | 8/2007 | Zheng et al. | 257/40 |
| 2007/0207345 A1* | 9/2007 | Royster et al. | 428/690 |
| 2007/0252516 A1 | 11/2007 | Kondakova et al. | |
| 2007/0252521 A1* | 11/2007 | Kondakov et al. | 313/506 |
| 2008/0265758 A1* | 10/2008 | Han et al. | 313/504 |
| 2009/0026937 A1 | 1/2009 | Kinoshita et al. | |
| 2009/0091253 A1 | 4/2009 | Yasukawa et al. | |
| 2009/0206731 A1* | 8/2009 | Leadbeater et al. | 313/504 |
| 2009/0236974 A1* | 9/2009 | Tamaru et al. | 313/504 |
| 2010/0140605 A1 | 6/2010 | Shibata et al. | |
| 2010/0187519 A1* | 7/2010 | Morishita et al. | 257/40 |
| 2010/0193776 A1 | 8/2010 | Kinoshita et al. | |
| 2011/0108818 A1 | 5/2011 | Kaiser et al. | |
| 2013/0252028 A1* | 9/2013 | Otsu et al. | 428/704 |
| 2014/0335638 A1 | 11/2014 | Male et al. | |

FOREIGN PATENT DOCUMENTS

| | | |
|---|---|---|
| JP | 2005-005149 A | 1/2005 |
| JP | 2006-172762 A | 6/2006 |
| JP | 2006-186335 A | 7/2006 |
| JP | 2007-302630 A | 11/2007 |
| JP | 2008-177559 A | 7/2008 |
| JP | 2008-535266 A | 8/2008 |
| JP | 2009-032976 A | 2/2009 |
| JP | 2009-032977 A | 2/2009 |
| JP | 2009-535812 A | 10/2009 |
| JP | 2010-503193 A | 1/2010 |
| WO | WO-2007/108362 A1 | 9/2007 |
| WO | WO-2010/069442 A1 | 6/2010 |

OTHER PUBLICATIONS

Virgili et al., "Highly efficient exciplex phosphorescence from organic light-emitting diodes", Chemical Physics Letters, vol. 433, pp. 145-149 (Nov. 15, 2006).

Kalinowski et al., "Mixing of Excimer and Exciplex Emission: A NewWay to Improve White Light Emitting Organic Electrophosphorescent Diodes", Adv. Mater., vol. 19, pp. 4000-4005 (Oct. 26, 2007).

Kalinowski et al., "Excimers and exciplexes in organic electroluminescence", Materials Science-Poland, Versita, vol. 27, No. 3, pp. 735-756 (Jan. 8, 2009).

Seo et al., "Triplet state and phosphorescence of hole-transport layer and its triplet exciton confinement", Chemical Physics Letters, vol. 499, pp. 226-230 (Sep. 25, 2010).

\* cited by examiner

ORGANIC ELECTROLUMINESCENT DEVICE

CROSS-REFERENCE TO RELATED APPLICATIONS

This application is a national stage application (under 35 U.S.C. §371) of PCT/EP2011/003134, filed Jun. 24, 2011, which claims benefit of European Application 10007953.2, filed Jul. 30, 2010.

BACKGROUND OF THE INVENTION

The present invention relates to phosphorescent organic electroluminescent devices which, by observing certain relative energy levels of the materials in the emitting layer, exhibit an emission which is shifted to longer wavelength or mixed emission comprising the emission of the phosphorescent emitter and an emission which is shifted to longer wavelength.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. A development in the area of organic electroluminescent devices are phosphorescent OLEDs. These have significant advantages compared with fluorescent OLEDs owing to the higher achievable efficiency.

The technical object on which the present invention is based consists in providing a phosphorescent organic electroluminescent device in which the emission colour and the width of the emission band can be varied or adjusted specifically.

In accordance with the prior art, electron-conducting materials, inter alia ketones (for example in accordance with WO 2004/093207 or WO 2010/006680) or triazine derivatives (for example in accordance with WO 2010/015306), or hole-conducting materials, inter alia triarylamines or carbazole derivatives, are used as matrix materials for phosphorescent emitters.

In accordance with the prior art, the phosphorescent emitters used are furthermore, in particular, iridium and platinum complexes, which usually have bidentate ligands which are coordinated to the metal via a carbon atom and a nitrogen atom. An example of such phosphorescent emitters is tris (phenylpyridyl)iridium(III).

The prior art (for example in accordance with WO 2010/086089 or the unpublished application EP 10006208.2) additionally discloses metal complexes with imidazoisoquinoline and derivatives as ligands. Furthermore, the prior art (WO 2007/095118) discloses metal complexes with imidazophenanthridine or diimidazoquinazoline and derivatives as ligands. Many of these metal complexes emit blue or blue-green light.

Surprisingly, it has been found that the emission colour of an organic electroluminescent device can be shifted selectively over a broad range if certain physical parameters are observed for the choice of the phosphorescent emitter and of the matrix material. The organic electroluminescent device here has very good efficiency and lifetime. Likewise, broad emission bands which are suitable for the generation of white emission are accessible in this way.

WO 2003/059015 discloses that white-emitting organic electroluminescent devices are accessible through the use of emitters which form aggregates. Two emitters are doped into an emitting layer here, where one of the emitters forms aggregates. The formation of aggregates is highly dependent on the concentration of the emitters, which suggests aggregate formation between the emitters. The aggregate here has a broad emission band. For this aggregate formation, the use of planar compounds, for example platinum complexes, is suitable, but the use of complexes which have bulky substituents, such as, for example, tert-butyl groups, or the use of octahedral complexes is not.

The invention relates to an organic electroluminescent device comprising anode, cathode and at least one emitting layer which comprises at least one phosphorescent compound A and at least one compound B, characterised in that the following relationships (1) or the following relationships (2) apply to compounds A and B:

$T_1(B) \geq \Delta E$, where $\Delta E = |\text{HOMO}(A)| - |\text{LUMO}(B)|$;     a)

$T_1(A) \geq \Delta E$, where $\Delta E = |\text{HOMO}(A)| - |\text{LUMO}(B)|$;     b)

$|\text{HOMO}(B)| > |\text{HOMO}(A)|$; and     c)

$|\text{LUMO}(B)| > |\text{LUMO}(A)|$     d) (1)

or $T_1(B) \geq \Delta E$, where $\Delta E = |\text{HOMO}(B)| - |\text{LUMO}(A)|$;     a)

$T_1(A) \geq \Delta E$, where $\Delta E = |\text{HOMO}(B)| - |\text{LUMO}(A)|$;     b)

$|\text{LUMO}(A)| > |\text{LUMO}(B)|$; and     c)

$|\text{HOMO}(A)| > |\text{HOMO}(B)|$     d) (2)

the following materials are excluded from the invention as compound B:

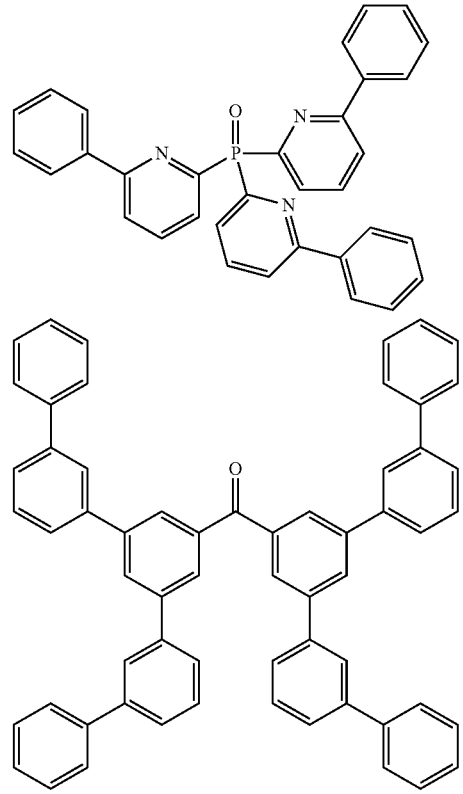

-continued

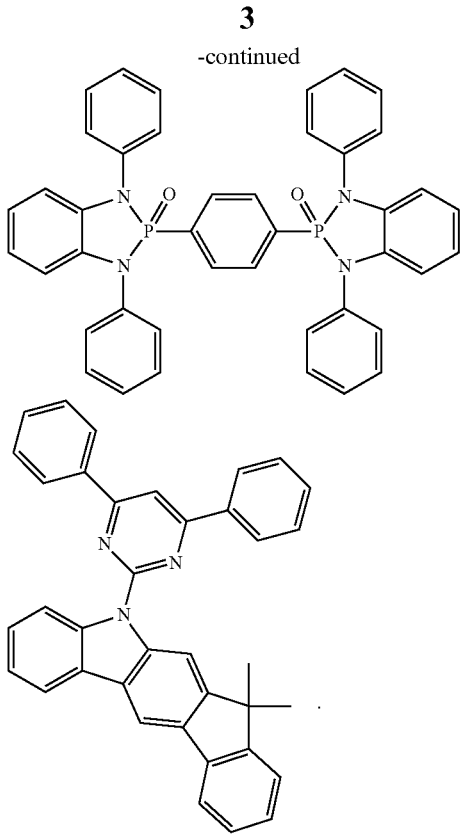

A BRIEF DESCRIPTION OF THE FIGURES

FIG. 1 shows the standardised photoluminescence spectra of emitters TEB-1, TEB-2, TEB-3 and TEG-1 used in a 10 5 molar solution in toluene.

FIG. 2 shows the standardised electroluminescence spectra for Examples 1 and 2.

FIG. 3 shows the standardised electroluminescence spectra for Examples 3 to 5.

FIG. 4 shows the standardised electroluminescence spectra for Examples 1, 5 and 6.

FIG. 5 shows the standardised electroluminescence spectra for Examples 7 and 8.

FIG. 6 shows the difference of CIEx and CIEy from the electroluminescence spectra of TEG-1 in matrices M4 to M9 from CIEx and CIEy of TEG 1 in matrix M4 (Examples 7 to 12).

FIG. 7 shows the standardised electroluminescence spectrum for Example 17.

FIG. 8 shows the standardised electroluminescence spectra for Examples 18 and 19.

FIG. 9 illustrates the structure of the organic electroluminescent device according to the invention.

A DETAILED DESCRIPTION OF THE INVENTION

A phosphorescent compound in the sense of this invention is a compound which exhibits luminescence from an excited state having relatively high spin multiplicity, i.e. a spin state >1, in particular from an excited triplet state, at room temperature. For the purposes of this invention, all luminescent transition-metal and lanthanoid complexes, in particular all luminescent iridium, platinum and copper compounds, are to be regarded as phosphorescent compounds.

Compound B here is the matrix material for the phosphorescent compound. A matrix material in the sense of the present invention is a material which is present in a relatively large proportion in the emitting layer, i.e. in a proportion of >50% in the case of a mixture of precisely one matrix material with precisely one emitter. It is not excluded here that the matrix material also participates in the emission from the layer.

The parameters used in the above-mentioned relationships have the following meanings:

$T_1(A)$ is the lowest triplet energy (in eV) of phosphorescent compound A. $T_1(B)$ is the lowest triplet energy of compound B. $T_1(B)$ is determined by quantum-chemical calculation and $T_1(A)$ is determined from the photoluminescence spectrum in solution, as generally described in detail in the example part.

HOMO(A) is the energy level of the HOMO (highest occupied molecular orbital, in eV) relative to vacuum of phosphorescent compound A. HOMO(B) is correspondingly the energy level of the HOMO of compound B. These parameters are determined by quantum-chemical calculation, as generally described in detail in the example part.

LUMO(A) is the energy level of the LUMO (lowest unoccupied molecular orbital, in eV) relative to vacuum of phosphorescent compound A. LUMO(B) is the energy level of the LUMO of compound B. These parameters are determined by quantum-chemical calculation, as generally described in detail in the example part.

The values of the HOMO and of the LUMO are negative numerical values here. For the above-mentioned relationships, the modulus of the HOMO or the modulus of the LUMO is therefore used. This is made clear by the vertical lines. Thus, if the HOMO determined quantum-chemically for a compound A is, for example, −5.2 eV, then |HOMO(A)| means the modulus of this value, i.e. 5.2 eV.

The organic electroluminescent device according to the invention comprises, as described above, anode, cathode and at least one emitting layer, which is arranged between the anode and the cathode. The emitting layer here comprises at least one phosphorescent compound A and furthermore at least one compound B, where the above-mentioned conditions apply to compounds A and B. The organic electroluminescent device need not necessarily comprise only layers which are built up from organic or organometallic materials. Thus, it is also possible for the anode, cathode and/or one or more layers to comprise inorganic materials or to be built up entirely from inorganic materials.

Furthermore, the emitting layer may, apart from material B, comprise any desired number of further materials C which are also matrix materials for phosphorescent compound A. The following applies to each of these materials C:

$T_1(C) \geq T_1(A)$     a)

$T_1(C) \geq T_1(B)$     b)

$|HOMO(C)| > |HOMO(A)|$ and $|HOMO(C)| > |HOMO(B)|$;     c)

$|LUMO(C)| < |LUMO(A)|$ and $|LUMO(C)| < |LUMO(B)|$     d)

$T_1(C)$, HOMO(C) and LUMO(C) here is defined analogously to materials A and B.

Material B preferably has a glass-transition temperature $T_G$ of greater than 70° C., particularly preferably greater than 90° C., very particularly preferably greater than 110° C.

If materials C are present, these materials C also preferably have a glass-transition temperature $T_G$ of greater than 70° C., particularly preferably greater than 90° C., very particularly preferably greater than 110° C.

The proportion of phosphorescent compound A in the emitting layer is preferably 0.1 to 50% by vol., particularly preferably 1 to 30% by vol., very particularly preferably 3 to 25% by vol., in articular 5 to 20% by vol.

Correspondingly, the proportion of matrix material B in the emitting layer is, if precisely one matrix material is used, preferably 50 to 99.9% by vol., particularly preferably 70 to 99% by vol., very particularly preferably 75 to 97% by vol., in particular 80 to 95% by vol.

If further matrix materials C are used, the proportion of matrix material B is generally reduced correspondingly. The total proportion of all further matrix materials C is preferably 0 to 50% by vol., particularly preferably 0 to 30% by vol. and very particularly preferably 0 to 20% by vol.

In a preferred embodiment of the invention, the emitting layer consists only of compounds A and B.

For the above-mentioned relationships (1) a) to d) and (2) a) to d), the following preferably applies:

ΔE is preferably greater than 1.9 eV, particularly preferably greater than 2.05 eV, very particularly preferably greater than 2.15 eV.

$T_1(A)$ is preferably greater than 2.3 eV, particularly preferably greater than 2.5 eV.

If the above-mentioned relationship (1) is satisfied, |HOMO(B)| is preferably at least 0.05 eV greater than 1 HOMO(A)|, particularly preferably at least 0.1 eV, very particularly preferably 0.2 eV.

If the above-mentioned relationship (2) is satisfied, |LUMO(A)| is preferably at least 0.05 eV greater than 1 LUMO(B)|, particularly preferably at least 0.1 eV, very particularly preferably 0.2 eV.

Preferred embodiments of phosphorescent compound A and of compound B which are present in the emitting layer in accordance with the invention are indicated below.

If the above-mentioned relationships (1) are satisfied, compound B is a rather electron-transporting compound.

Suitable electron-transporting compounds B are preferably selected from the group consisting of aromatic ketones, aromatic phosphine oxides, aromatic sulfoxides, aromatic sulfones, triazine derivatives, pyrimidine derivatives, pyridine derivatives, zinc complexes, for example in accordance with WO 2009/062578, aluminium complexes, diazaphospholes, for example in accordance with WO 2010/054730, azaboroles or boronic esters, for example in accordance with WO 2006/117052, boranes, for example in accordance with WO 2002/052661, or triphenylene derivatives.

An aromatic ketone in the sense of this application is taken to mean a carbonyl group to which two aromatic or heteroaromatic groups or aromatic or heteroaromatic ring systems are bonded directly. Aromatic sulfones and sulfoxides are defined correspondingly. An aromatic phosphine oxide in the sense of this application is taken to mean a phosphine oxide group to which three aromatic or heteroaromatic groups or aromatic or heteroaromatic ring systems are bonded directly.

In a preferred embodiment of the invention, the aromatic ketone is a compound of the following formula (1a) and the aromatic phosphine oxide is a compound of the following formula (1b),

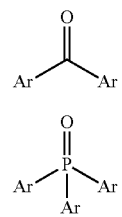

formula (1a)

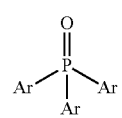

formula (1b)

where the following applies to the symbols used:

Ar is on each occurrence, identically or differently, an aromatic or heteroaromatic ring system having 5 to 60 aromatic ring atoms, which may in each case be substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, N(R$^2$)$_2$, N(Ar$^1$)$_2$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, C=O, C=S, C=NR$^2$, P(=O)(R$^2$), SO, SO$_2$, NR$^2$, O, S or CONR$^2$ and where one or more H atoms may be replaced by F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which may be substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 40 aromatic ring atoms, which may be substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms may be replaced by F; two or more adjacent substituents R$^2$ here may also form a mono- or polycyclic, aliphatic or aromatic ring system with one another.

An aryl group in the sense of this invention contains at least 6 C atoms; a heteroaryl group in the sense of this invention contains at least 2 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be connected by a short non-aromatic unit (preferably less than 10% of the atoms other than H), such as, for example, a C, N or O atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems in the sense of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo-[2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl or cyclooctenyl. A $C_2$- to $C_{40}$-alkynyl group is preferably taken to mean ethynyl, propynyl, butynyl, pentynyl, hexynyl, heptynyl or octynyl. A $C_1$- to $C_{40}$-alkoxy group is preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxanimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Suitable compounds of the formula (1a) are, in particular, the ketones disclosed in WO 2004/093207 and WO 2010/006680, and suitable compounds of the formula (1b) are the phosphine oxides disclosed in WO 2005/003253. These are incorporated into the present invention by way of reference.

It is evident from the definition of the compounds of the formula (1a) and (1b) that they do not have to contain just one carbonyl or phosphine oxide group, but instead may also contain a plurality of these groups.

The group Ar in compounds of the formula (1a) and (1b) is preferably an aromatic ring system having 6 to 40 aromatic C atoms, i.e. it does not contain any heteroaryl groups. As defined above, the aromatic ring system does not necessarily have to contain only aromatic groups, but instead two aryl groups may also be linked by a non-aromatic group, for example by a further carbonyl group or phosphine oxide group.

In a further preferred embodiment of the invention, the group Ar contains not more than two condensed rings. It is thus preferably built up only from phenyl and/or naphthyl groups, particularly preferably only from phenyl groups, but does not contain any larger condensed aromatic groups, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tertbutylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p,p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridazinyl, 2-(1,3,5-triazin)yl, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals.

The groups Ar may, as described above, be substituted by one or more radicals $R^1$. These radicals $R^1$ are preferably selected, identically or differently on each occurrence, from the group consisting of H, F, CN, C(=O)Ar$^1$, P(=O)(Ar$^1$)$_2$, S(=O)Ar$^1$, S(=O)$_2$Ar$^1$, a straight-chain alkyl group having 1 to 4 C atoms or a branched or cyclic alkyl group having 3 to 5 C atoms, each of which may be substituted by one or more radicals $R^2$, where one or more H atoms may be replaced by F, or an aromatic or heteroaromatic ring system having 6 to 24 aromatic ring atoms, which may be substituted by one or more radicals $R^2$, or a combination of these systems; two or more adjacent substituents $R^1$ here may also form a mono- or polycyclic, aliphatic or aromatic ring system with one another. If the organic electroluminescent device is applied from solution, straight-chain, branched or cyclic alkyl groups having up to 10 C atoms are also preferred as substituents $R^1$. The radicals $R^1$ are particularly preferably selected, identically or differently on each occurrence, from the group consisting of H, C(=O)Ar$^1$ or an aromatic ring system having 6 to 24 aromatic ring atoms, which may be substituted by one or more radicals $R^2$, but is preferably unsubstituted.

In a further preferred embodiment of the invention, the group Ar$^1$ is, identically or differently on each occurrence, an aromatic ring system having 6 to 24 aromatic ring atoms, which may be substituted by one or more radicals R². Ar¹ is particularly preferably, identically or differently on each occurrence, an aromatic ring system having 6 to 12 aromatic ring atoms.

Particularly preferred aromatic ketones are benzophenone derivatives which are substituted in each of the 3,3',5,5'-positions by an aromatic or heteroaromatic ring system having 5 to 30 aromatic ring atoms, which may in turn be substituted by one or more radicals R¹ as defined above. Preference is furthermore given to ketones and phosphine oxides which are substituted by at least one spirobifluorene group.

Preferred aromatic ketones are therefore the compounds of the following formulae (2) to (5),

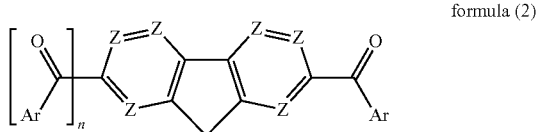

formula (2)

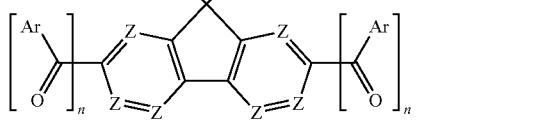

formula (3)

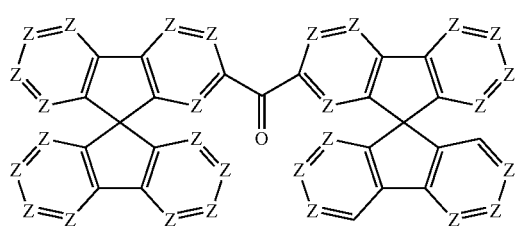

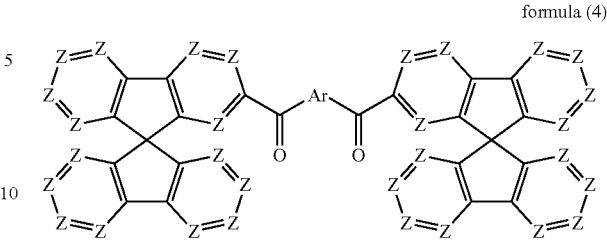

formula (4)

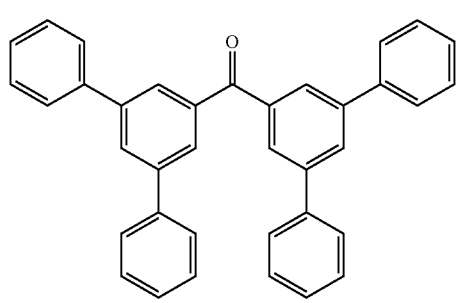

formula (5)

where Ar and R¹ have the same meaning as described above, and furthermore:

Z is, identically or differently on each occurrence, $CR^1$ or N;

n is, identically or differently on each occurrence, 0 or 1.

Ar in the above-mentioned formula (2), (4) and (5) preferably stands for an aromatic or heteroaromatic ring system having 1 to 30 aromatic ring atoms, which may be substituted by one or more radicals R¹. The groups Ar mentioned above are particularly preferred.

Examples of suitable compounds of the formula (1a) to (5) are compounds (1) to (62) depicted below.

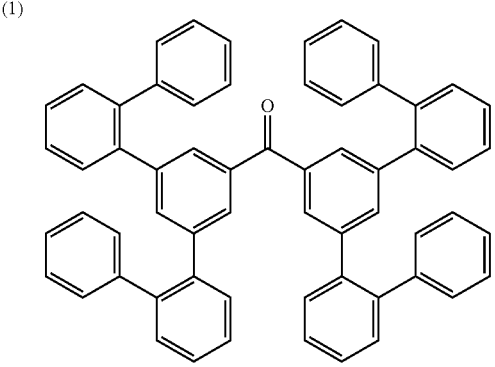

(1)

(2)

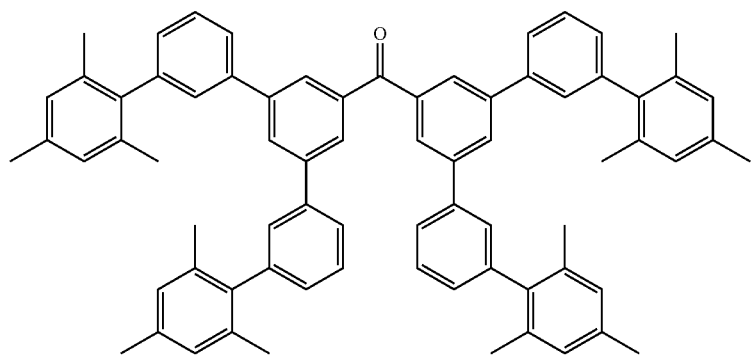

(3)

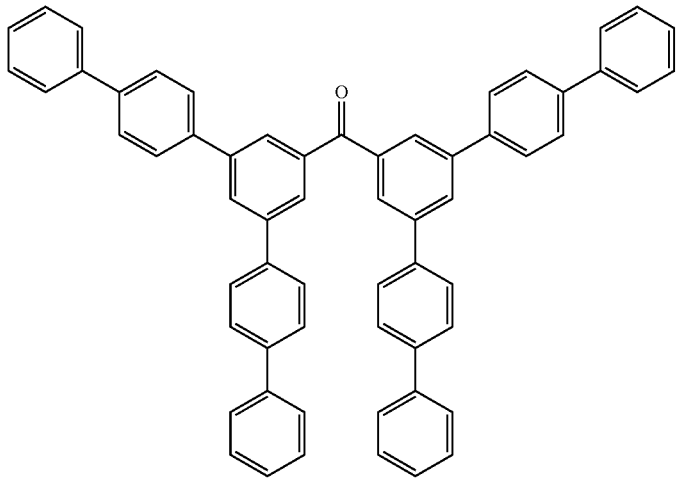
(4)
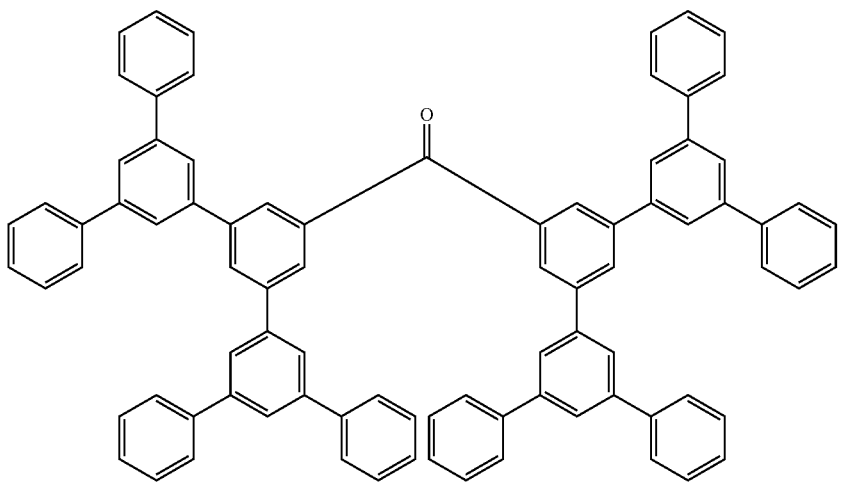
(5)
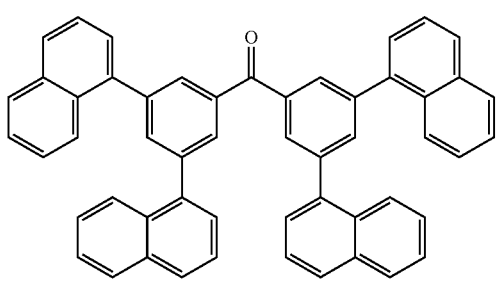
(6)
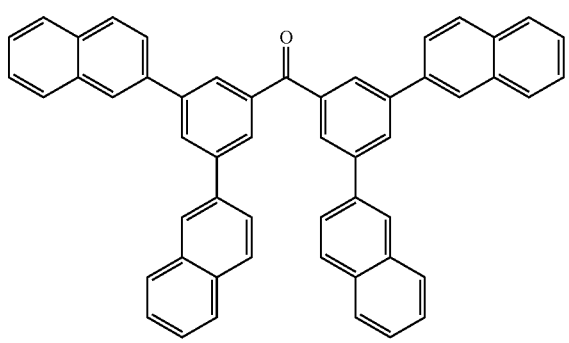
(7)

-continued
(8)
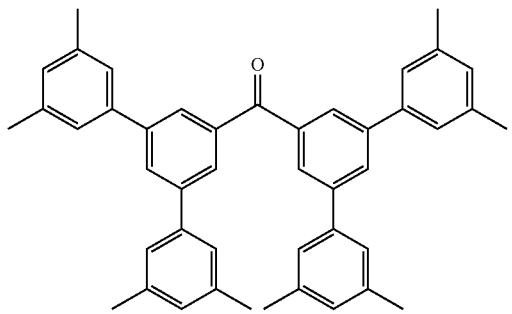
(9)
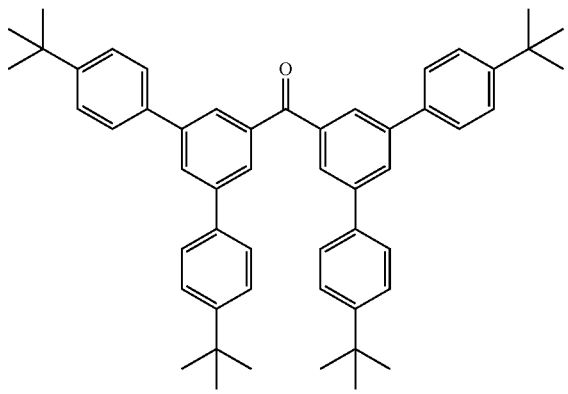
(10)
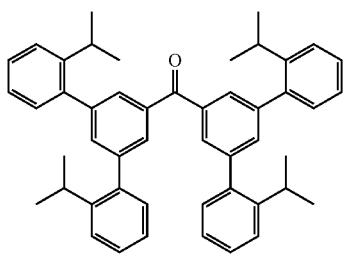
(11)
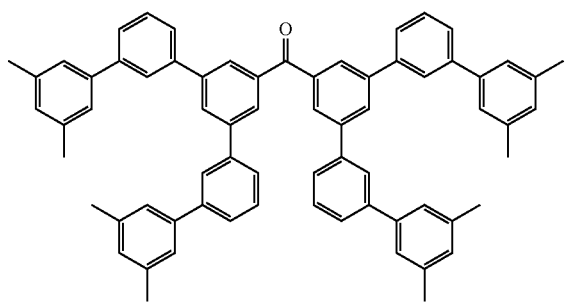
(12)
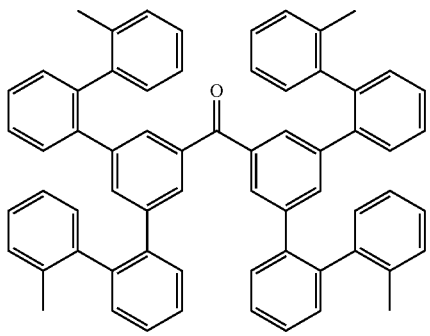
(13)
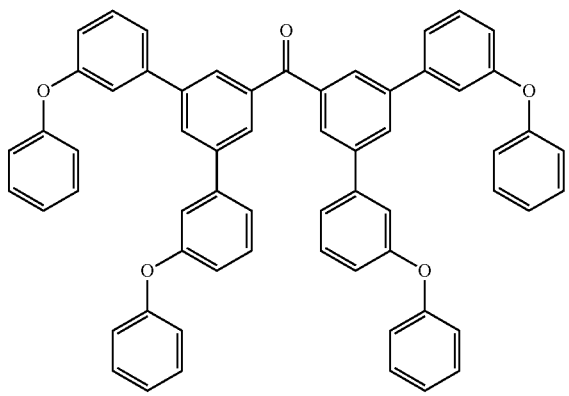
(14)
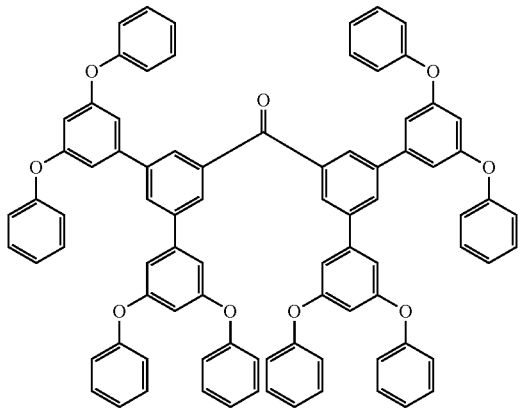
(15)
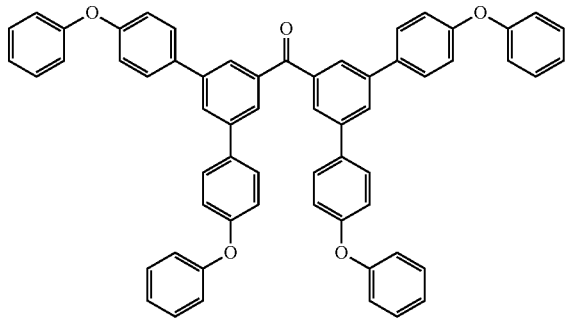

-continued
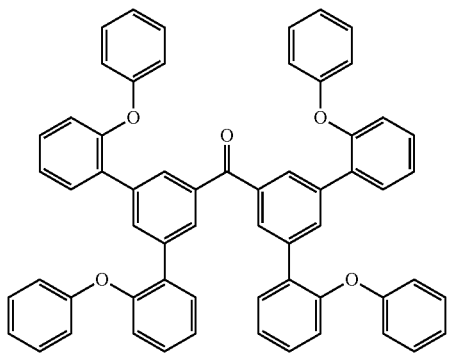
(16)
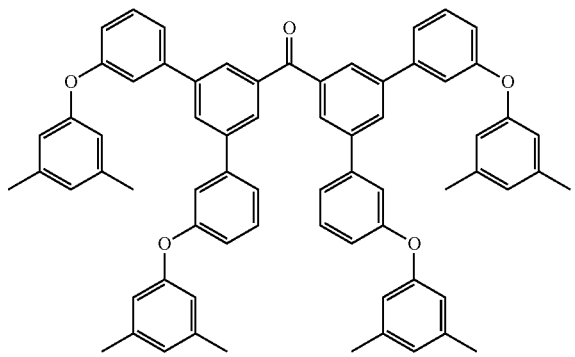
(17)
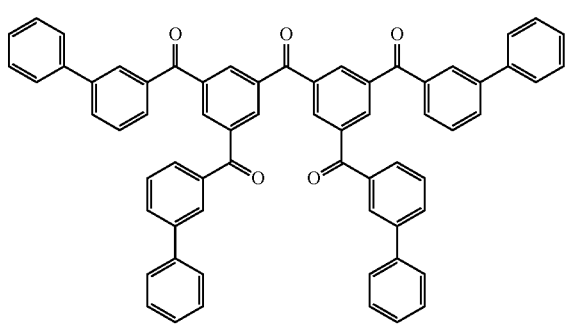
(18)
(19)
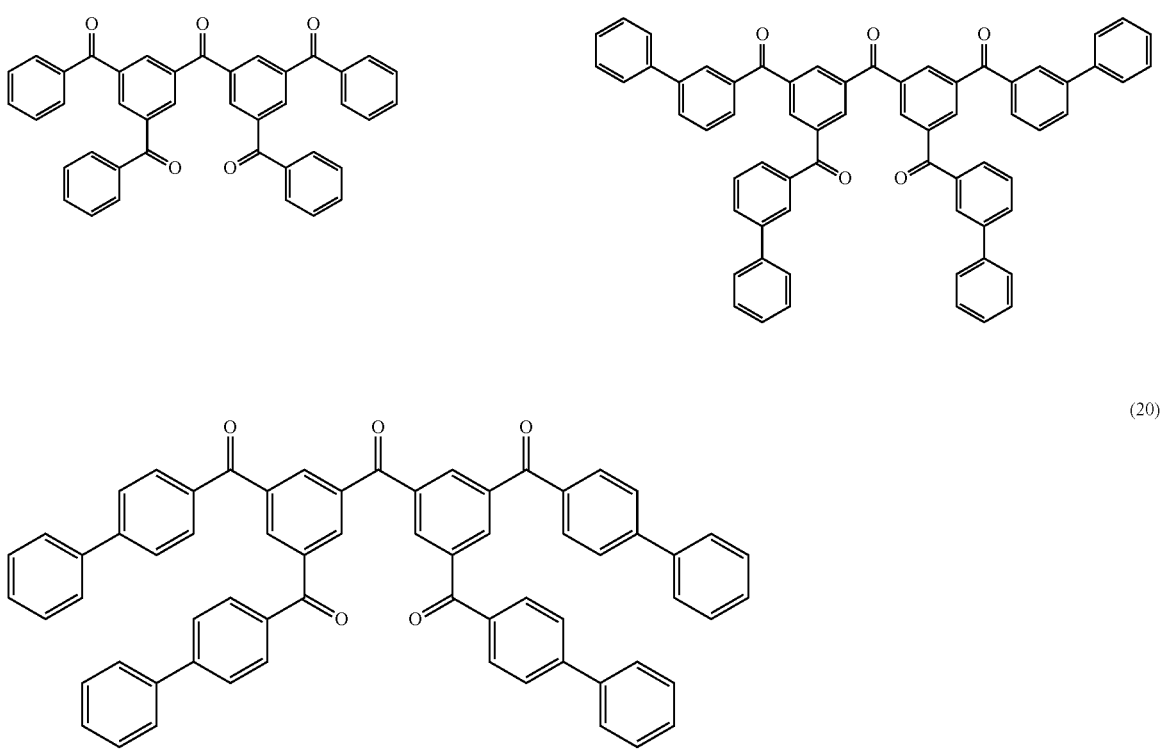
(20)
(21)
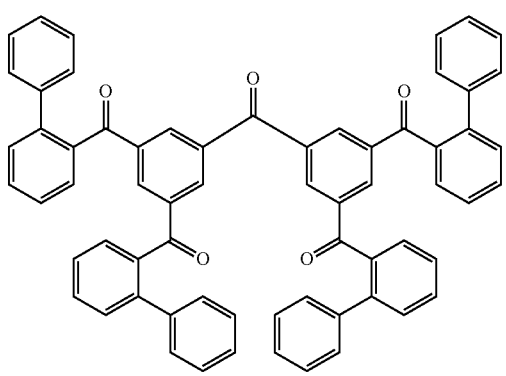
(22)

(23) 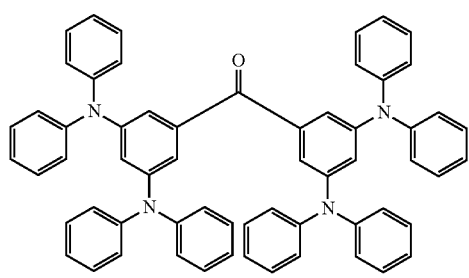
(24) 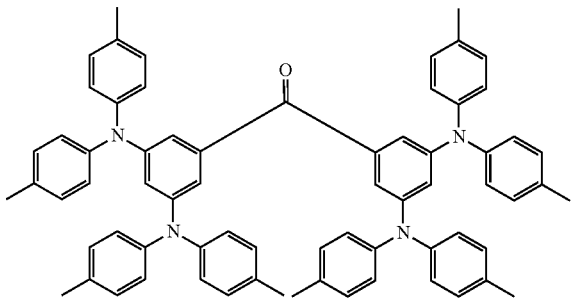
(25) 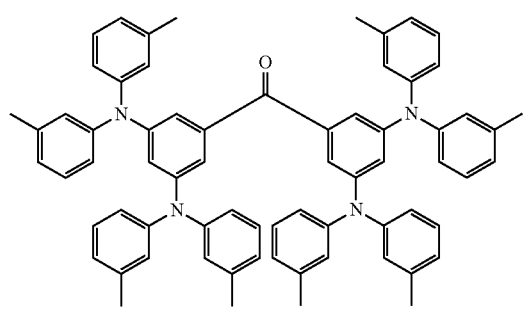
(26) 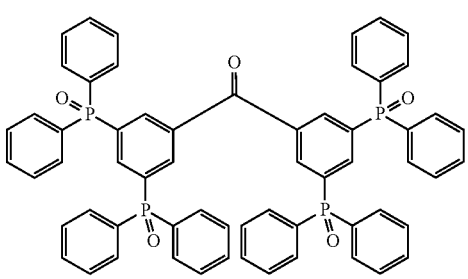
(27) 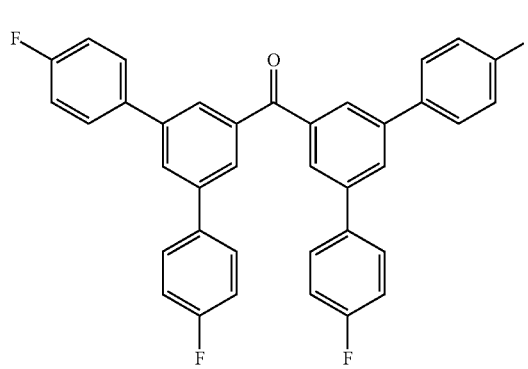
(28) 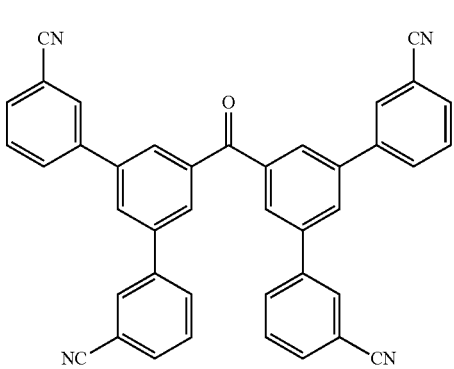
(29) 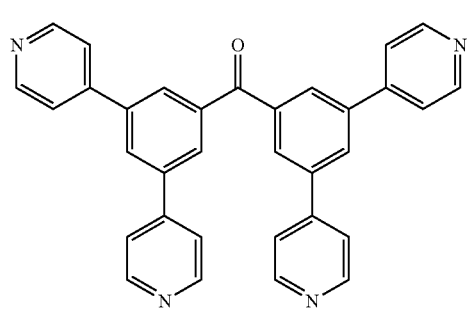
(30) 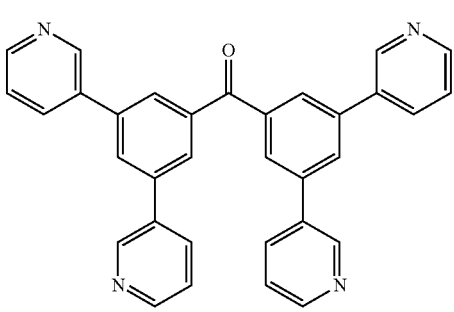

-continued
(31)
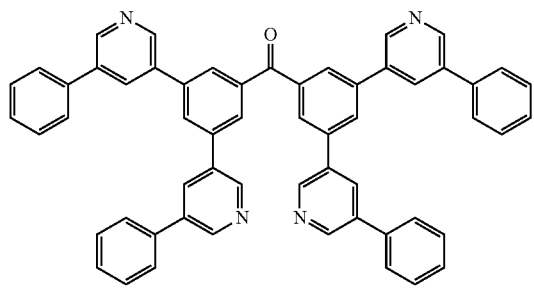
(32)
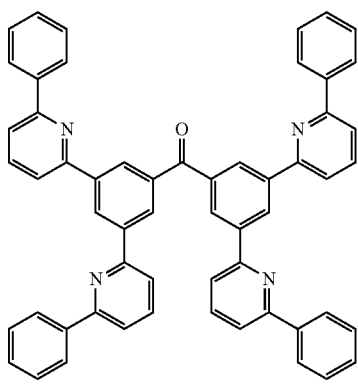
(33)
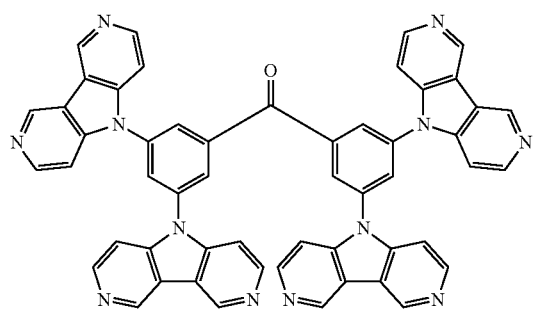
(34)
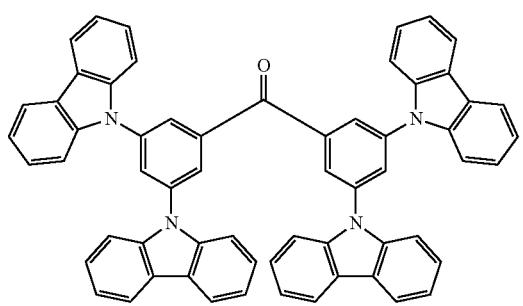
(35)
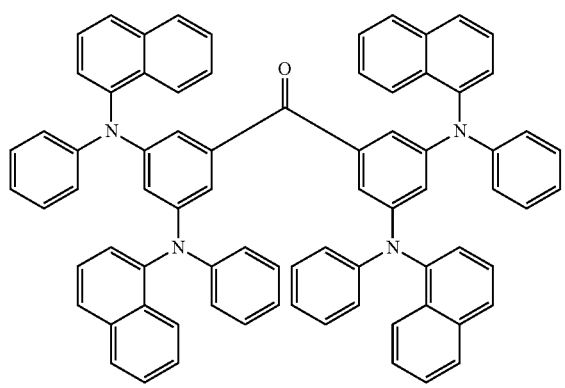
(36)
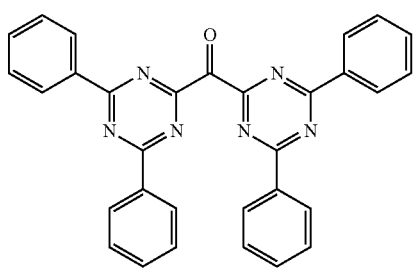
(37)
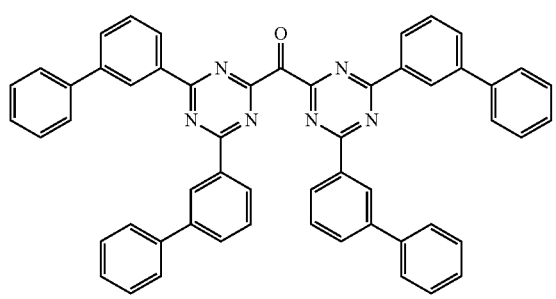
(38)
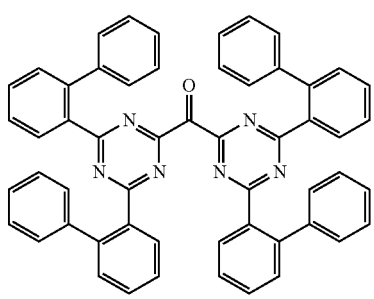

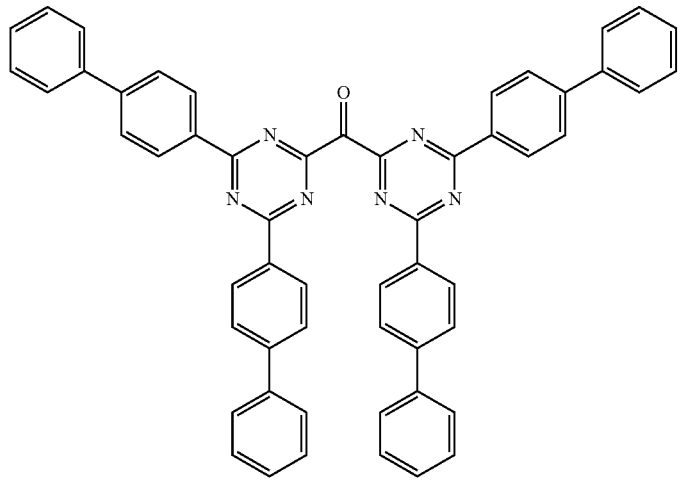
(39)
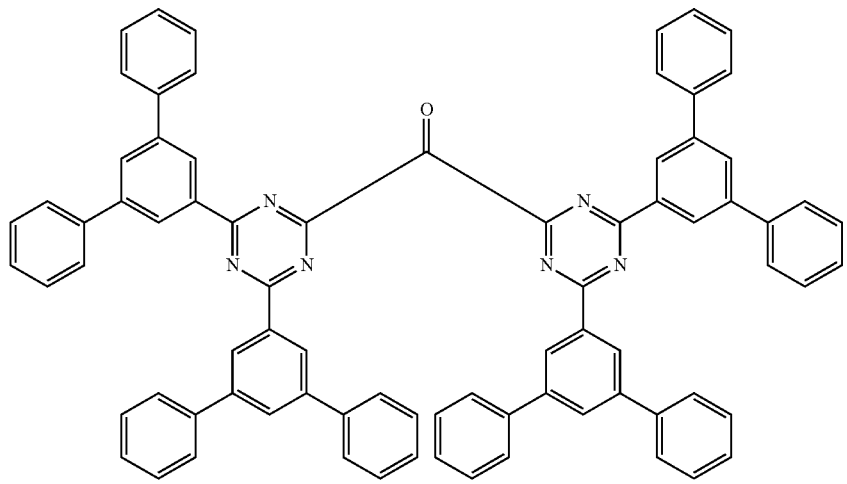
(40)
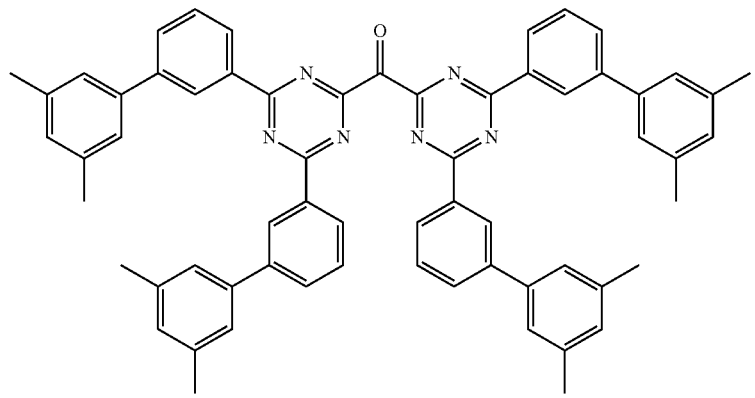
(41)

-continued
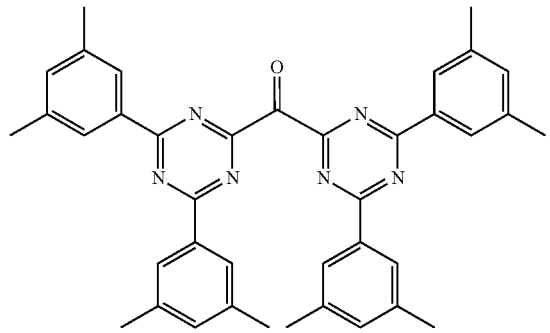
(42)
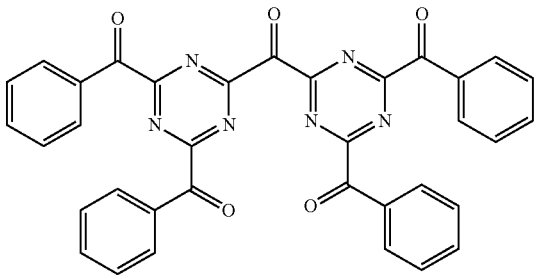
(43)
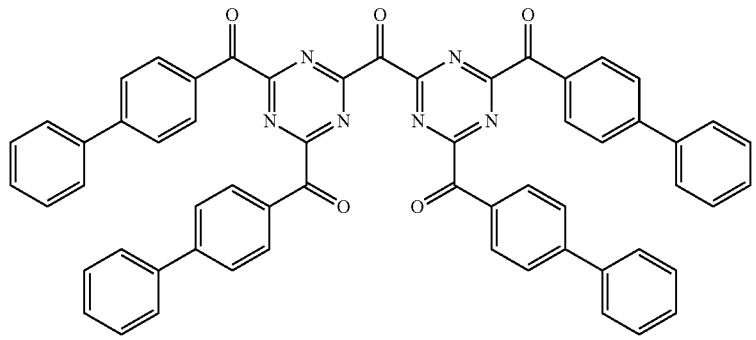
(44)
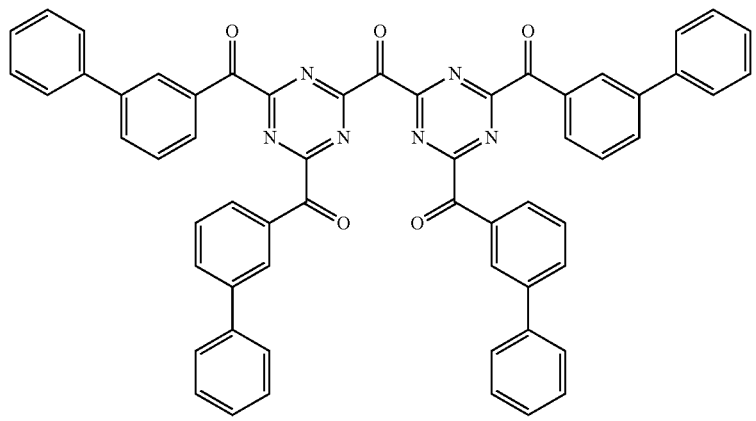
(45)
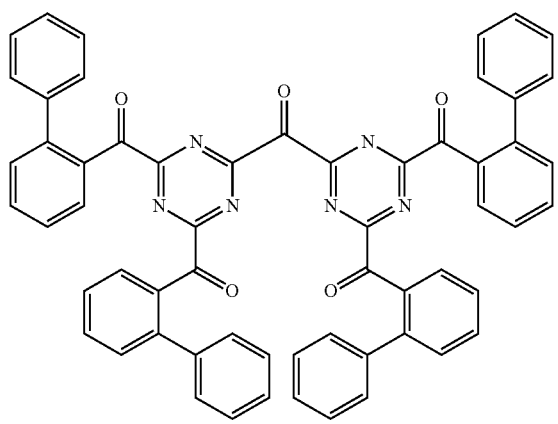
(46)
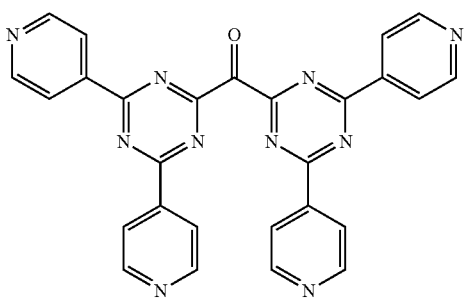
(47)

-continued
(48)
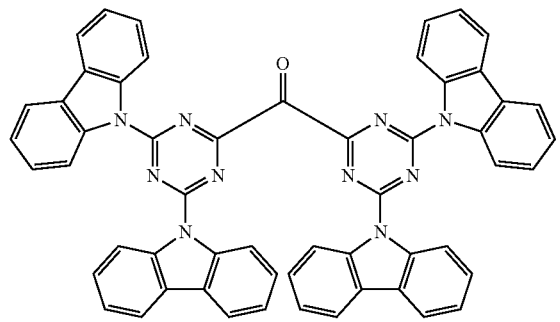
(49)
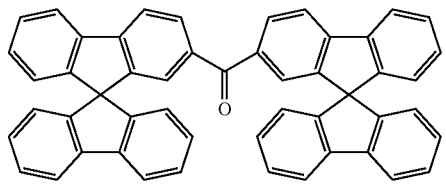
(50)
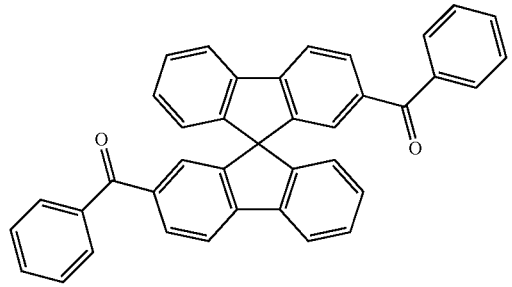
(51)
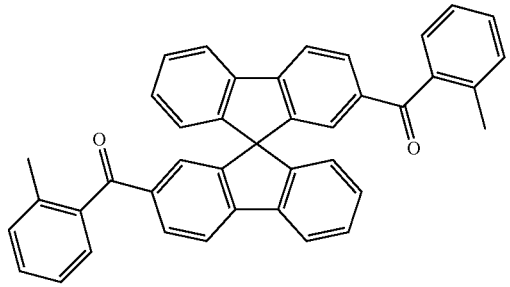
(52)
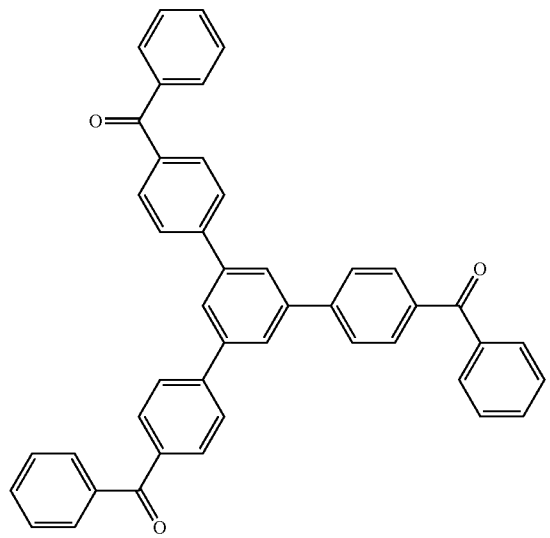
(53)
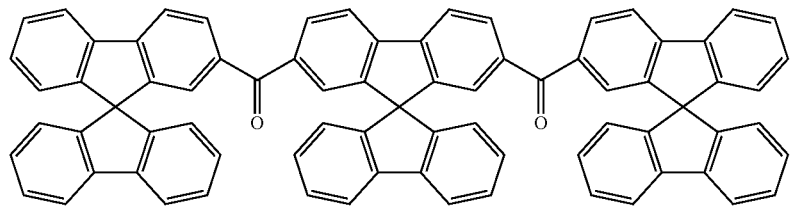
(54)
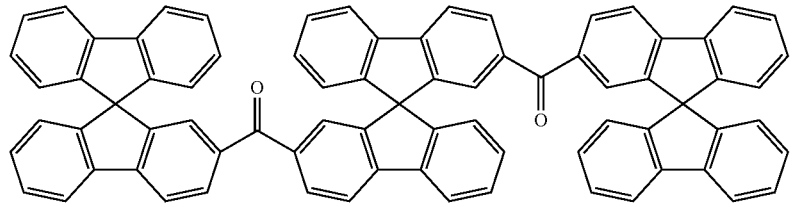

-continued
(55)
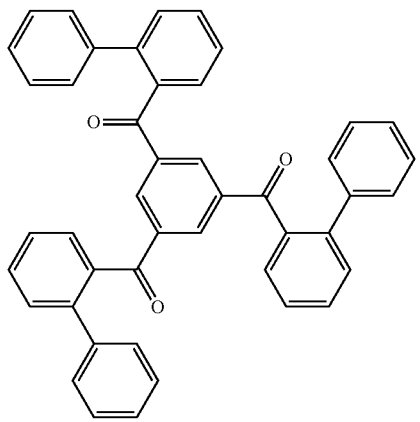
(56)
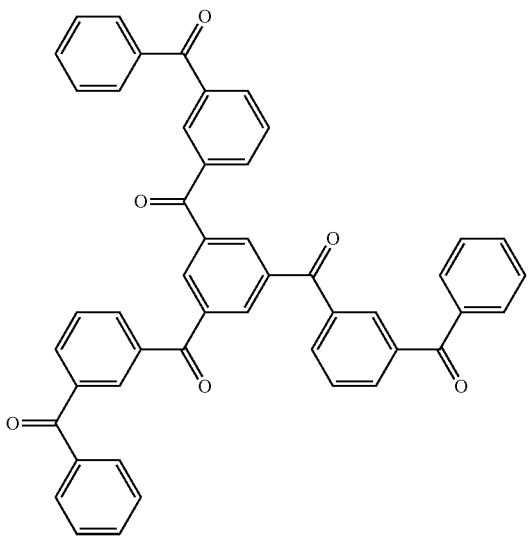
(57)
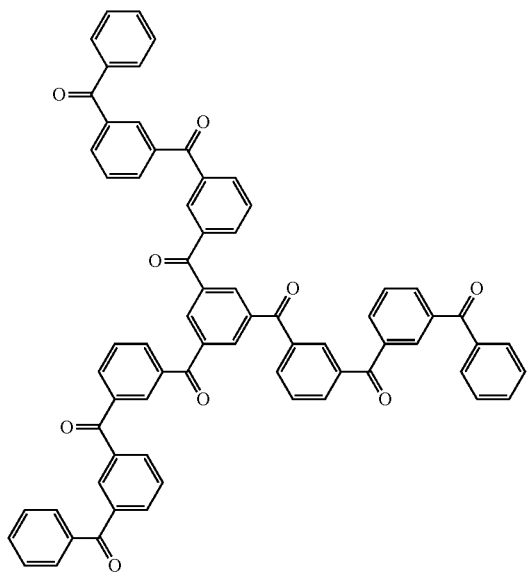
(58)
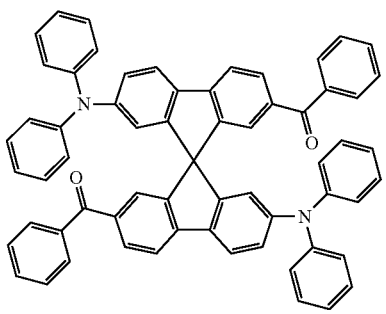
(59)
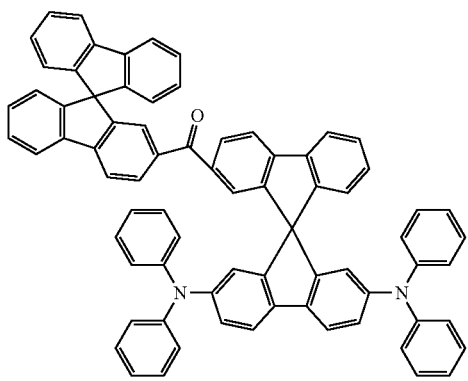
(60)
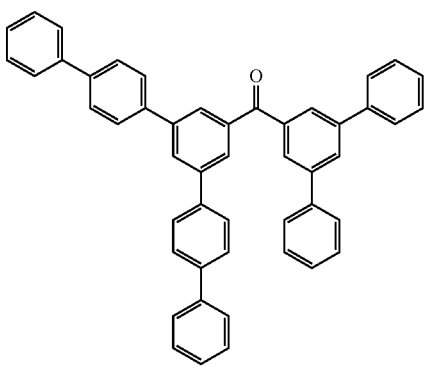

(61)
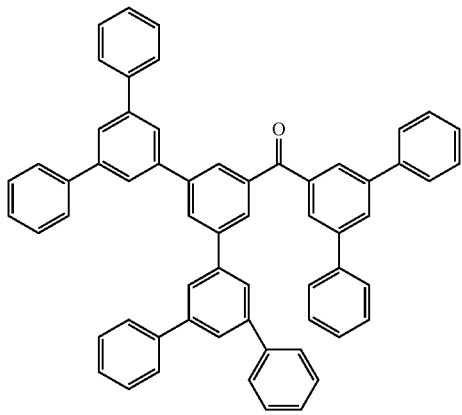
(62)
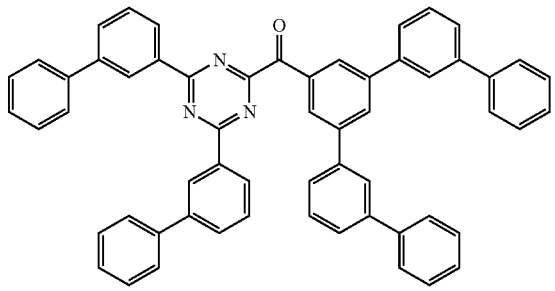
Examples of suitable aromatic phosphine oxide derivatives are compounds (1) to (18) depicted below.
(1)
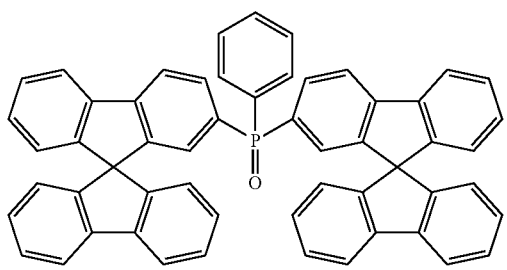
(2)
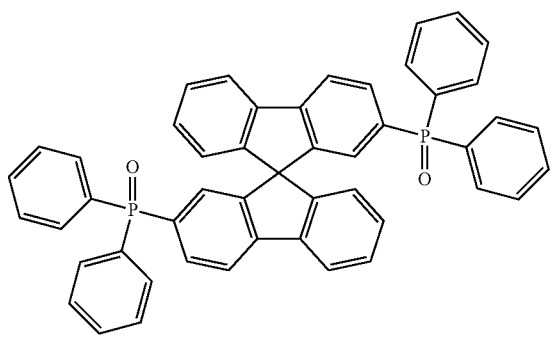
(3)
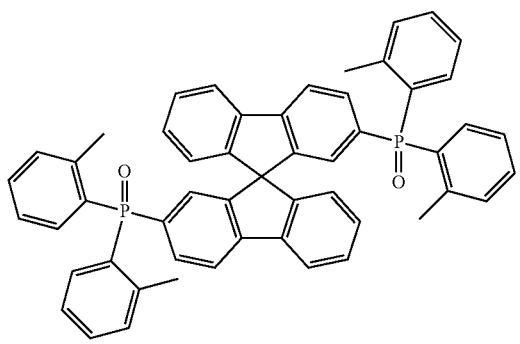
(4)
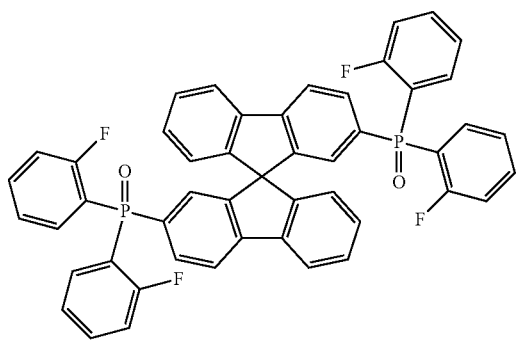
(5)
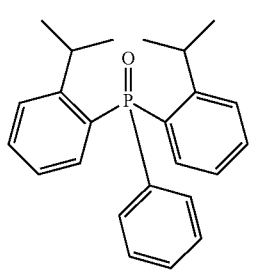
(6)
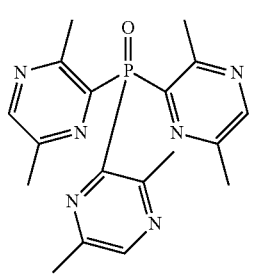

(7)
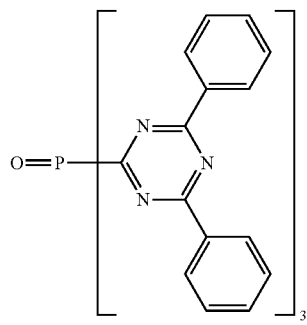
(8)
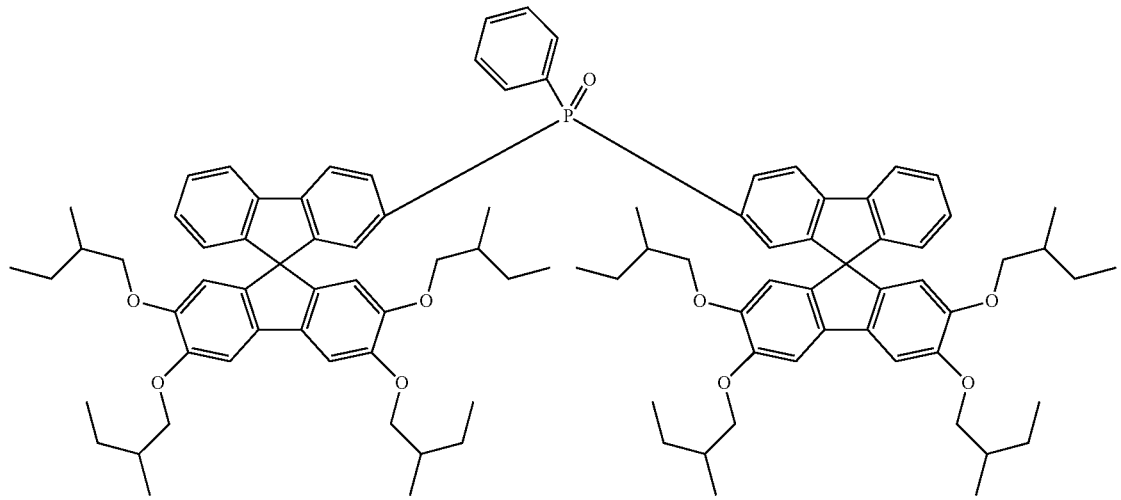
(9)
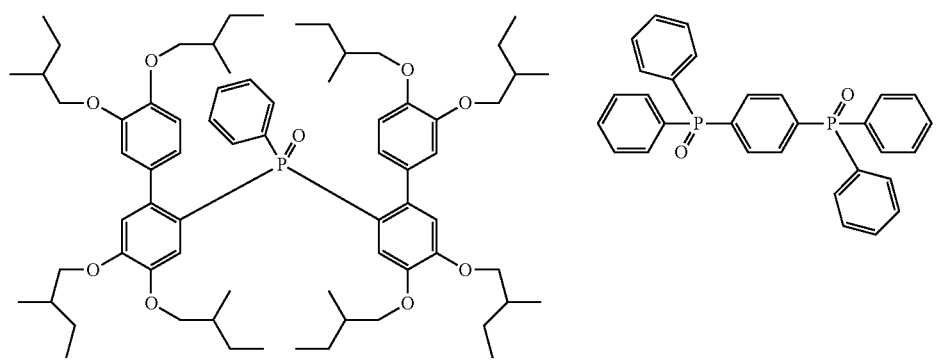
(10)
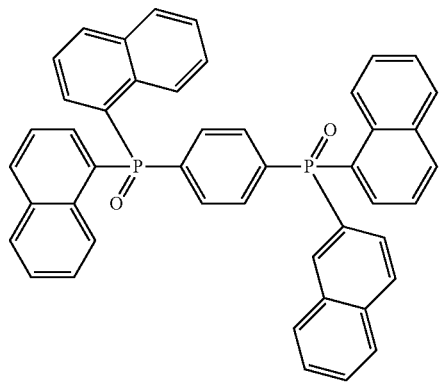
(11)
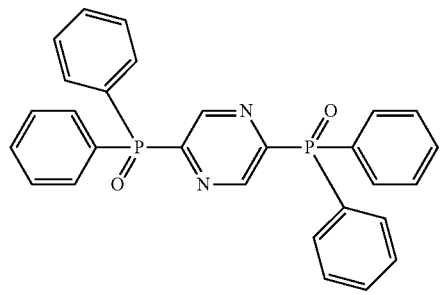
(12)

-continued
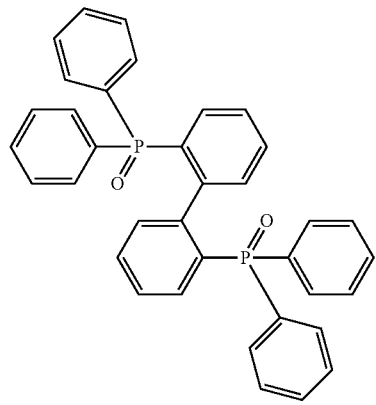
(13)
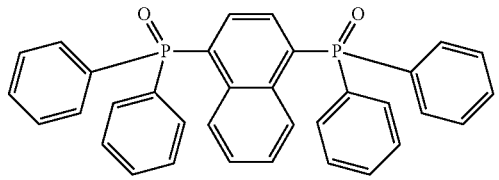
(14)
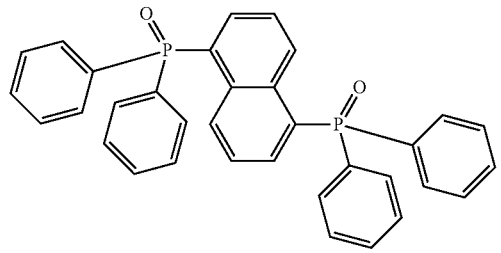
(15)
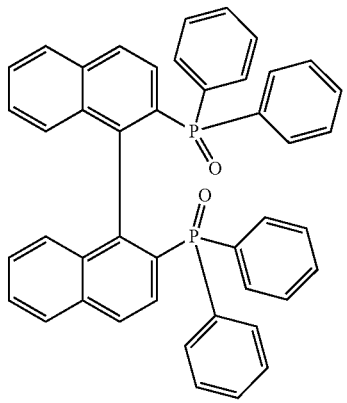
(16)
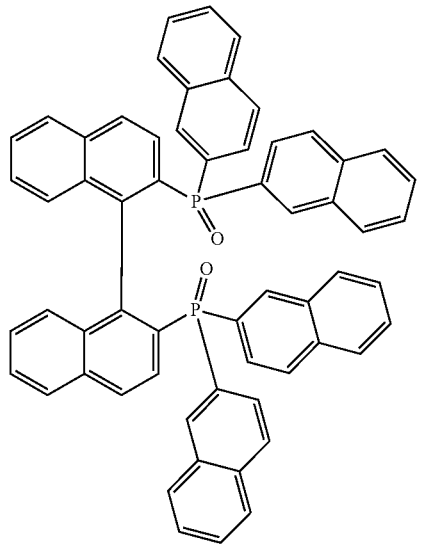
(17)
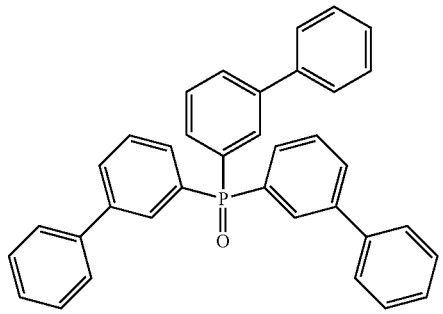
(18)
Suitable triazine derivatives which can be used as matrix material B are, in particular, 1,3,5-triazines which are substituted by at least one, preferably at least two, particularly preferably by three aromatic or heteroaromatic ring systems. Particular preference is thus given to compounds of the following formula (6) or (7),
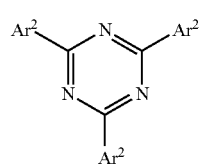
formula (6)

-continued

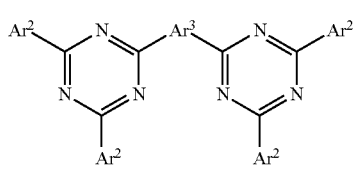
formula (7)

where R¹ has the meaning given above and the following applies to the other symbols used:

Ar² is, identically or differently on each occurrence, a monovalent aromatic or heteroaromatic ring system having 5 to 60 aromatic ring atoms, which may in each case be substituted by one or more radicals R¹;

Ar³ is a divalent aromatic or heteroaromatic ring system having 5 to 60 aromatic ring atoms, which may be substituted by one or more radicals R¹.

In compounds of the formulae (6) and (7), it is preferred for at least one group Ar² to be selected from the groups of the following formulae (8) to (16) and for the other groups Ar² to have the meaning indicated above.

formula (8)

formula (9)

formula (10)

formula (11)

formula (12)

-continued

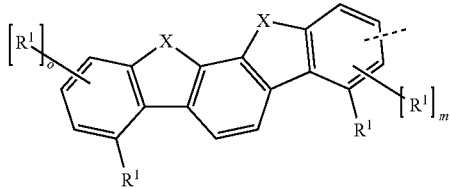
formula (13)

formula (14)

formula (15)

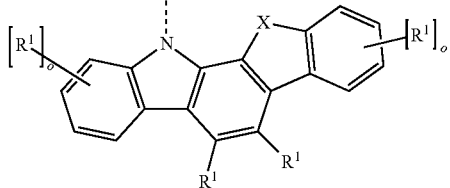
formula (16)

where R¹ has the same meaning as described above, the dashed bond represents the link to the triazine unit, and furthermore:

X is, identically or differently on each occurrence, a divalent bridge selected from B(R¹), C(R¹)₂, Si(R¹)₂, C=O, C=NR¹, C=C(R¹)₂, O, S, S=O, SO₂, N(R¹), P(R¹) and P(=O)R¹;

m is on each occurrence, identically or differently, 0, 1, 2 or 3;

o is on each occurrence, identically or differently, 0, 1, 2, 3 or 4.

Particularly preferred groups Ar² are selected from the groups of the following formulae (8a) to (16a),

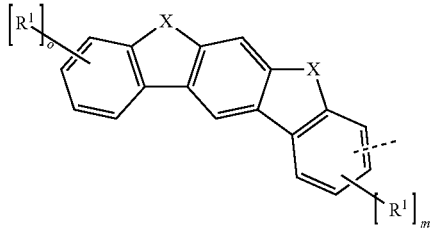
formula (8a)

formula (9a)
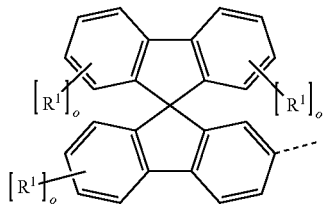

formula (10a)
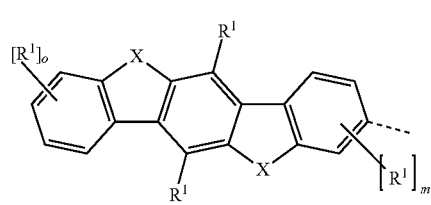

formula (11a)
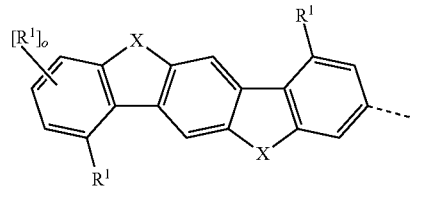

formula (12a)
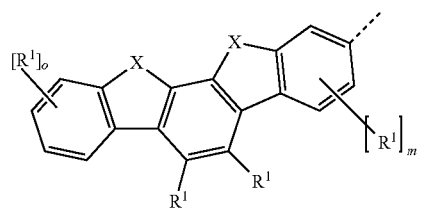

formula (13a)
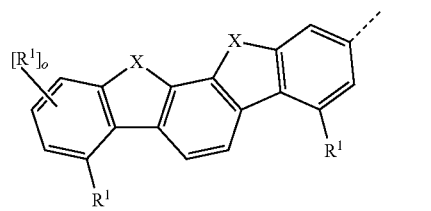

formula (14a)
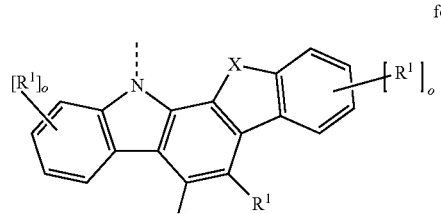

formula (15a)
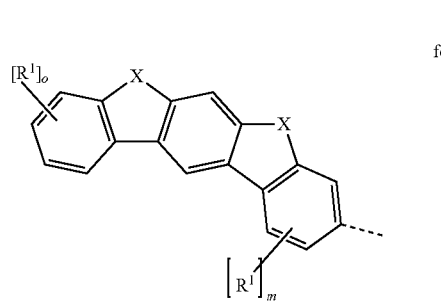

formula (16a)
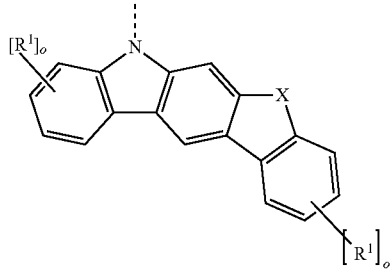

where the symbols and indices used have the same meaning as described above. X here is preferably selected, identically or differently, from $C(R^1)_2$, $N(R^1)$, O and S, particularly preferably $C(R^1)_2$.

Preferred groups $Ar^3$ in compounds of the formula (7) are selected from the groups of the following formulae (17) to (24), formula (17)
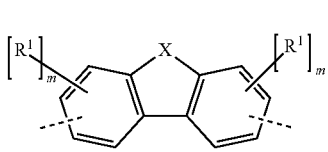

formula (18)
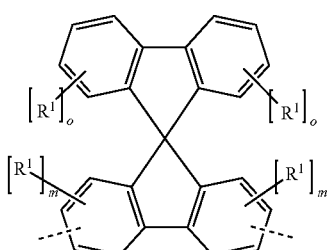

formula (19)
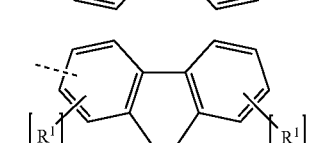

formula (20)
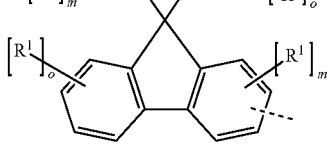

formula (21)
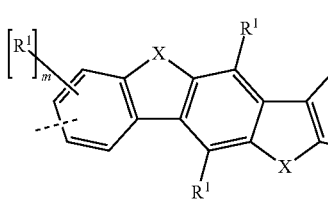

formula (22)

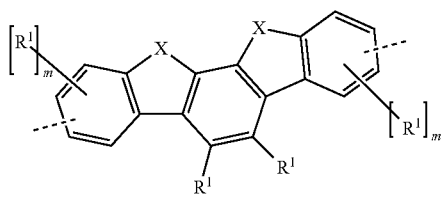

formula (23)

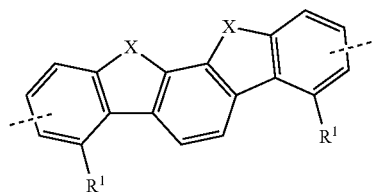

formula (24)

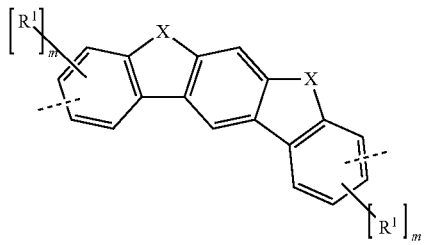

where the symbols and indices used have the same meaning as described above, and the dashed bond represents the link to the two triazine units.

Particularly preferred groups Ar³ are selected from the groups of the following formulae (17a) to (24a), formulal (17a)

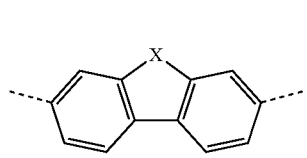

formula (18a)

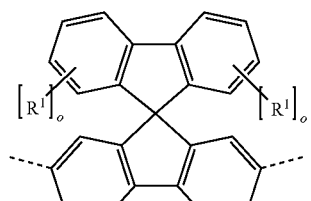

formula (19a)

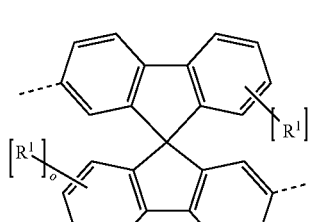

formula (20a)

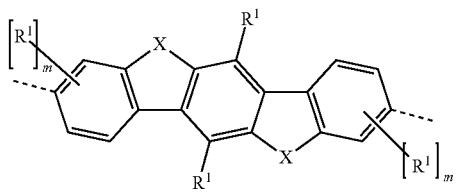

formula (21a)

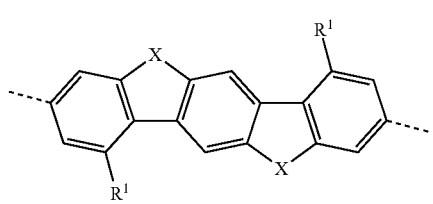

formula (22a)

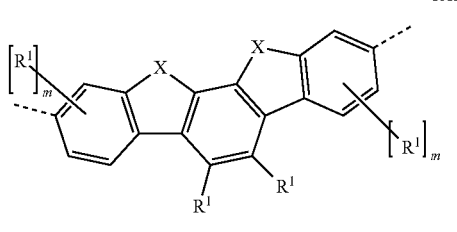

formula (23a)

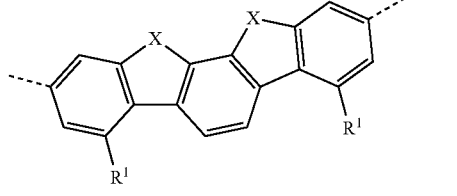

formula (24a)

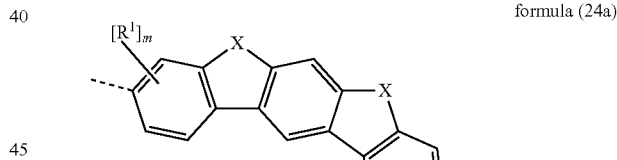

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the formula (7) given above in which the group Ar³ is selected from the formulae (17) to (24) given above, and Ar² is selected, identically or differently on each occurrence, from the formulae (8) to (16) given above or phenyl, 1- or 2-naphthyl, ortho-, meta- or para-biphenyl, each of which may be substituted by one or more radicals $R^1$, but are preferably unsubstituted.

If compound B is a pyrimidine derivative, this is preferably a pyrimidine derivative of the following formula (25), (26) or (27),

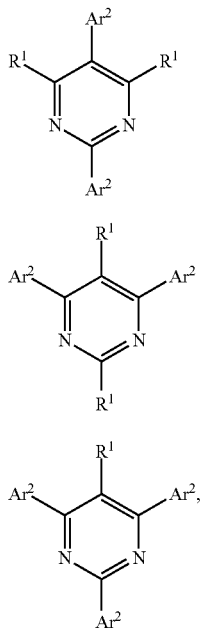

formula (25)

formula (26)

formula (27)

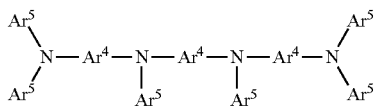

formula (30)

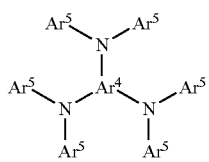

formula (31)

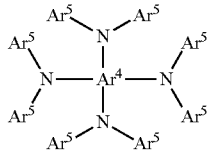

formula (32)

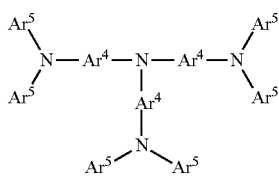

formula (33)

where the symbols used have the meanings given above.

In a preferred embodiment of the invention, at least one group $Ar^2$ is selected from the above-mentioned groups of the formulae (8) to (16) and (8a) to (16a).

If the above-mentioned relationships (2) are satisfied, compound B is a more hole-transporting compound.

Suitable hole-transporting compounds B are preferably selected from carbazole derivatives, for example CBP (N,N-biscarbazolylbiphenyl) or the carbazole derivatives disclosed in WO 2005/039246, US 2005/0069729, JP 2004/288381, EP 1205527 or WO 2008/086851, triarylamine derivatives, bridged carbazole derivatives, for example in accordance with the unpublished application DE 102010005697.9, indolocarbazole derivatives, for example in accordance with WO 2007/063754 or WO 2008/056746, indenocarbazole derivatives, for example in accordance with WO 2010/136109, azacarbazole derivatives, for example in accordance with EP 1617710, EP 1617711, EP 1731584, JP 2005/347160, dibenzofuran and dibenzothiophene derivatives, for example in accordance with WO 2009/148015, and diazasilole or tetraazasilole derivatives, in particular having aromatic substituents, for example in accordance with WO 2010/054729.

Preferred aromatic amines are the compounds of the following formulae (28) to (33),

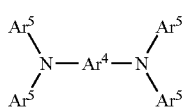

formula (28)

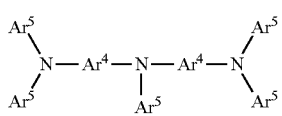

formula (29)

where $R^1$ has the meaning mentioned above and the following applies to the other symbols used:

$Ar^4$ is on each occurrence, identically or differently, a divalent, trivalent or tetravalent aromatic or heteroaromatic ring system having 5 to 60 aromatic ring atoms, which may be substituted by one or more radicals $R^1$;

$Ar^5$ is on each occurrence, identically or differently, a monovalent aromatic or heteroaromatic ring system having 5 to 60 aromatic ring atoms, which may be substituted by one or more radicals $R^1$, two groups $Ar^5$ here which are bonded to the same nitrogen atom or one group $Ar^4$ with one group $Ar^5$ which are bonded to the same nitrogen atom may be linked to one another by a single bond or a bridge selected from the group consisting of $B(R^1)$, $C(R^1)_2$, $Si(R^1)_2$, C=O, C=$NR^1$, C=$C(R^1)_2$, O, S, S=O, $SO_2$, $N(R^1)$, $P(R^1)$ and $P(=O)R^1$.

If two groups $Ar^5$ or one group $Ar^4$ with one group $Ar^5$ which are each bonded to the same nitrogen atom are linked to one another by a single bond, a carbazole is thus formed.

$Ar^4$ in the compounds of the formulae (28), (29), (30) and (33) is a divalent group and $Ar^4$ in the compounds of the formula (31) is a trivalent group and $Ar^4$ in the compounds of the formula (32) is a tetravalent group, where $Ar^4$, as described above, may also in each case additionally be substituted by one or more radicals $R^1$.

It is preferred here for $Ar^4$ and $Ar^5$ to contain no condensed aryl or heteroaryl groups having more than 10 aromatic ring atoms. $Ar^4$ and $Ar^5$ particularly preferably contain no condensed aryl or heteroaryl groups at all.

Examples of preferred groups $Ar^4$ are the groups of the formulae (34) to (41) indicated below:

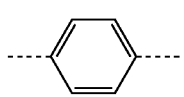

formula (34)

formula (35)

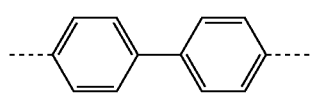

formula (36)

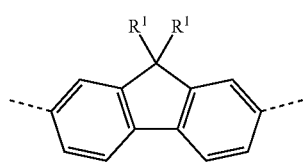

formula (37)

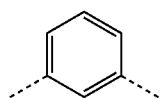

formula (38)

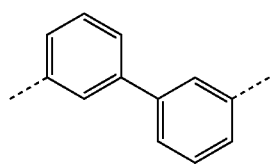

formula (39)

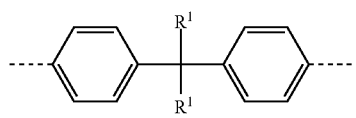

formula (40)

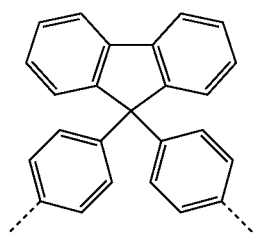

formula (41)

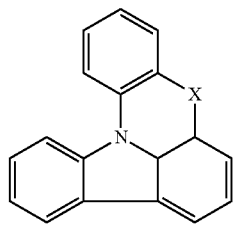

where these structures may also be substituted by one or more radicals $R^1$, and $R^1$ has the meaning mentioned above. It should explicitly again be pointed out at this point that two radicals $R^1$ which are bonded to the same C atom may also form a ring with one another. Thus, for example, if the two radicals $R^1$ in formula (39) stand for alkyl groups, they may form a cyclopentyl or cyclohexyl group with the C atom to which they are bonded. Likewise, a spiro system, for example a spirobifluorene, can be built up from formula (36).

Suitable hole-conducting matrix materials are, in addition, bridged carbazole derivatives, which preferably have a structure of the following formula (42), formula (42)

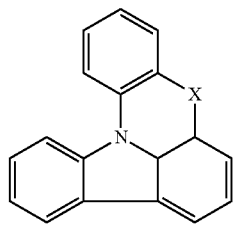

where X has the same meaning as described above and this structure may also be substituted by one or more substituents $R^1$. Preferably, at least one of the substituents $R^1$ here is a substituted or unsubstituted diaryl- or -heteroarylamino group, a substituted or unsubstituted triaryl- or -heteroarylamino group, a substituted or unsubstituted triazine group or a substituted or unsubstituted pyrimidine group. Furthermore, X preferably stands for $C(R^1)_2$.

Examples of suitable hole-conducting matrix materials B are structures (1) to (55) shown in the following table.

(1)

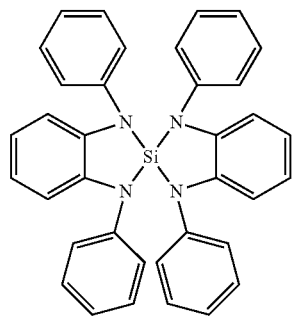 [SMILES: c1ccc(N2c3ccccc3N(c3ccccc3)[Si]23N(c2ccccc2)c2ccccc2N3c2ccccc2)cc1]

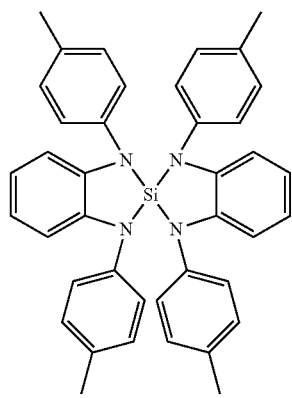 [SMILES: Cc1ccc(N2c3ccccc3N(c3ccc(C)cc3)[Si]23N(c2ccc(C)cc2)c2ccccc2N3c2ccc(C)cc2)cc1]
(2)
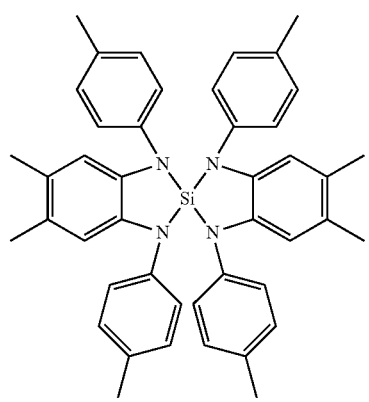
(3)
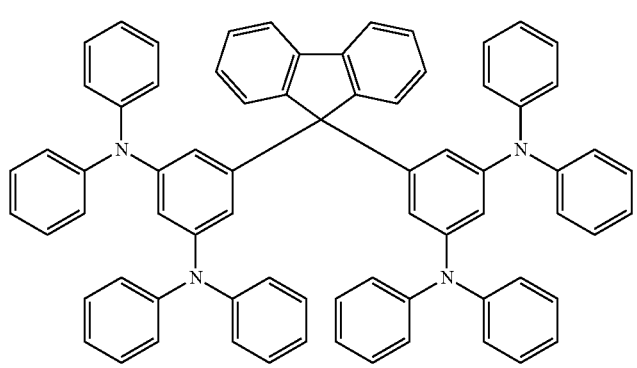 [SMILES: c1ccc(N(c2ccccc2)c2cc(N(c3ccccc3)c3ccccc3)cc(C3(c4cc(N(c5ccccc5)c5ccccc5)cc(N(c5ccccc5)c5ccccc5)c4)c4ccccc4-c4ccccc43)c2)cc1]
(4)
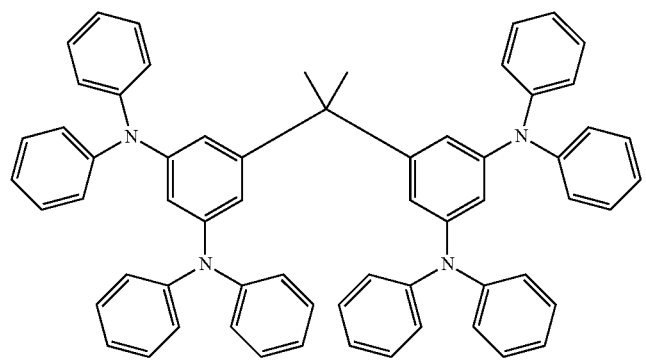 [SMILES: CC(C)(c1cc(N(c2ccccc2)c2ccccc2)cc(N(c2ccccc2)c2ccccc2)c1)c1cc(N(c2ccccc2)c2ccccc2)cc(N(c2ccccc2)c2ccccc2)c1]
(5)

-continued
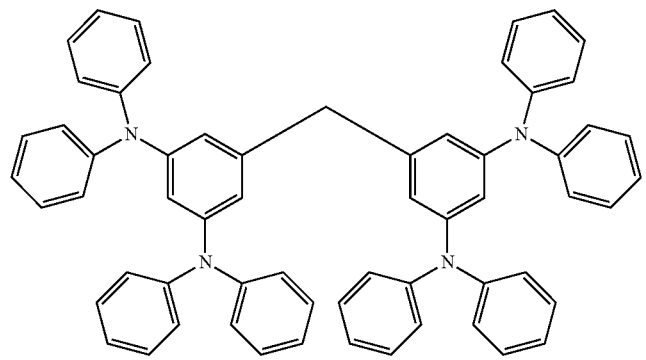 [SMILES: c1ccc(N(c2ccccc2)c2cc(Cc3cc(N(c4ccccc4)c4ccccc4)cc(N(c4ccccc4)c4ccccc4)c3)cc(N(c3ccccc3)c3ccccc3)c2)cc1]
(6)
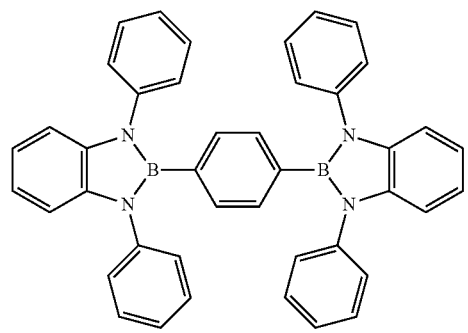 [SMILES: c1ccc(N2B(c3ccc(B4N(c5ccccc5)c5ccccc5N4c4ccccc4)cc3)N(c3ccccc3)c3ccccc32)cc1]
(7)
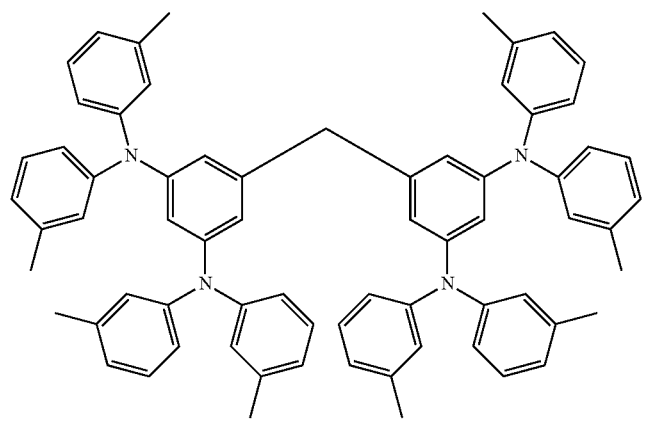 [SMILES: Cc1cccc(N(c2cccc(C)c2)c2cc(Cc3cc(N(c4cccc(C)c4)c4cccc(C)c4)cc(N(c4cccc(C)c4)c4cccc(C)c4)c3)cc(N(c3cccc(C)c3)c3cccc(C)c3)c2)c1]
(8)
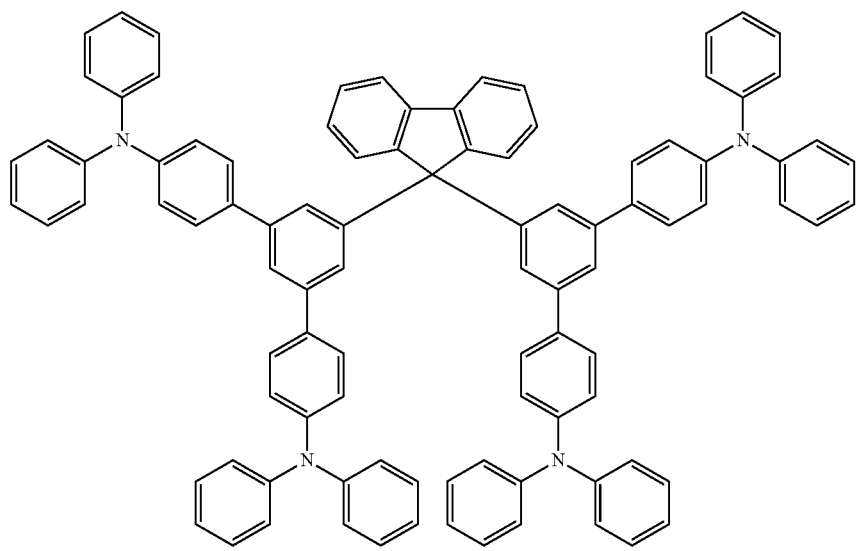 [SMILES: c1ccc(N(c2ccccc2)c2ccc(-c3cc(-c4ccc(N(c5ccccc5)c5ccccc5)cc4)cc(C4(c5cc(-c6ccc(N(c7ccccc7)c7ccccc7)cc6)cc(-c6ccc(N(c7ccccc7)c7ccccc7)cc6)c5)c5ccccc5-c5ccccc54)c3)cc2)cc1]
(9)

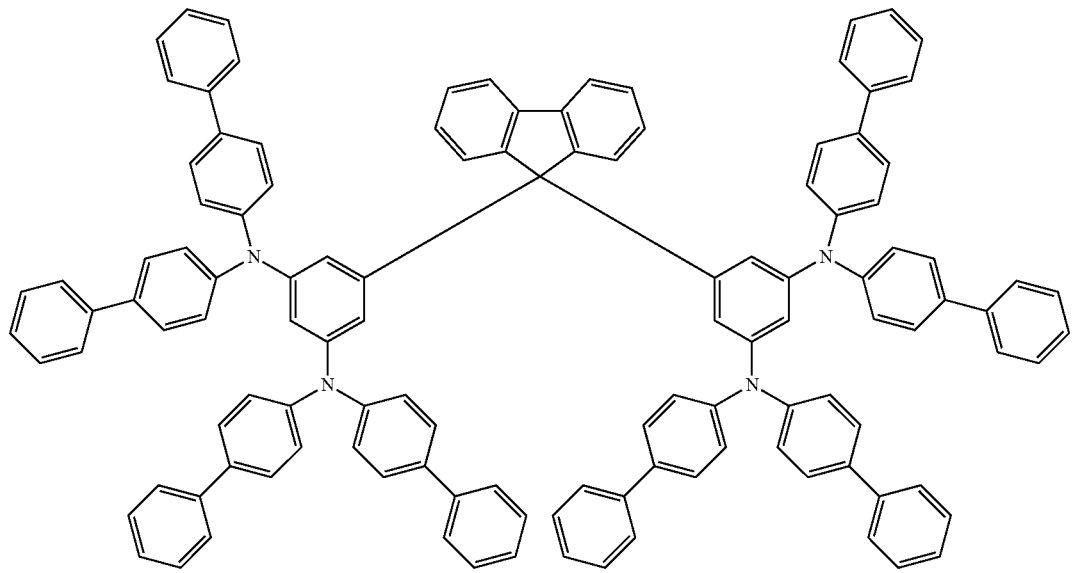 [SMILES: c1ccc(-c2ccc(N(c3ccc(-c4ccccc4)cc3)c3cc(N(c4ccc(-c5ccccc5)cc4)c4ccc(-c5ccccc5)cc4)cc(C4(c5cc(N(c6ccc(-c7ccccc7)cc6)c6ccc(-c7ccccc7)cc6)cc(N(c6ccc(-c7ccccc7)cc6)c6ccc(-c7ccccc7)cc6)c5)c5ccccc5-c5ccccc54)c3)cc2)cc1]
(10)
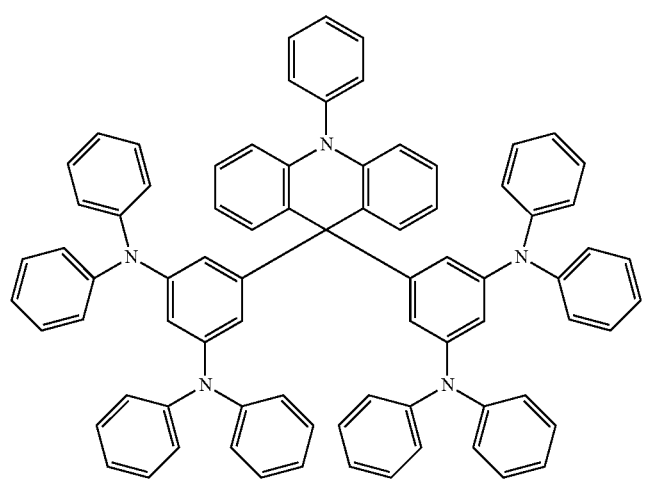 [SMILES: c1ccc(N(c2ccccc2)c2cc(N(c3ccccc3)c3ccccc3)cc(C3(c4cc(N(c5ccccc5)c5ccccc5)cc(N(c5ccccc5)c5ccccc5)c4)c4ccccc4N(c4ccccc4)c4ccccc43)c2)cc1]
(11)
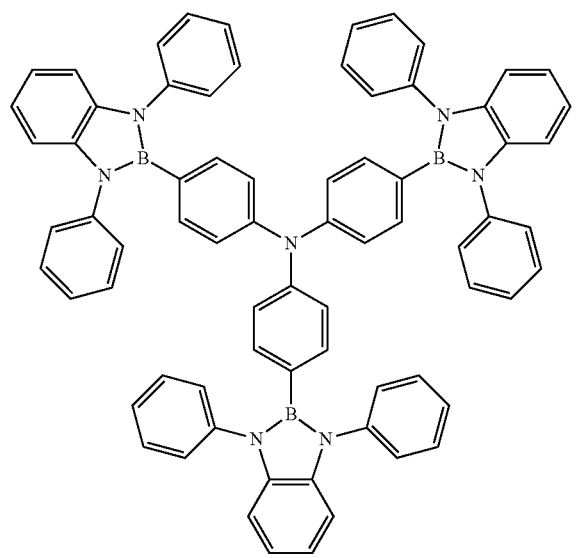 [SMILES: c1ccc(N2B(c3ccc(N(c4ccc(B5N(c6ccccc6)c6ccccc6N5c5ccccc5)cc4)c4ccc(B5N(c6ccccc6)c6ccccc6N5c5ccccc5)cc4)cc3)N(c3ccccc3)c3ccccc32)cc1]
(12)

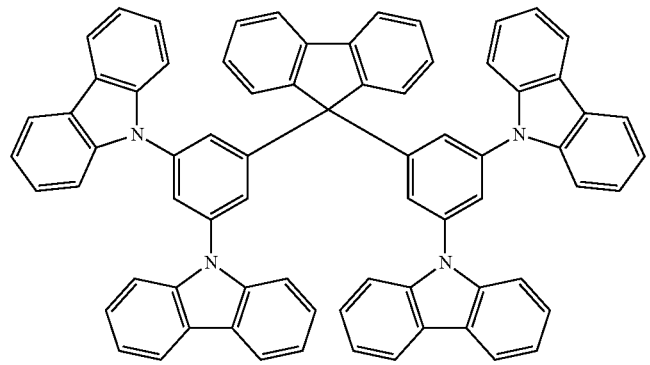 [SMILES: c1ccc2c(c1)-c1ccccc1C2(c1cc(-n2c3ccccc3c3ccccc32)cc(-n2c3ccccc3c3ccccc32)c1)c1cc(-n2c3ccccc3c3ccccc32)cc(-n2c3ccccc3c3ccccc32)c1]
(13)
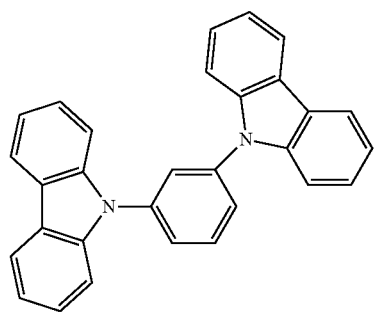 [SMILES: c1cc(-n2c3ccccc3c3ccccc32)cc(-n2c3ccccc3c3ccccc32)c1]
(14)
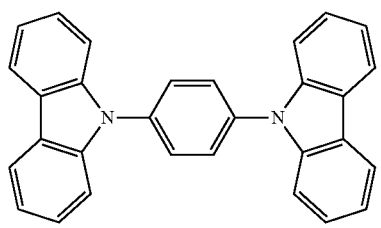 [SMILES: c1ccc2c(c1)c1ccccc1n2-c1ccc(-n2c3ccccc3c3ccccc32)cc1]
(15)
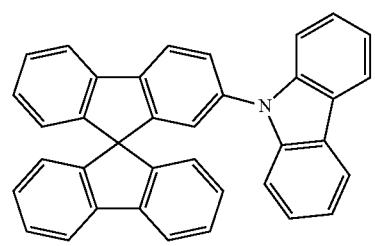 [SMILES: c1ccc2c(c1)-c1ccccc1C21c2ccccc2-c2ccc(-n3c4ccccc4c4ccccc43)cc21]
(16)
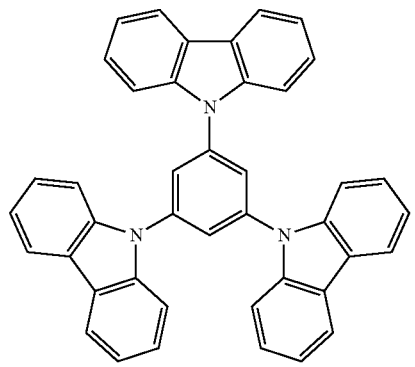 [SMILES: c1ccc2c(c1)c1ccccc1n2-c1cc(-n2c3ccccc3c3ccccc32)cc(-n2c3ccccc3c3ccccc32)c1]
(17)

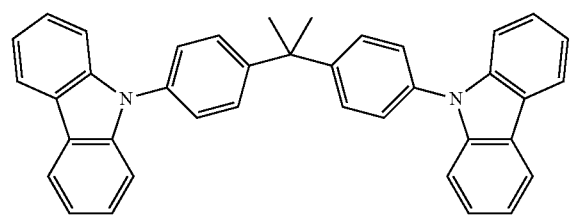 [SMILES: CC(C)(c1ccc(-n2c3ccccc3c3ccccc32)cc1)c1ccc(-n2c3ccccc3c3ccccc32)cc1]
(18)
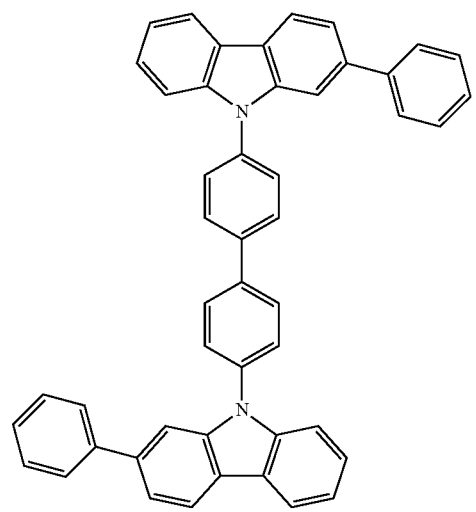 [SMILES: c1ccc(-c2ccc3c4ccccc4n(-c4ccc(-c5ccc(-n6c7ccccc7c7ccc(-c8ccccc8)cc76)cc5)cc4)c3c2)cc1]
(19)
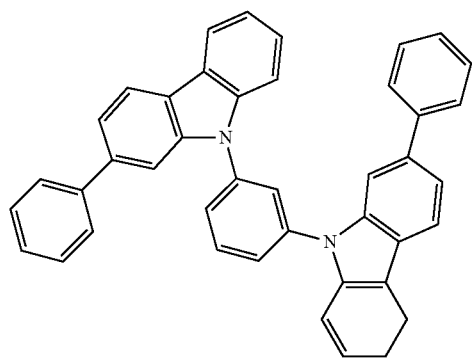 [SMILES: C1=Cc2c(c3ccc(-c4ccccc4)cc3n2-c2cccc(-n3c4ccccc4c4ccc(-c5ccccc5)cc43)c2)CC1]
(20)
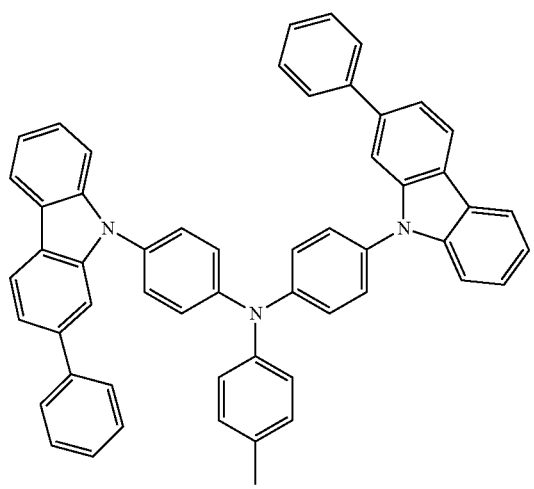 [SMILES: Cc1ccc(N(c2ccc(-n3c4ccccc4c4ccc(-c5ccccc5)cc43)cc2)c2ccc(-n3c4ccccc4c4ccc(-c5ccccc5)cc43)cc2)cc1]
(21)

-continued
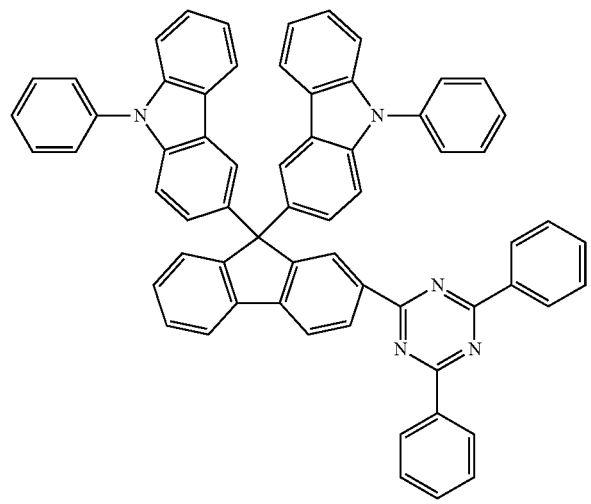 [SMILES: c1ccc(-c2nc(-c3ccccc3)nc(-c3ccc4c(c3)C(c3ccc5c(c3)c3ccccc3n5-c3ccccc3)(c3ccc5c(c3)c3ccccc3n5-c3ccccc3)c3ccccc3-4)n2)cc1]
(22)
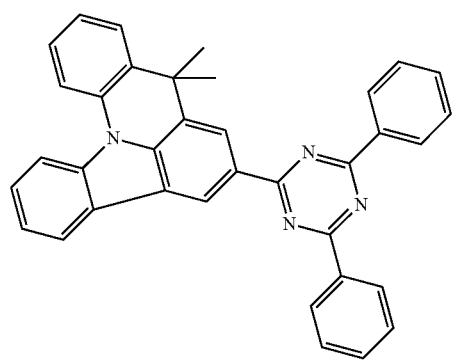 [SMILES: CC1(C)c2ccccc2-n2c3ccccc3c3cc(-c4nc(-c5ccccc5)nc(-c5ccccc5)n4)cc1c32]
(23)
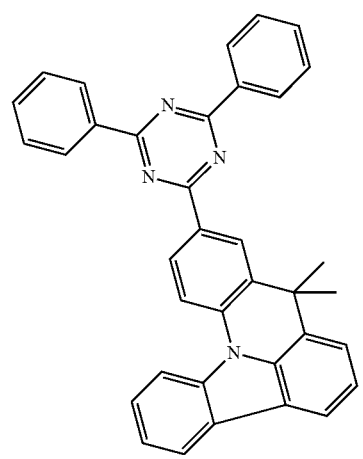 [SMILES: CC1(C)c2cc(-c3nc(-c4ccccc4)nc(-c4ccccc4)n3)ccc2-n2c3ccccc3c3cccc1c32]
(24)
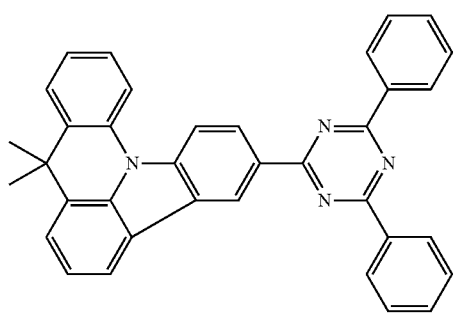 [SMILES: CC1(C)c2ccccc2-n2c3ccc(-c4nc(-c5ccccc5)nc(-c5ccccc5)n4)cc3c3cccc1c32]
(25)

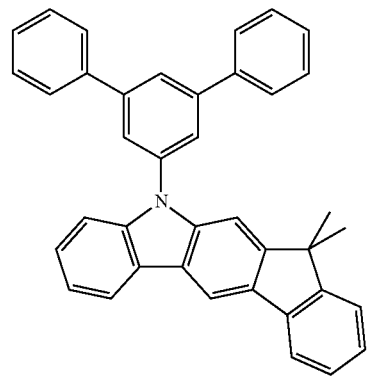 [SMILES: CC1(C)c2ccccc2-c2cc3c4ccccc4n(-c4cc(-c5ccccc5)cc(-c5ccccc5)c4)c3cc21]
(26)
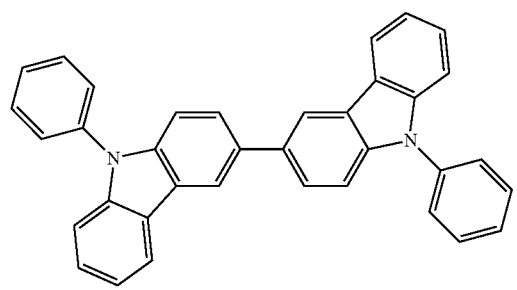 [SMILES: c1ccc(-n2c3ccccc3c3cc(-c4ccc5c(c4)c4ccccc4n5-c4ccccc4)ccc32)cc1]
(27)
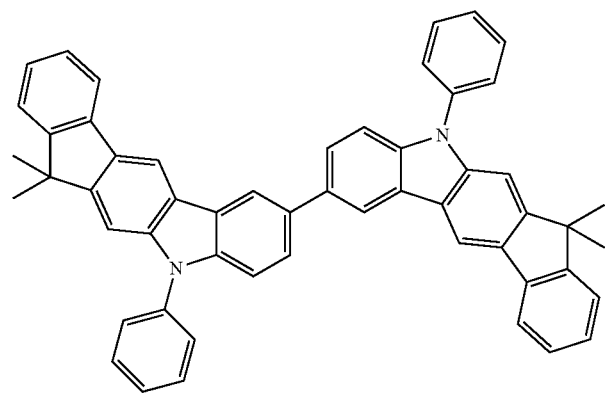
(28)
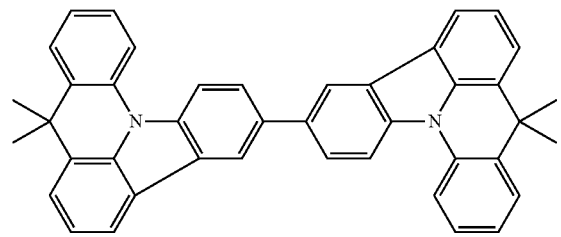
(29)
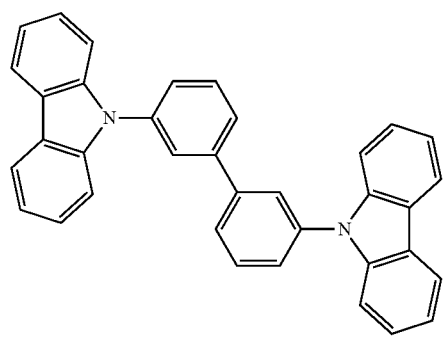 [SMILES: c1cc(-c2cccc(-n3c4ccccc4c4ccccc43)c2)cc(-n2c3ccccc3c3ccccc32)c1]
(30)

(31)
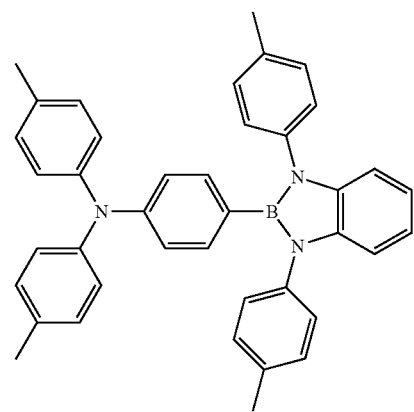 [SMILES: Cc1ccc(N2B(c3ccc(N(c4ccc(C)cc4)c4ccc(C)cc4)cc3)N(c3ccc(C)cc3)c3ccccc32)cc1]
(32)
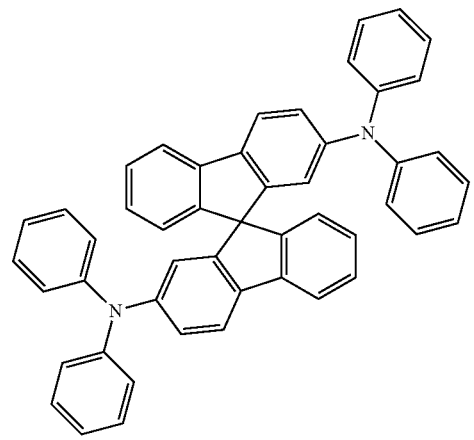 [SMILES: c1ccc(N(c2ccccc2)c2ccc3c(c2)C2(c4ccccc4-3)c3ccccc3-c3ccc(N(c4ccccc4)c4ccccc4)cc32)cc1]
(33)
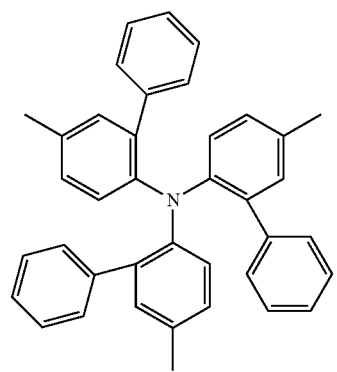 [SMILES: Cc1ccc(N(c2ccc(C)cc2-c2ccccc2)c2ccc(C)cc2-c2ccccc2)c(-c2ccccc2)c1]

(34)
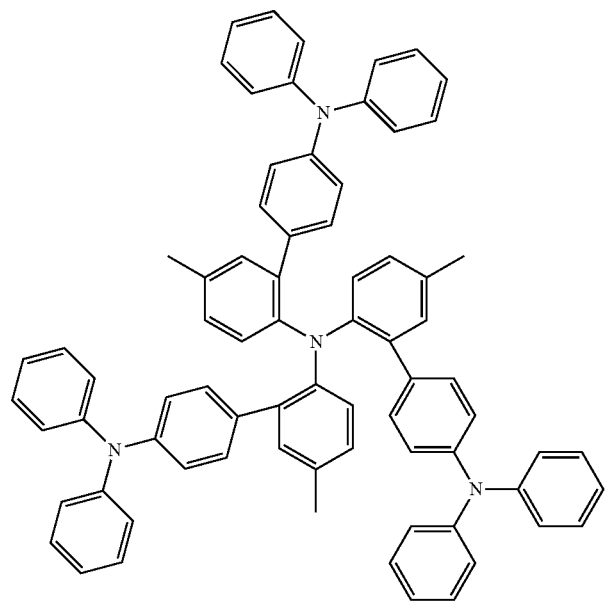 [SMILES: Cc1ccc(N(c2ccc(C)cc2-c2ccc(N(c3ccccc3)c3ccccc3)cc2)c2ccc(C)cc2-c2ccc(N(c3ccccc3)c3ccccc3)cc2)c(-c2ccc(N(c3ccccc3)c3ccccc3)cc2)c1]
(35)
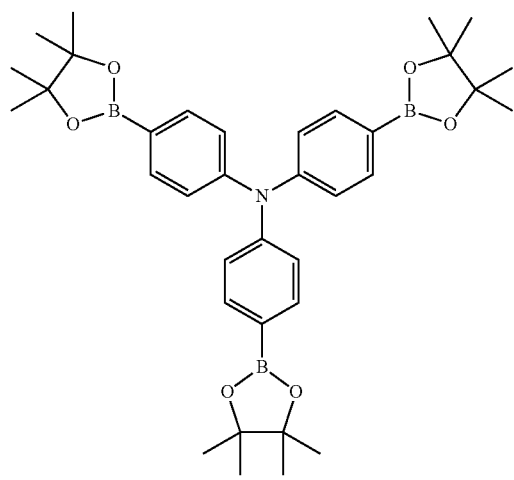
(36)
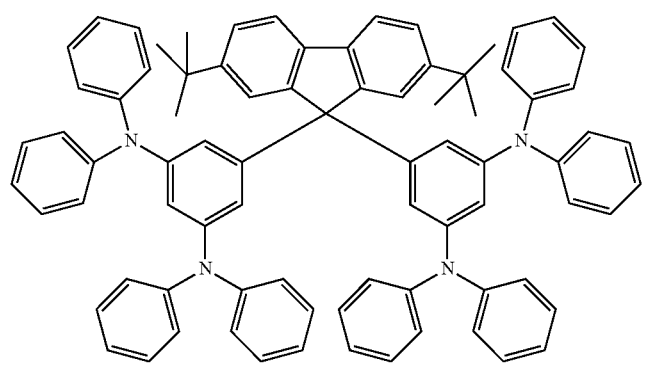 [SMILES: CC(C)(C)c1ccc2c(c1)C(c1cc(N(c3ccccc3)c3ccccc3)cc(N(c3ccccc3)c3ccccc3)c1)(c1cc(N(c3ccccc3)c3ccccc3)cc(N(c3ccccc3)c3ccccc3)c1)c1cc(C(C)(C)C)ccc1-2]

(37)
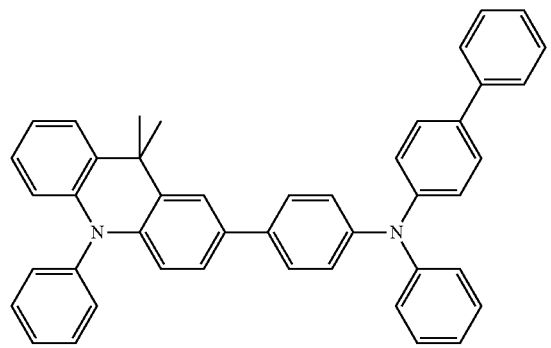 [SMILES: CC1(C)c2ccccc2N(c2ccccc2)c2ccc(-c3ccc(N(c4ccccc4)c4ccc(-c5ccccc5)cc4)cc3)cc21]
(38)
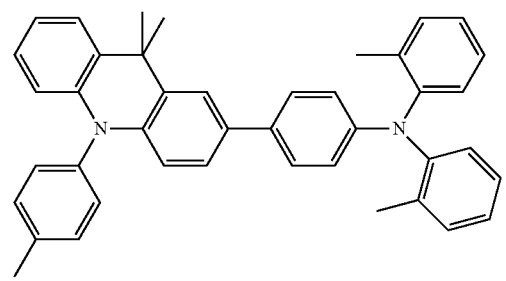 [SMILES: Cc1ccc(N2c3ccccc3C(C)(C)c3cc(-c4ccc(N(c5ccccc5C)c5ccccc5C)cc4)ccc32)cc1]
(39)
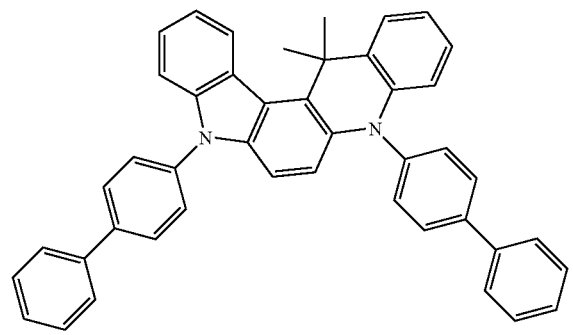 [SMILES: CC1(C)c2ccccc2N(c2ccc(-c3ccccc3)cc2)c2ccc3c(c21)c1ccccc1n3-c1ccc(-c2ccccc2)cc1]
(40)
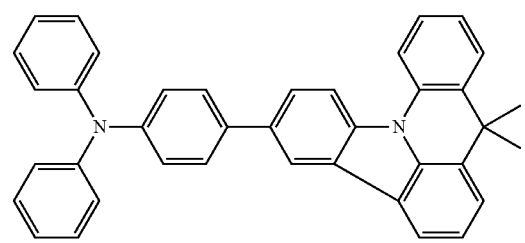 [SMILES: CC1(C)c2ccccc2-n2c3ccc(-c4ccc(N(c5ccccc5)c5ccccc5)cc4)cc3c3cccc1c32]

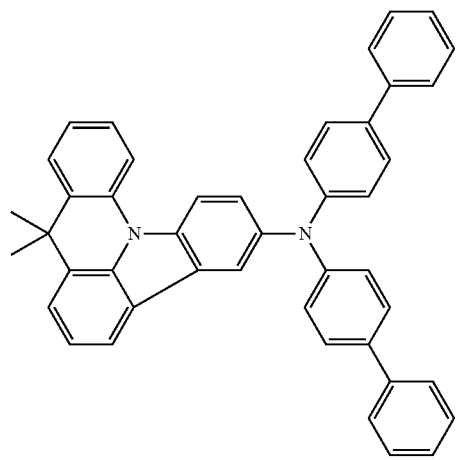 [SMILES: CC1(C)c2ccccc2-n2c3ccc(N(c4ccc(-c5ccccc5)cc4)c4ccc(-c5ccccc5)cc4)cc3c3cccc1c32]
(41)
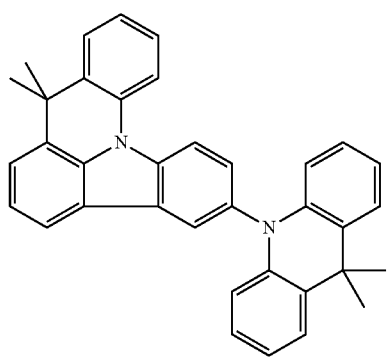 [SMILES: CC1(C)c2ccccc2N(c2ccc3c(c2)c2cccc4c2n3-c2ccccc2C4(C)C)c2ccccc21]
(42)
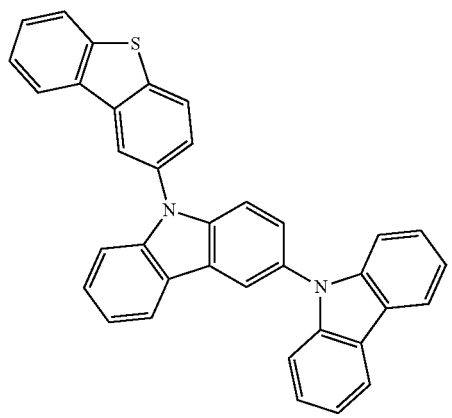 [SMILES: c1ccc2c(c1)sc1ccc(-n3c4ccccc4c4cc(-n5c6ccccc6c6ccccc65)ccc43)cc12]
(43)
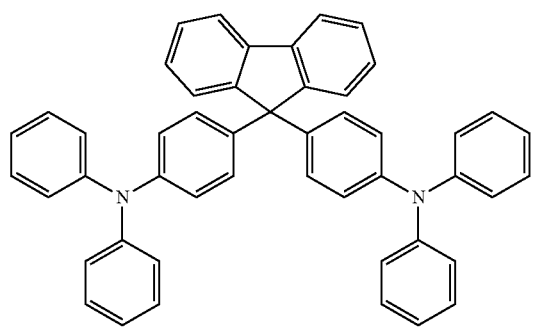 [SMILES: c1ccc(N(c2ccccc2)c2ccc(C3(c4ccc(N(c5ccccc5)c5ccccc5)cc4)c4ccccc4-c4ccccc43)cc2)cc1]
(44)

(45)
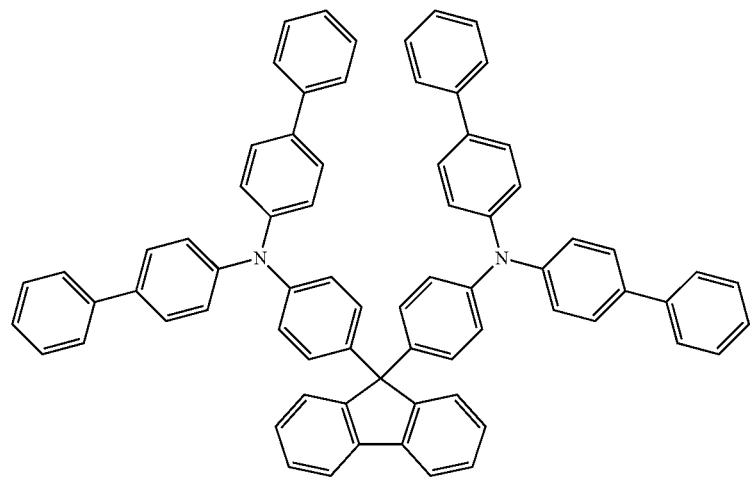 [SMILES: c1ccc(-c2ccc(N(c3ccc(-c4ccccc4)cc3)c3ccc(C4(c5ccc(N(c6ccc(-c7ccccc7)cc6)c6ccc(-c7ccccc7)cc6)cc5)c5ccccc5-c5ccccc54)cc3)cc2)cc1]
(46)
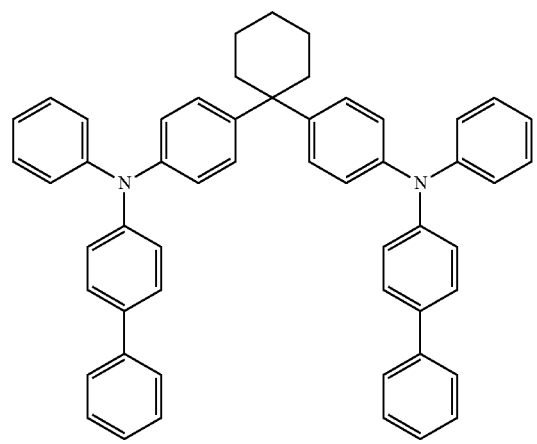 [SMILES: c1ccc(-c2ccc(N(c3ccccc3)c3ccc(C4(c5ccc(N(c6ccccc6)c6ccc(-c7ccccc7)cc6)cc5)CCCCC4)cc3)cc2)cc1]
(47)
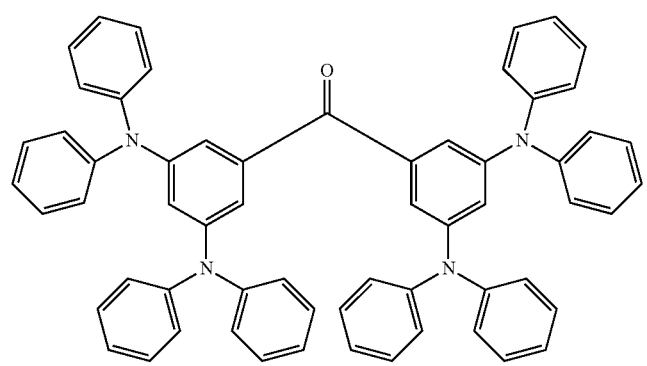 [SMILES: O=C(c1cc(N(c2ccccc2)c2ccccc2)cc(N(c2ccccc2)c2ccccc2)c1)c1cc(N(c2ccccc2)c2ccccc2)cc(N(c2ccccc2)c2ccccc2)c1]

-continued
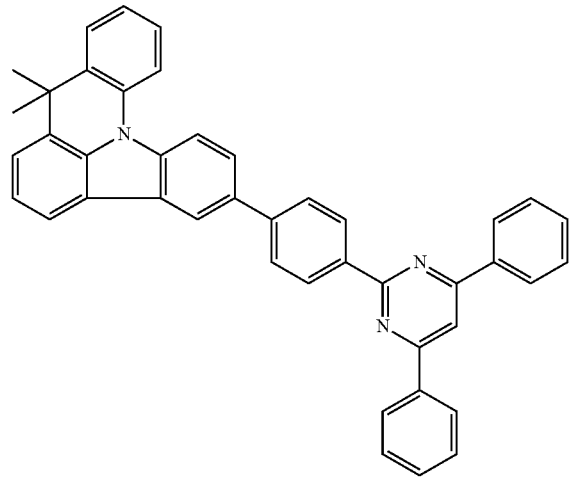 [SMILES: CC1(C)c2ccccc2-n2c3ccc(-c4ccc(-c5nc(-c6ccccc6)cc(-c6ccccc6)n5)cc4)cc3c3cccc1c32]
(48)
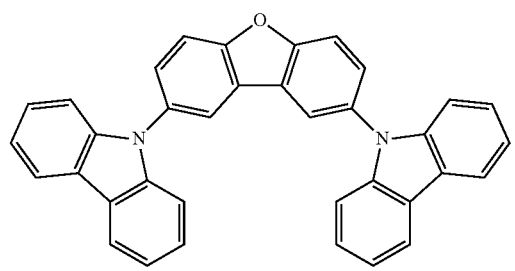 [SMILES: c1ccc2c(c1)c1ccccc1n2-c1ccc2oc3ccc(-n4c5ccccc5c5ccccc54)cc3c2c1]
(49)
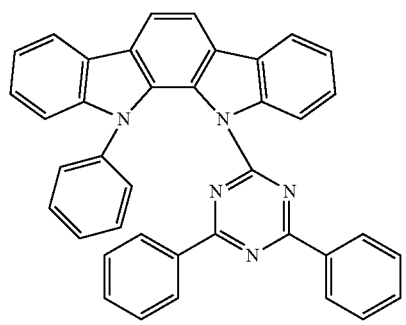 [SMILES: c1ccc(-c2nc(-c3ccccc3)nc(-n3c4ccccc4c4ccc5c6ccccc6n(-c6ccccc6)c5c43)n2)cc1]
(50)
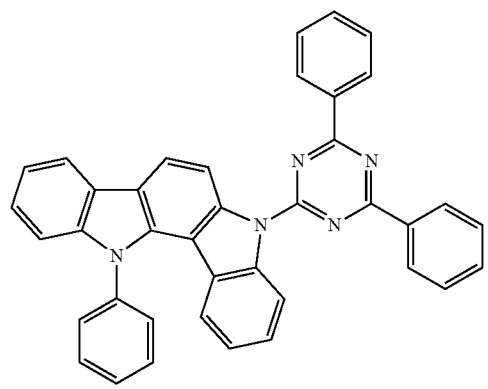 [SMILES: c1ccc(-c2nc(-c3ccccc3)nc(-n3c4ccccc4c4c3ccc3c5ccccc5n(-c5ccccc5)c34)n2)cc1]
(51)

(52)
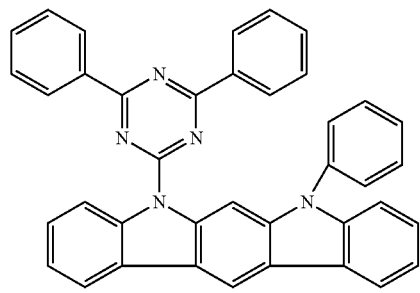 [SMILES: c1ccc(-c2nc(-c3ccccc3)nc(-n3c4ccccc4c4cc5c6ccccc6n(-c6ccccc6)c5cc43)n2)cc1]
(53)
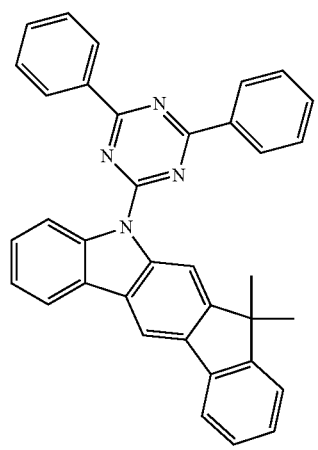 [SMILES: CC1(C)c2ccccc2-c2cc3c4ccccc4n(-c4nc(-c5ccccc5)nc(-c5ccccc5)n4)c3cc21]
(54)
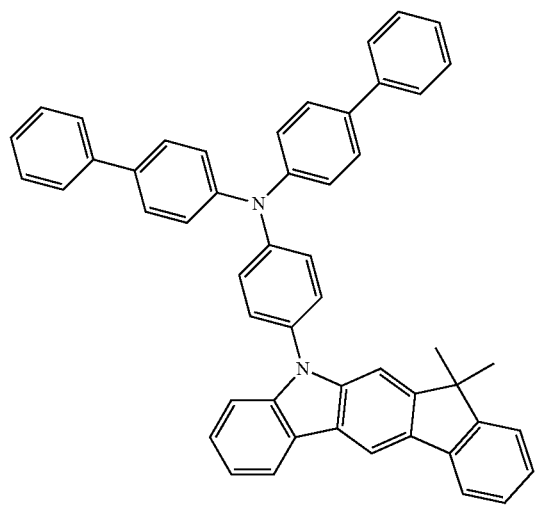 [SMILES: CC1(C)c2ccccc2-c2cc3c4ccccc4n(-c4ccc(N(c5ccc(-c6ccccc6)cc5)c5ccc(-c6ccccc6)cc5)cc4)c3cc21]

(55)

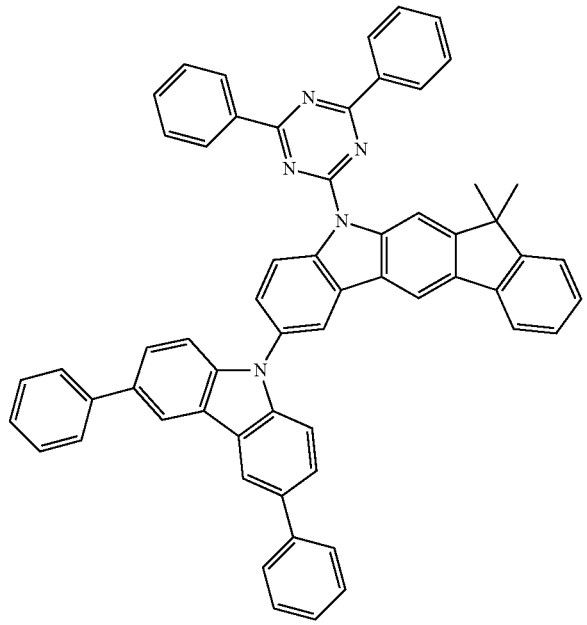 [SMILES: CC1(C)c2ccccc2-c2cc3c4cc(-n5c6ccc(-c7ccccc7)cc6c6cc(-c7ccccc7)ccc65)ccc4n(-c4nc(-c5ccccc5)nc(-c5ccccc5)n4)c3cc21]

If, apart from compound B, a further compound C is present in the emitting layer, this is preferably a compound as has already been mentioned above as preferred for compounds B, provided that the above-mentioned relationships for compound C are satisfied. Furthermore, compound C can preferably be a material which has a large band separation and is not or not essentially involved in charge transport or in the emission in the layer. These are preferably pure hydrocarbons, but also diazaborole derivatives. Examples of suitable compounds C are compounds (1) to (19) depicted below.

(1)

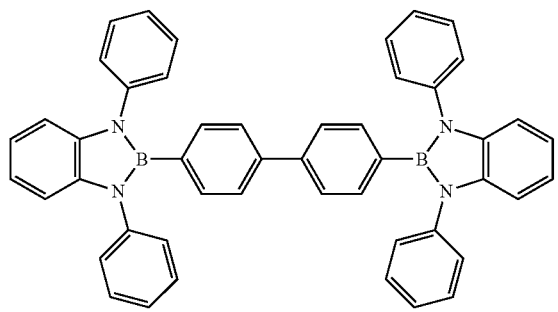

(2)

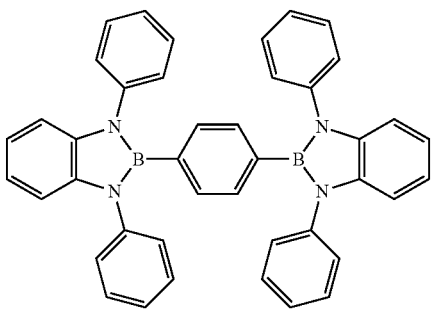

(3)

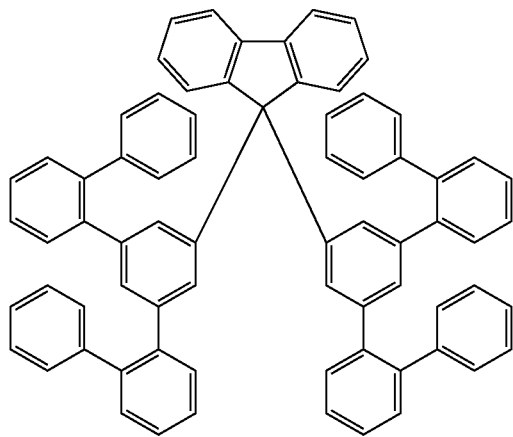

(4)

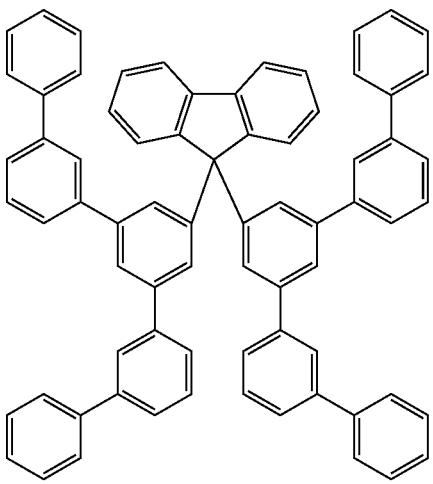

(5)
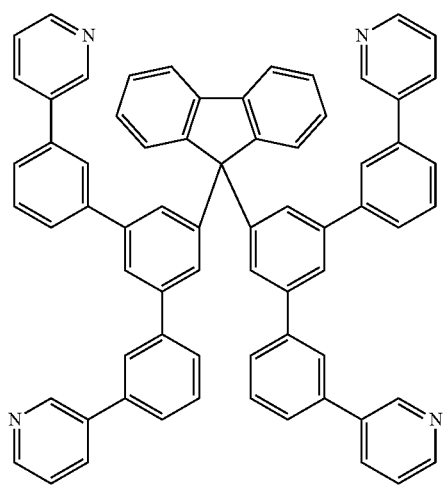
(6)
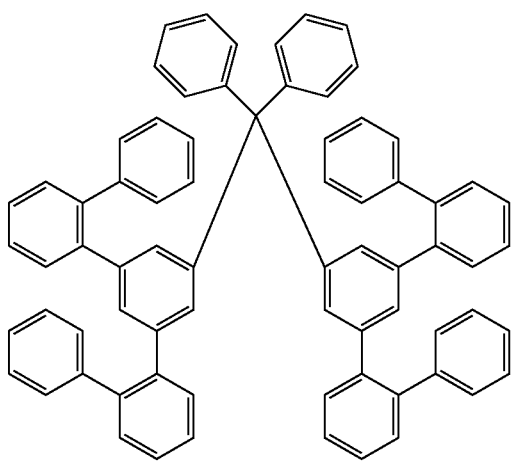
(7)
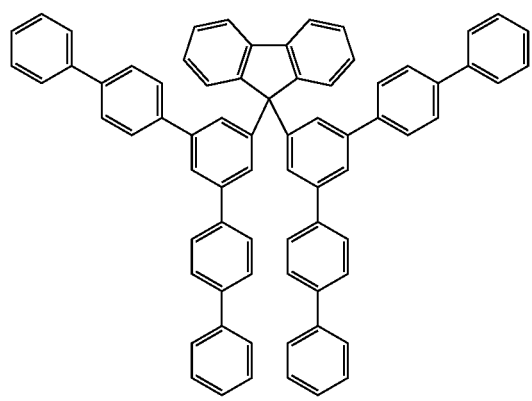
(8)
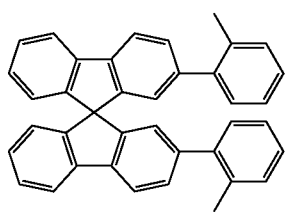
(9)
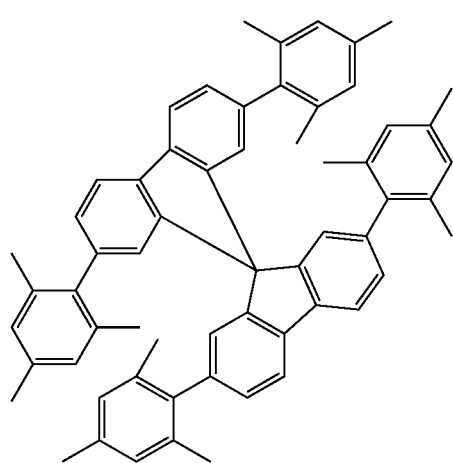
(10)
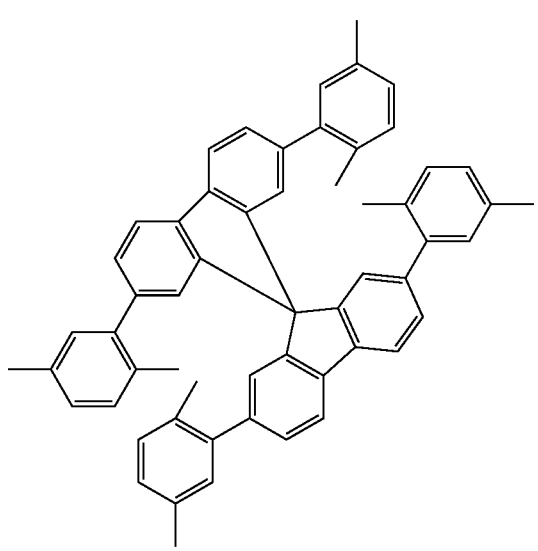

-continued
(11)
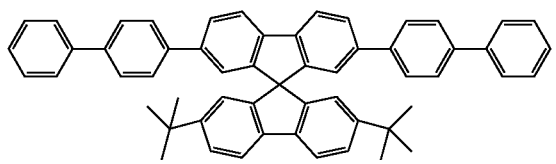
(12)
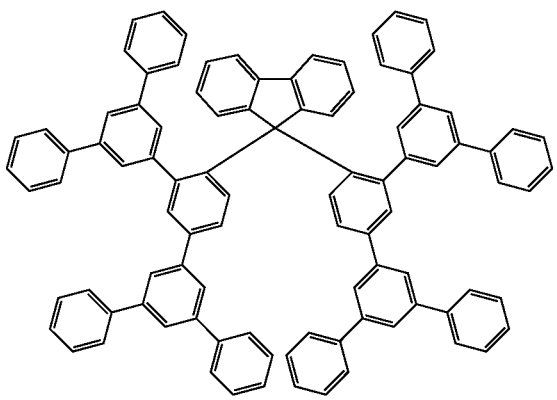
(13)
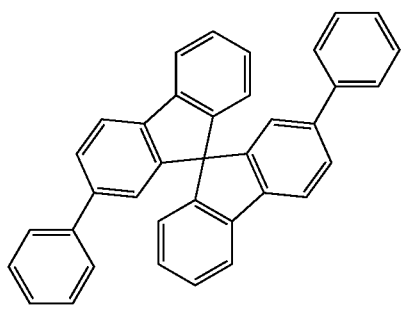
(14)
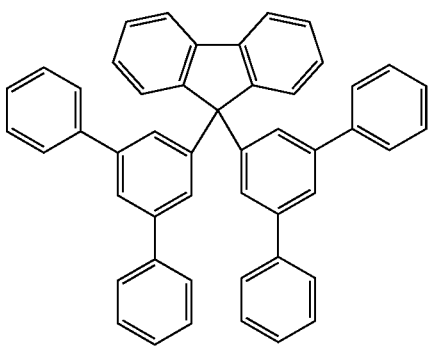
(15)
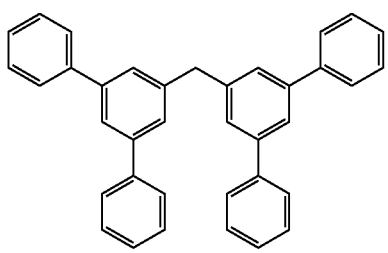
(16)
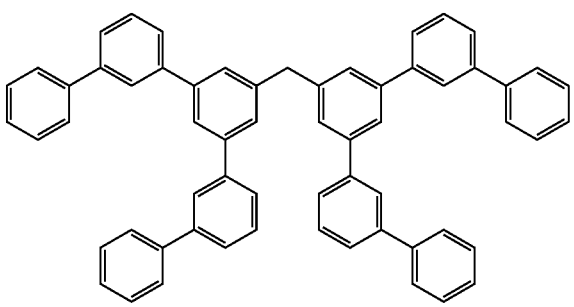
(17)
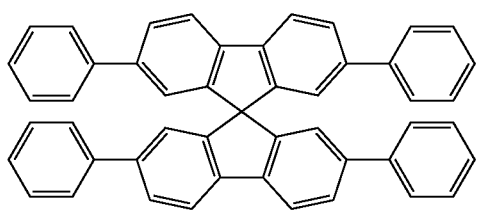
(18)
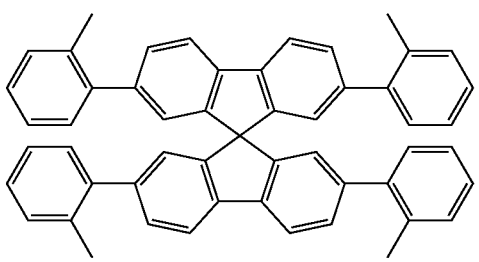

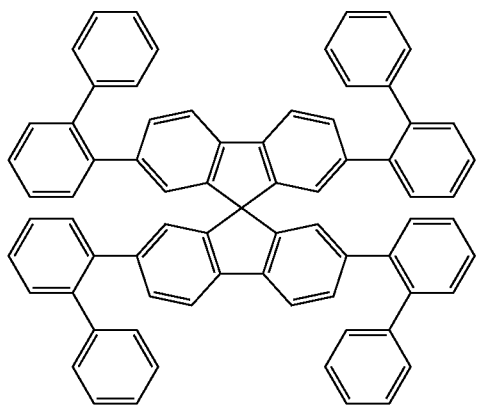

(19)

If the emitting layers are produced from solution, so-called polymeric "binders", such as polystyrene, polycarbonate, polyvinylbutyral, polymethyl methacrylate, are additionally preferred as material C.

In addition, conjugation-interrupted polymers can be employed as materials C, as described in WO 2010/136111 and WO 2010/136110.

Suitable as phosphorescent compound A are, in particular, compounds which emit light, preferably in the visible region, on suitable excitation and in addition contain at least one atom having an atomic number greater than 20. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (43) to (46):

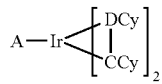  formula (43)

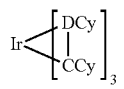  formula (44)

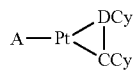  formula (45)

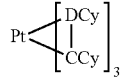  formula (46)

where $R^1$ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand or a picolinate.

Suitable and preferred groups DCy are, for example, pyridine, pyridazine, pyrimidine, pyrazine, triazine, quinoline, isoquinoline, imidazole, pyrazole or triazole, each of which may be substituted by one or more radicals $R^1$. These groups coordinate to the metal via a nitrogen atom.

Suitable and preferred groups CCy are, for example, phenyl, pyridine, thiophene, furan, pyrrole or naphthalene, each of which may be substituted by one or more radicals $R^1$. These groups coordinate to the metal via a carbon atom.

Through formation of ring systems between a plurality of radicals $R^1$, a bridge may also be present between the groups DCy and CCy. Furthermore, due to formation of ring systems between a plurality of radicals $R^1$, a bridge may also be present between two or three ligands CCy-DCy or between one or two ligands CCy-DCy and the ligand A, giving a polydentate e or polypodal ligand system.

Examples of the emitters described above are revealed by the applications WO 2001/41512, WO 2002/02714, WO 2002/15645, EP 1191613, EP 1191612, EP 1191614, WO 2004/081017, WO 2005/033244, WO 2005/042550, WO 2005/113563, WO 2006/008069, WO 2006/061182, WO 2006/081973, WO 2009/118087 and WO 2009/146770. In general, all phosphorescent complexes as used in accordance with the prior art for phosphorescent OLEDs and as are known to the person skilled in the art in the area of organic electroluminescence are suitable, and the person skilled in the art will be able to use further phosphorescent compounds without inventive step.

Particular preference is furthermore given to metal complexes of WO 2010/086089 and the unpublished applications EP 10006208.2 and DE 102010027317.1.

Particularly suitable are therefore metal complexes of the following formula (47), $$M(L)_p(L')_q$$  formula (47)

containing a moiety $M(L)_p$ of the formula (48) or formula (49):

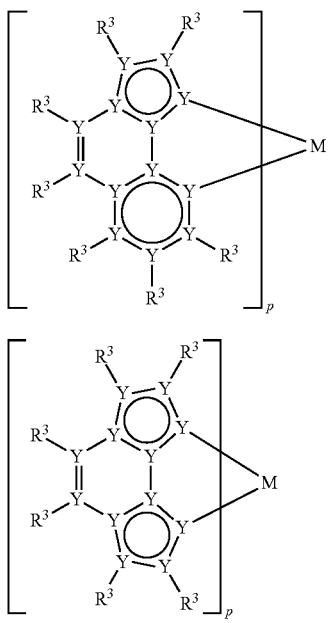

formula (48)

formula (49)

where the following applies to the symbols and indices used:

M is a metal, in particular Ir or Pt;

Y is selected on each occurrence, identically or differently, from the group consisting of C and N; all Y here together represent a 14 π electron system;

$R^3$ is on each occurrence, identically or differently, H, D, F, Cl, Br, I, $N(R^4)_2$, CN, $NO_2$, $Si(R^4)_3$, $B(OR^4)_2$, $C(=O)R^4$, $P(=O)(R^4)_2$, $S(=O)R^4$, $S(=O)_2R^4$, $OSO_2R^4$, a straight-chain alkyl, alkoxy, thioalkoxy or imine group having 1 to 40 C atoms or an alkenyl or alkynyl group having 2 to 40 C atoms or a branched or cyclic alkyl, alkoxy or thioalkoxy group having 3 to 40 C atoms, where the above-mentioned alkyl, alkoxy, thioalkoxy, imine, alkenyl or alkynyl groups may each be substituted by one or more radicals $R^4$, where one or more non-adjacent $CH_2$ groups may be replaced by $R^4C=CR^4$, C=C, $Si(R^4)_2$, C=O, C=S, C=$NR^4$, $P(=O)(R^4)$, SO, $SO_2$, $NR^4$, O, S or $CONR^4$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which may be substituted by one or more radicals $R^4$, or an aralkyl or heteroaralkyl group having 5 to 60 aromatic ring atoms, which may be substituted by one or more radicals $R^4$, or a diarylamino group, diheteroarylamino group or arylheteroarylamino group having 10 to 40 aromatic ring atoms, which may be substituted by one or more radicals $R^4$; two or more adjacent radicals $R^3$ here may also form a mono- or polycyclic, aliphatic, aromatic and/or benzo-fused ring system with one another;

with the proviso that $R^3$ represents a free electron pair if the group Y to which this radical $R^3$ is bonded is a nitrogen atom having a saturated valence;

$R^4$ is on each occurrence, identically or differently, H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C=CR^2$, C=C, $Si(R^2)_2$, C=O, C=S, C=$NR^2$, $P(=O)(R^2)$, SO, $SO_2$, $NR^2$, O, S or $CONR^2$ and where one or more H atoms may be replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or an aralkyl or heteroaralkyl group having 5 to 60 aromatic ring atoms, which may be substituted by one or more radicals $R^2$, or a diarylamino group, diheteroarylamino group or arylheteroarylamino group having 10 to 40 aromatic ring atoms, which may be substituted by one or more radicals $R^2$; two or more adjacent radicals $R^4$ here may form a mono- or polycyclic, aliphatic or aromatic ring system with one another; $R^2$ here has the meaning given above;

L' is, identically or differently on each occurrence, a co-ligand;

p is 1, 2 or 3;

q is 0, 1, 2, 3 or 4;

a plurality of ligands L here may also be linked to one another or L may be linked to L' via any desired bridge V and thus form a tridentate, tetradentate, pentadentate or hexadentate ligand system.

All atoms Y together form a 14 π-electron system. Each carbon atom here contributes 1 π-electron to the overall electron system, where a carbene carbon atom contributes no π-electron to the electron system as a whole. Each nitrogen atom which is only bonded in a 6-membered ring likewise contributes 1 π-electron to the overall electron system. Each nitrogen atom which is bonded simultaneously in a 5-membered ring and a 6-membered ring contributes 2 π-electrons to the overall electron system. Each nitrogen atom which is only bonded in a 5-membered ring contributes 1 or 2 π-electrons to the overall electron system. It depends on the bonding of the nitrogen in the 5-membered ring whether this nitrogen atom contributes 1 or 2 π-electrons to the overall electron system. The circle in a ring in formulae (2) and (3) represents a 6 π-electron system, as is usually used for the representation of aromatic or heteroaromatic structures in organic chemistry. The following structures again explain when the nitrogen contributes 1 or 2 π-electrons (shown only as electrons in the scheme) to the overall π-electron system:

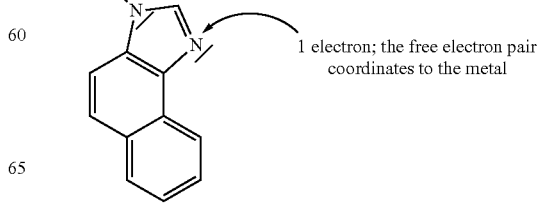

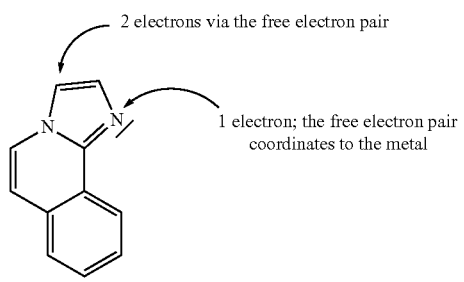

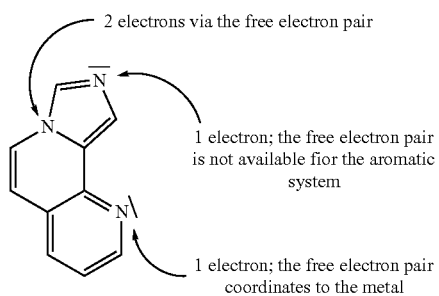

A nitrogen atom with a saturated valence in the sense of this invention is taken to mean a nitrogen atom which formally forms either one single bond and one double bond or three single bonds within the aromatic skeleton. In these cases, the radical $R^3$ which is bonded to this nitrogen atom represents a free electron pair. For the purposes of this invention, a nitrogen atom with an unsaturated valence is taken to mean, by contrast, a nitrogen atom which formally only forms two single bonds within the aromatic skeleton. In these cases, the radical from $R^3$ which is bonded to this nitrogen atom represents a radical as defined above and not a free electron pair. The following structures again explain what is taken to mean by a nitrogen atom with a saturated valence:

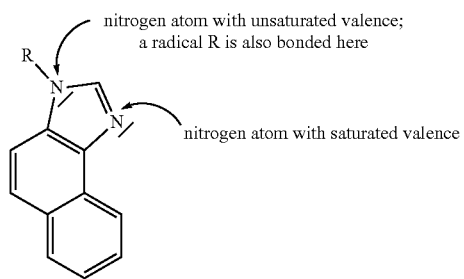

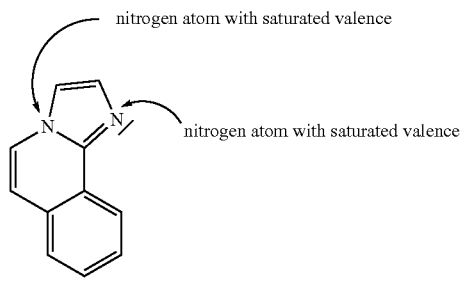

A particularly preferred embodiment of the moieties of the formulae (48) and (49) are the structures of the following formulae (50) to (118),

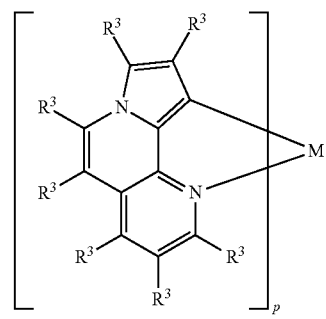

formula (50)

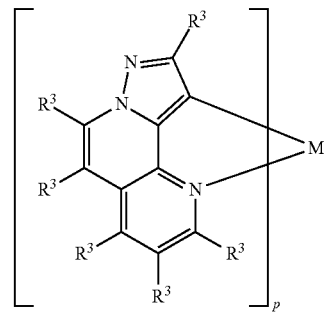

formula (51)

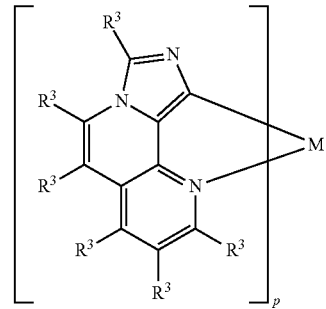

formula (52)

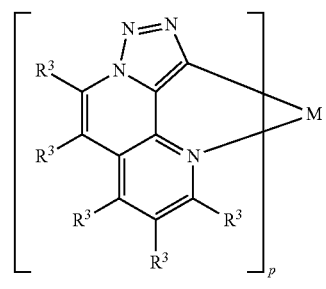

formula (53)

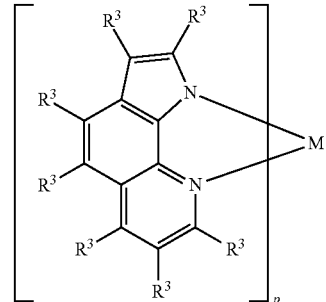

formula (54)

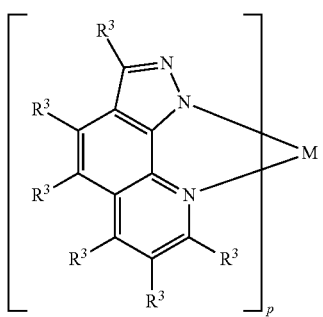
formula (55)
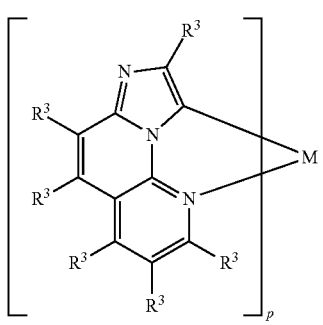
formula (56)
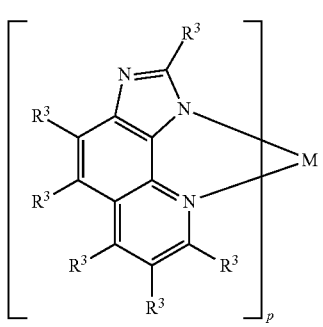
formula (57)
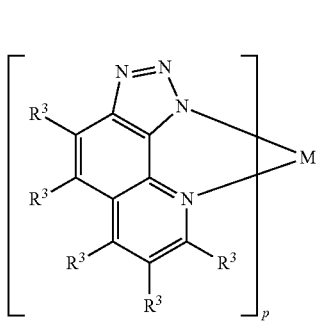
formula (58)
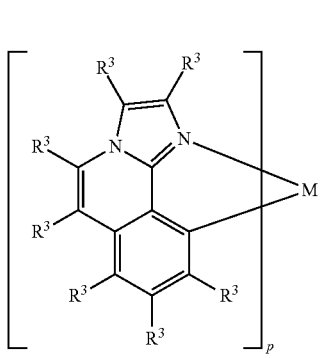
formula (59)
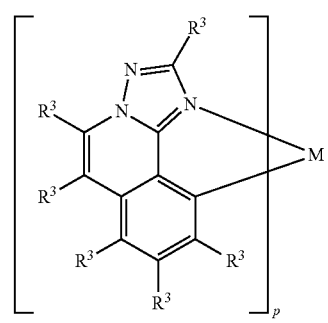
formula (60)
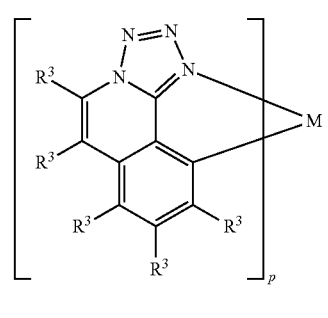
formula (61)
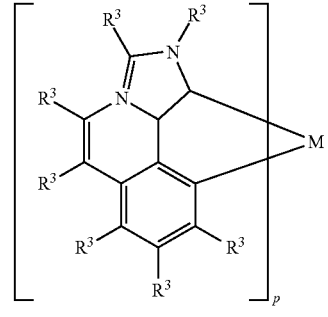
formula (62)
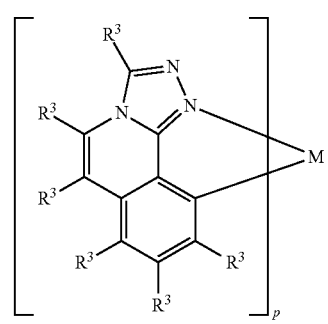
formula (63)
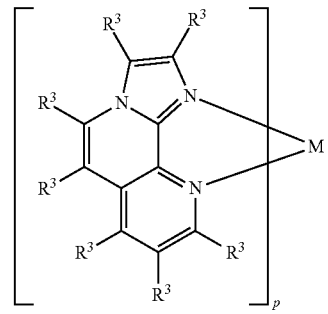
formula (64)

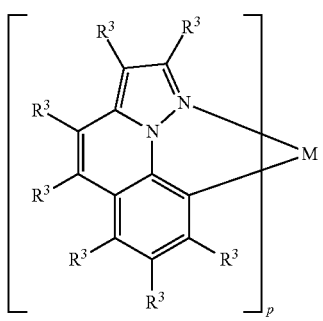
formula (65)
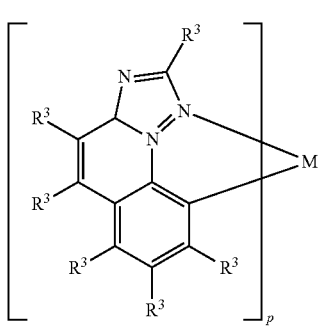
formula (66)
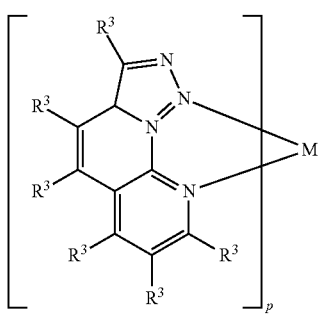
formula (67)
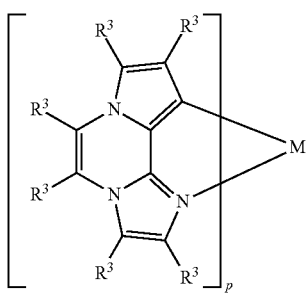
formula (68)
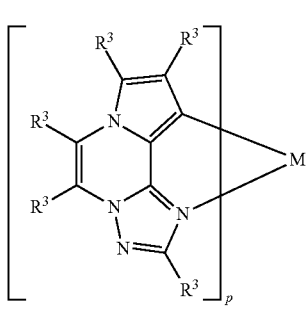
formula (69)
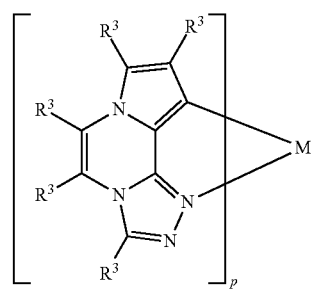
formula (70)
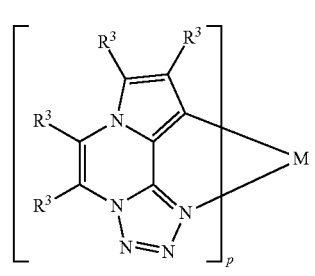
formula (71)
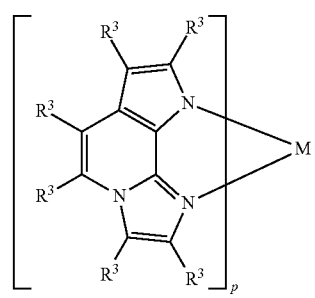
formula (72)
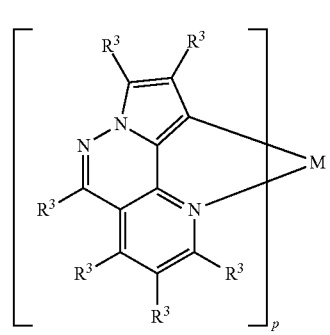
formula (73)
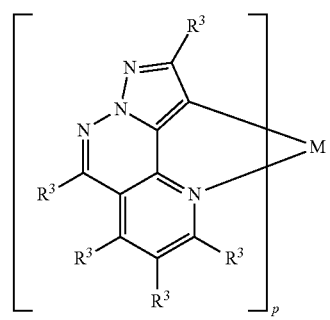
formula (74)

formula (75)
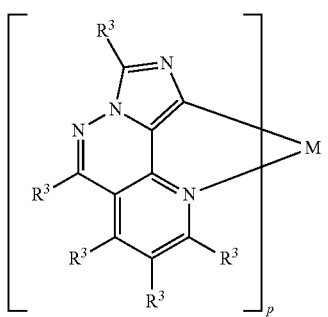
formula (76)
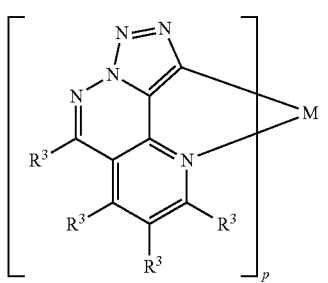
formula (77)
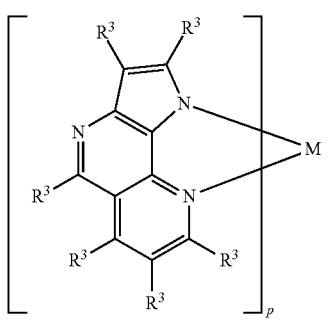
formula (78)
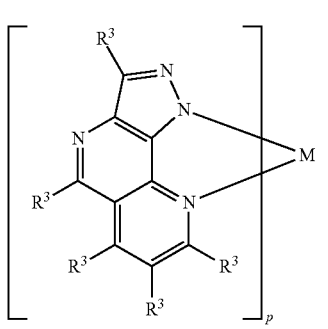
formula (79)
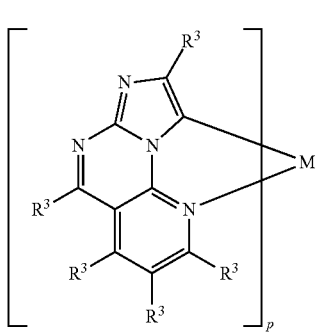
formula (80)
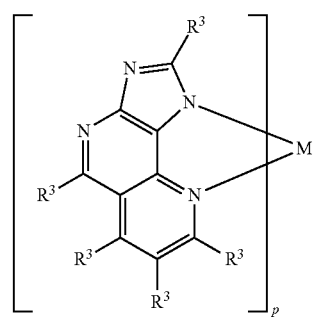
formula (81)
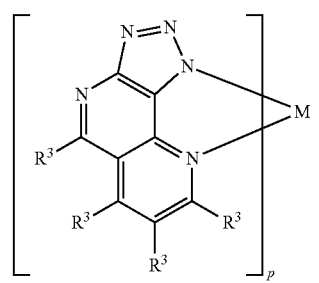
formula (82)
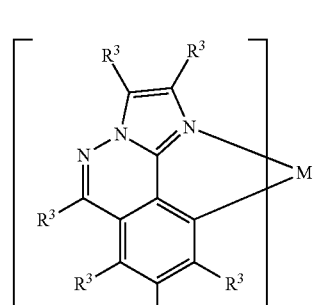
formula (83)
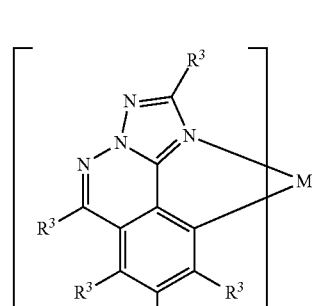
formula (84)
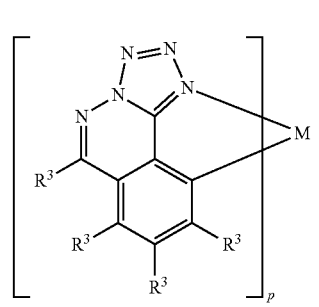

formula (85) — formula (94): chemical structure diagrams.

formula (95)
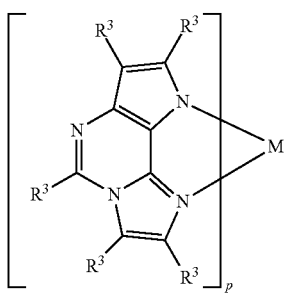
formula (96)
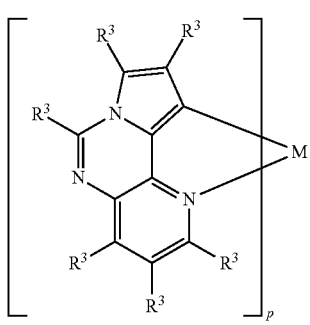
formula (97)
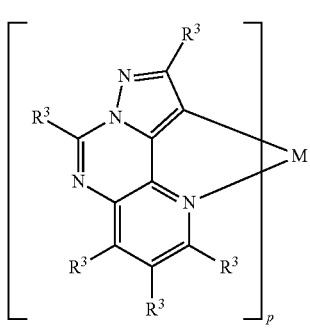
formula (98)
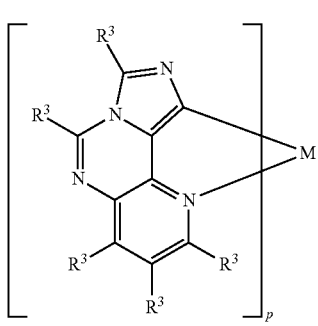
formula (99)
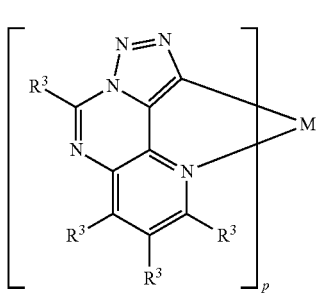
formula (100)
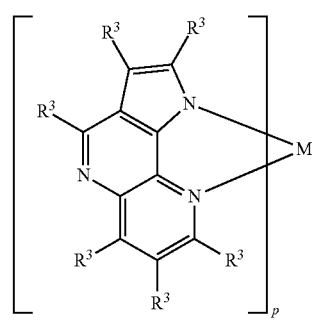
formula (101)
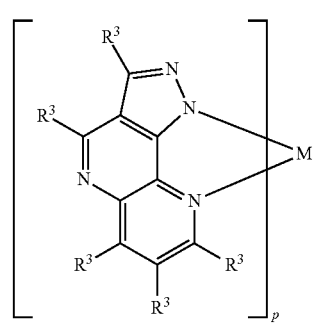
formula (102)
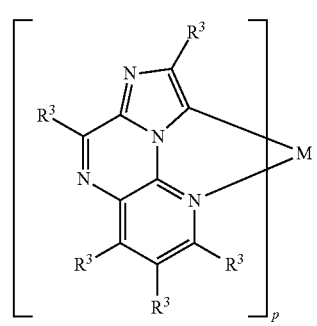
formula (103)
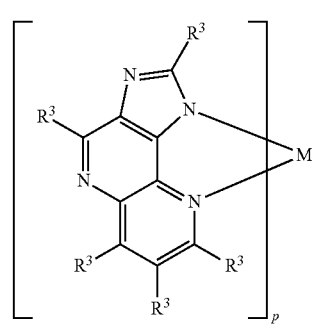
formula (104)
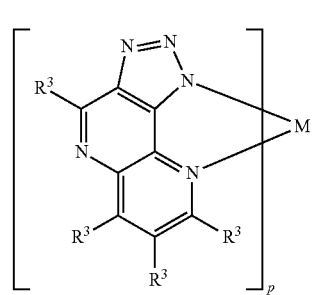

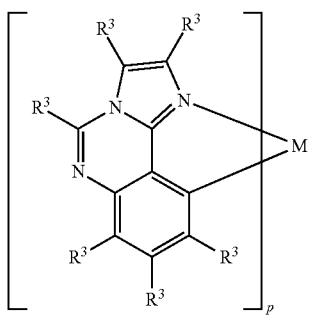
formula (105)
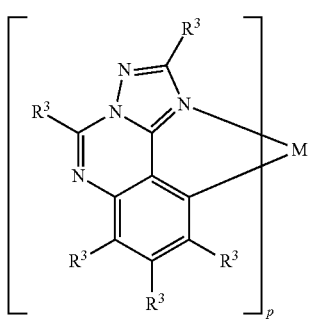
formula (106)
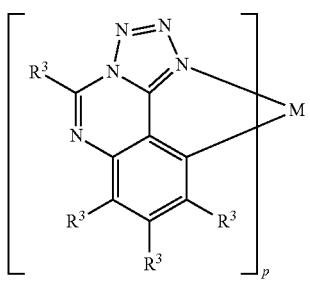
formula (107)
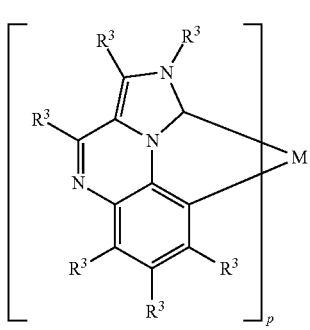
formula (108)
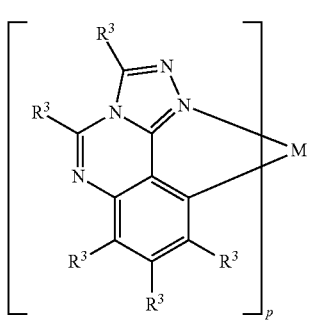
formula (109)
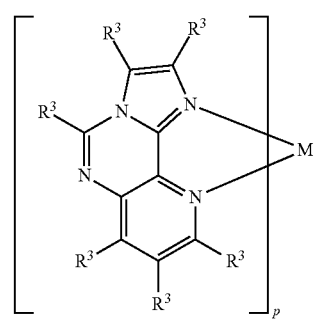
formula (110)
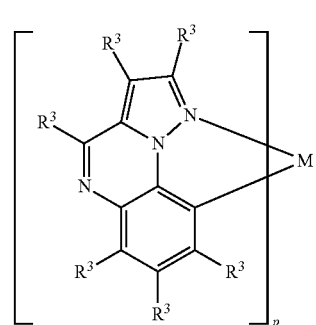
formula (111)
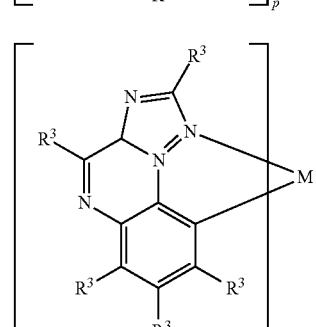
formula (112)
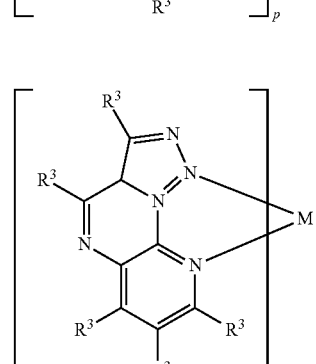
formula (113)
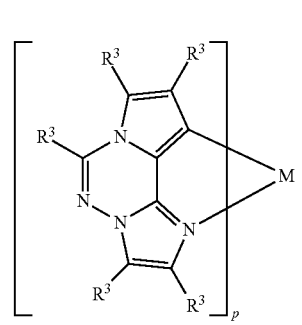
formula (114)

formula (115)
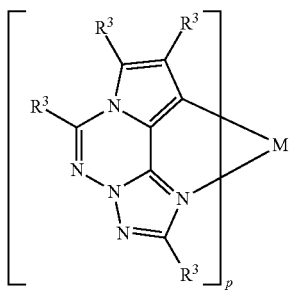
formula (119)
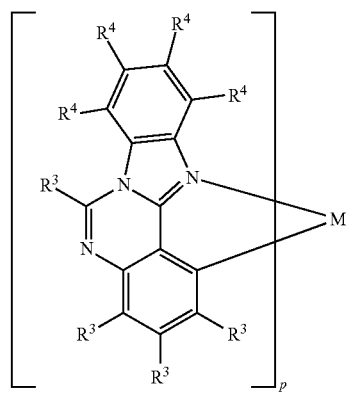
formula (116)
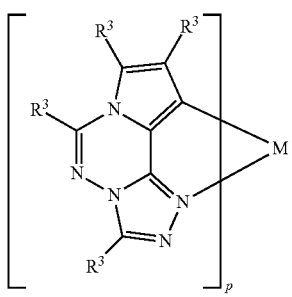
formula (120)
formula (117)
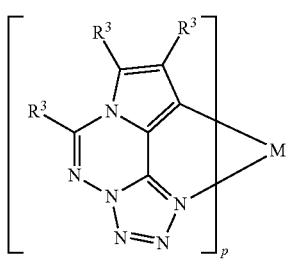
formula (121)
formula (118)
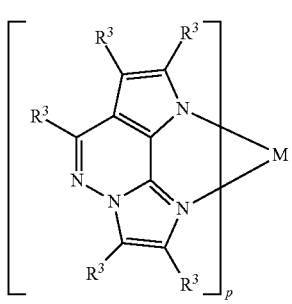
formula (122)
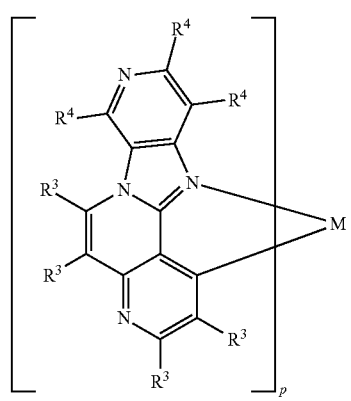
where the symbols and indices used have the meanings indicated above.
Preferred embodiments in which the radicals R³ form a ring system with one another are the structures of the following formulae (119) to (127), formula (123)

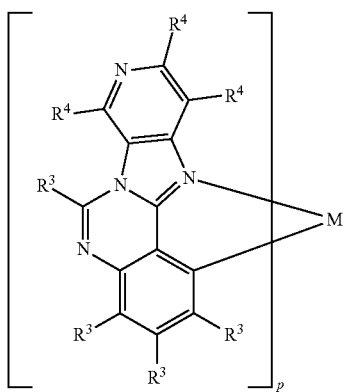

formula (124)

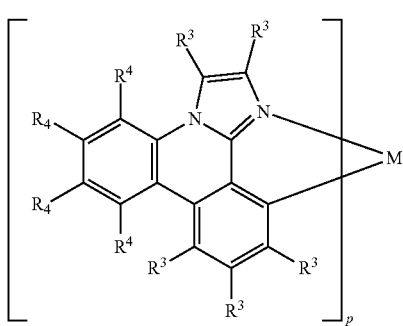

formula (125)

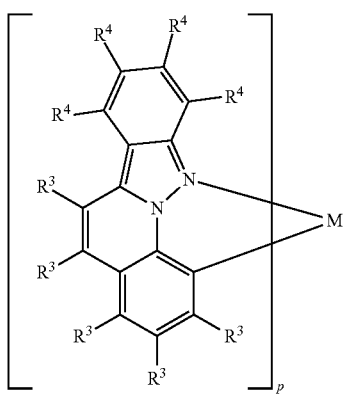

formula (126)

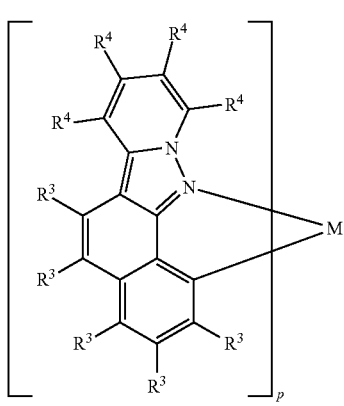

formula (127)

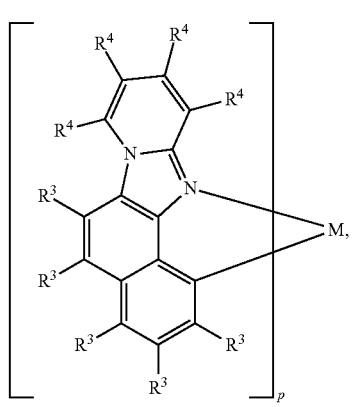

where the symbols and indices used have the meanings given above.

In the structures of the formulae (119) to (127), it is preferred for at least one, preferably precisely one, of the substituents $R^3$ or $R^4$ which is adjacent to a nitrogen which is only bonded in one six-membered ring to be a substituent other than H or D.

Examples of suitable phosphorescent compounds A are structures (1) to (192) shown in the following table.

(1)

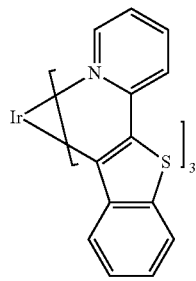

(2)

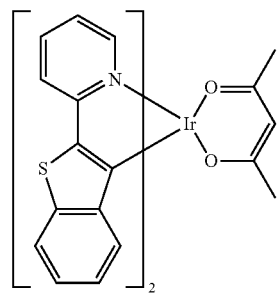

(3)

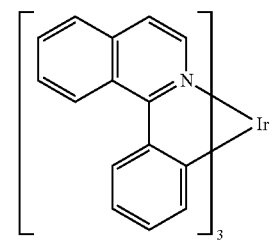

| 101 -continued | 102 -continued |
|---|---|
| 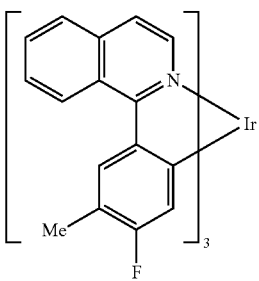 (4) | 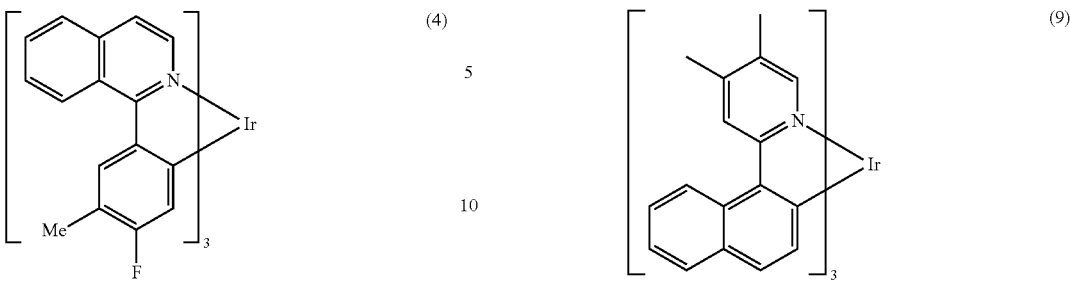 (9) |
| 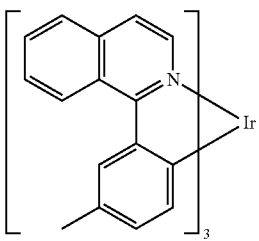 (5) | 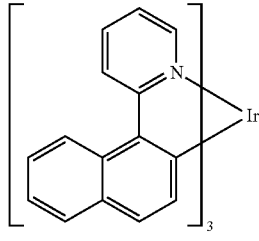 (10) |
| 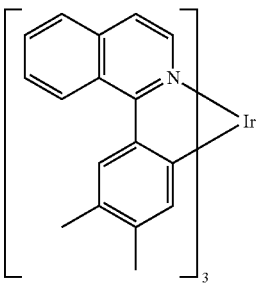 (6) | 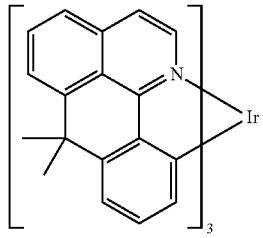 (11) |
| 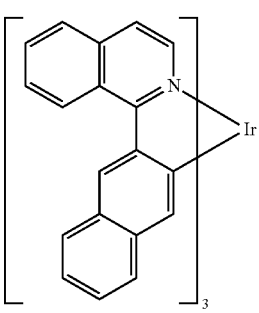 (7) | 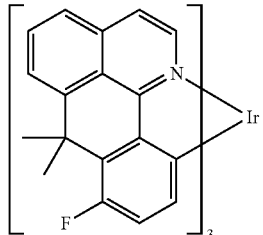 (12) |
| 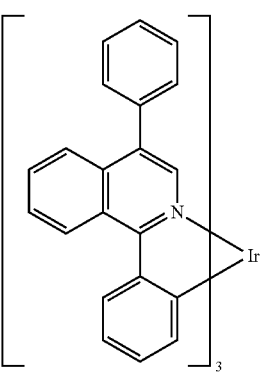 (8) | 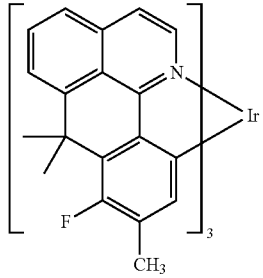 (13) |
| | 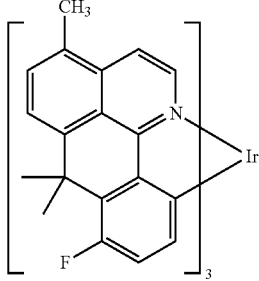 (14) |

-continued
(15) 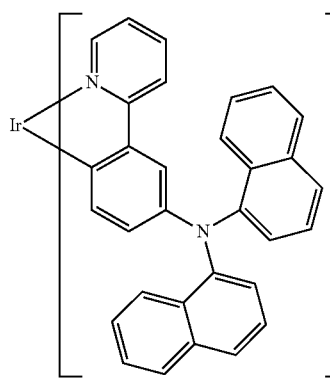
(16) 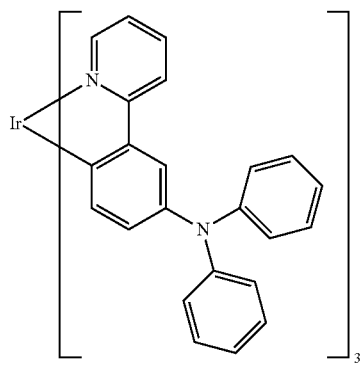
(17) 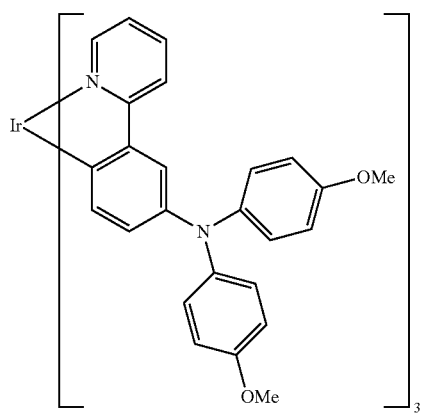
(18) 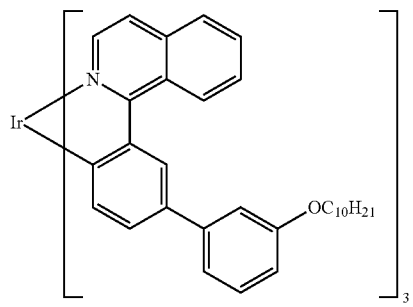
-continued
(19) 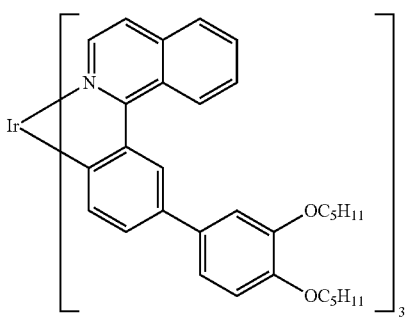
(20) 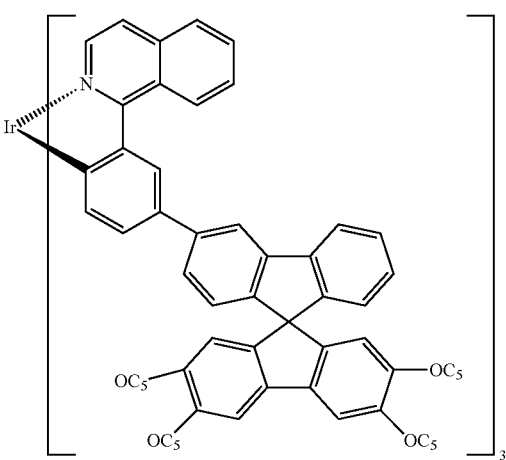
(21) 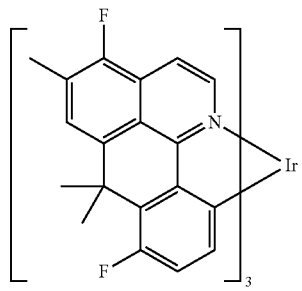
(22) 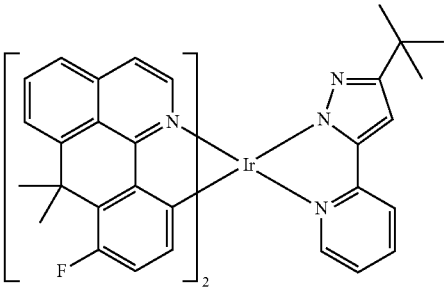

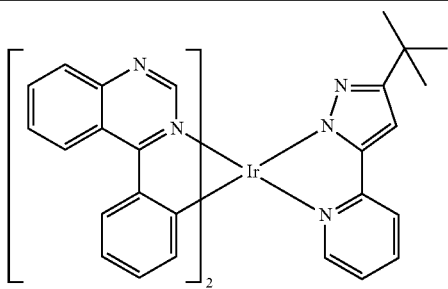
(23)
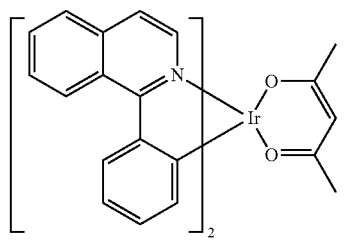
(24)
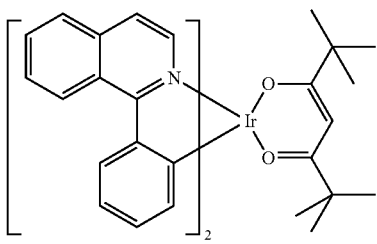
(25)
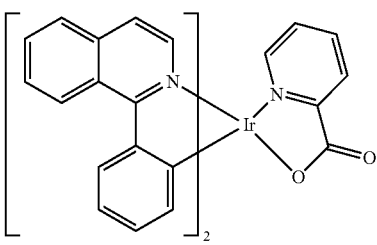
(26)
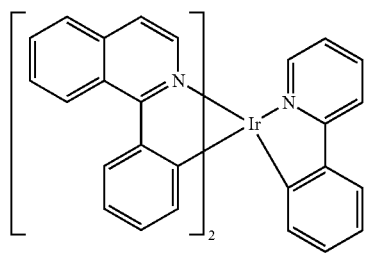
(27)
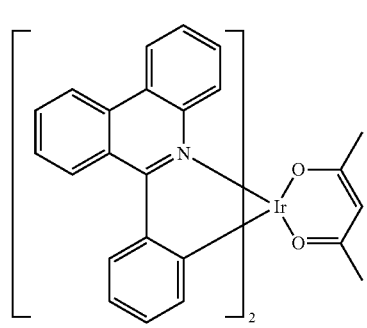
(28)
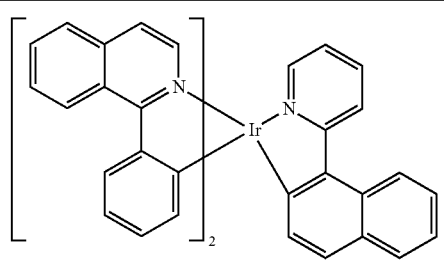
(29)
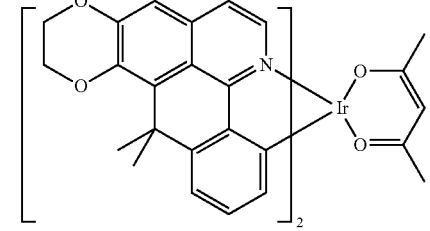
(30)
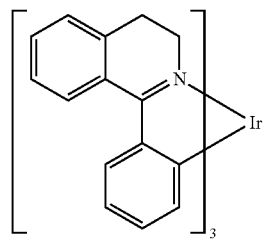
(31)
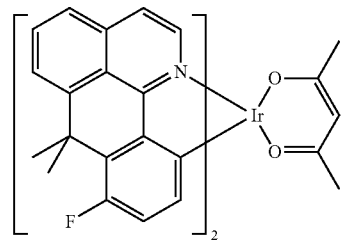
(32)
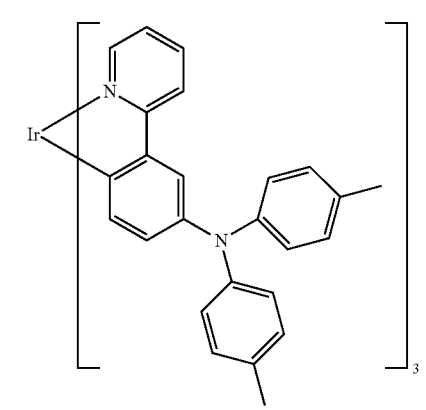
(33)

| 107 -continued | 108 -continued |
|---|---|
| (34) 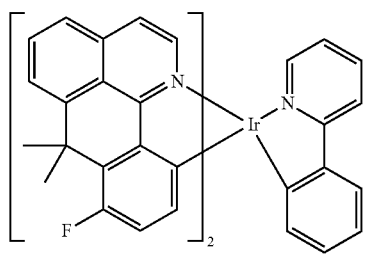 | (39) 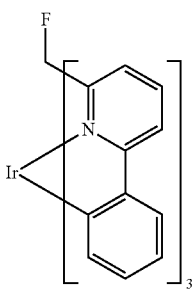 |
| (35) 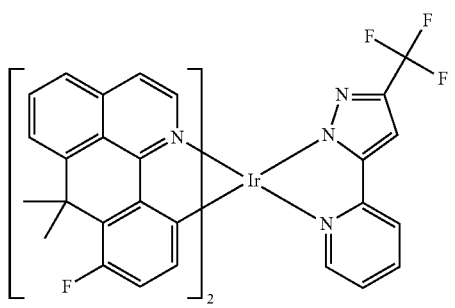 | (40) 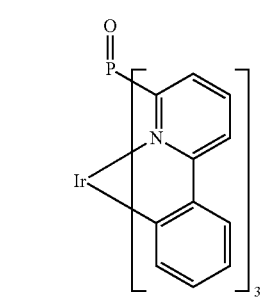 |
| (36) 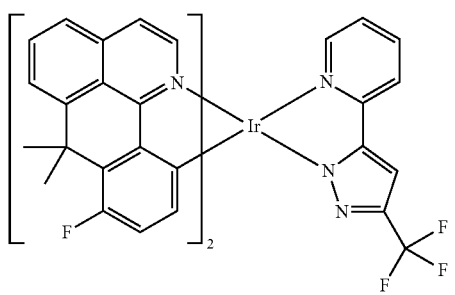 | (41) 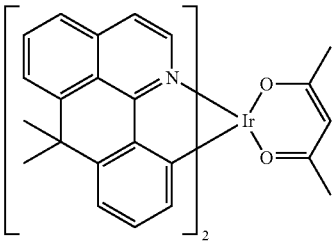 |
| (37) 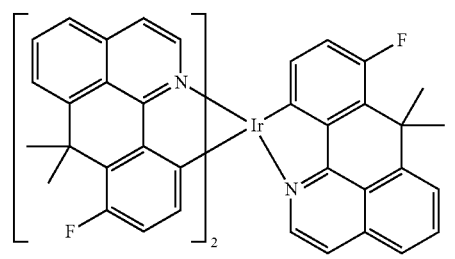 | (42) 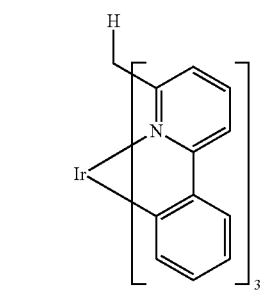 |
| (38) 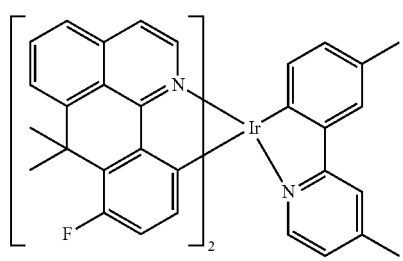 | (43) 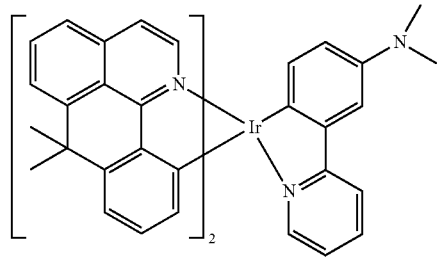 |

-continued
(44) 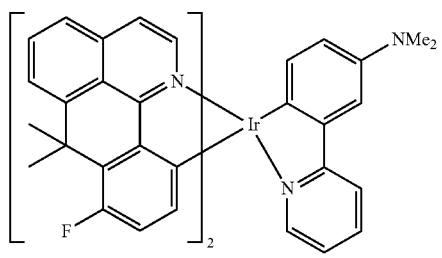
(45) 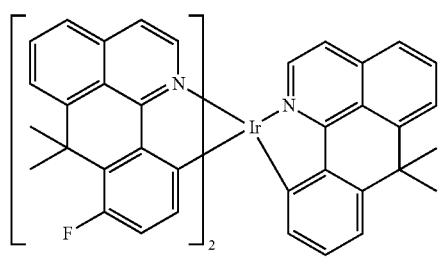
(46) 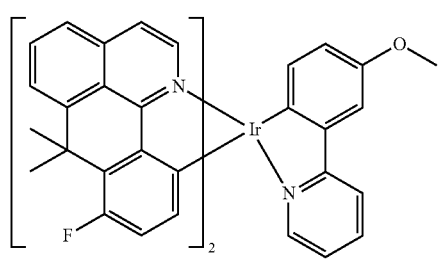
(47) 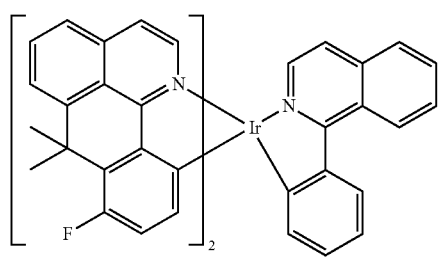
(48) 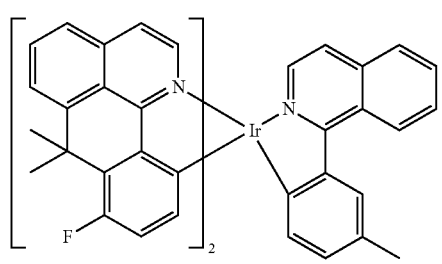
-continued
(49) 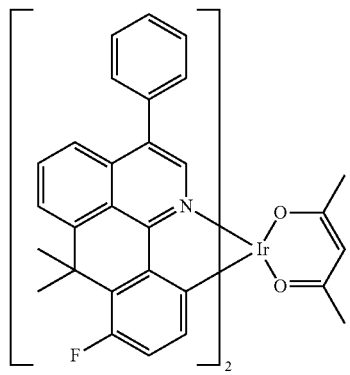
(50) 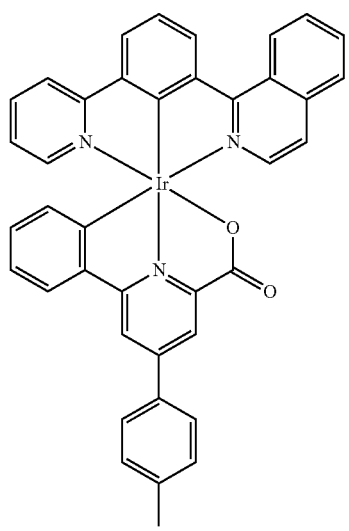
(51) 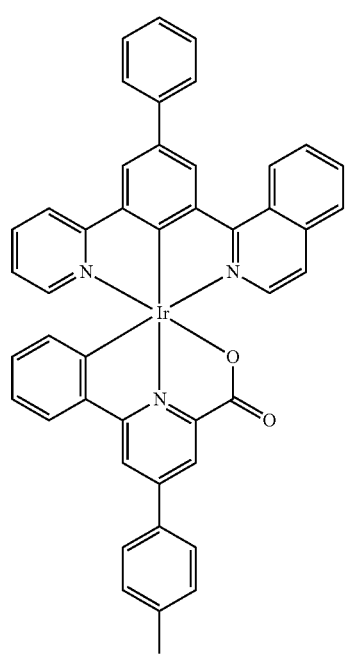

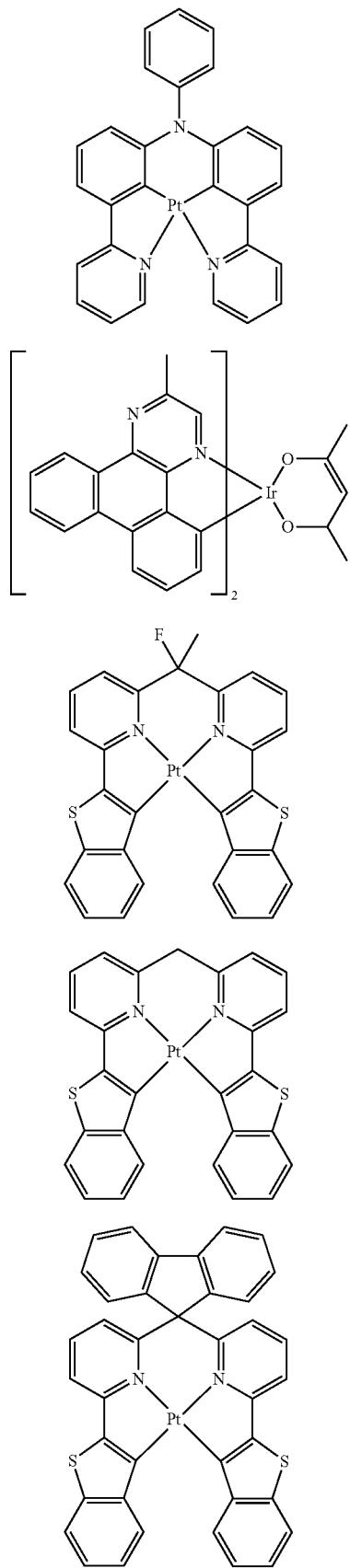
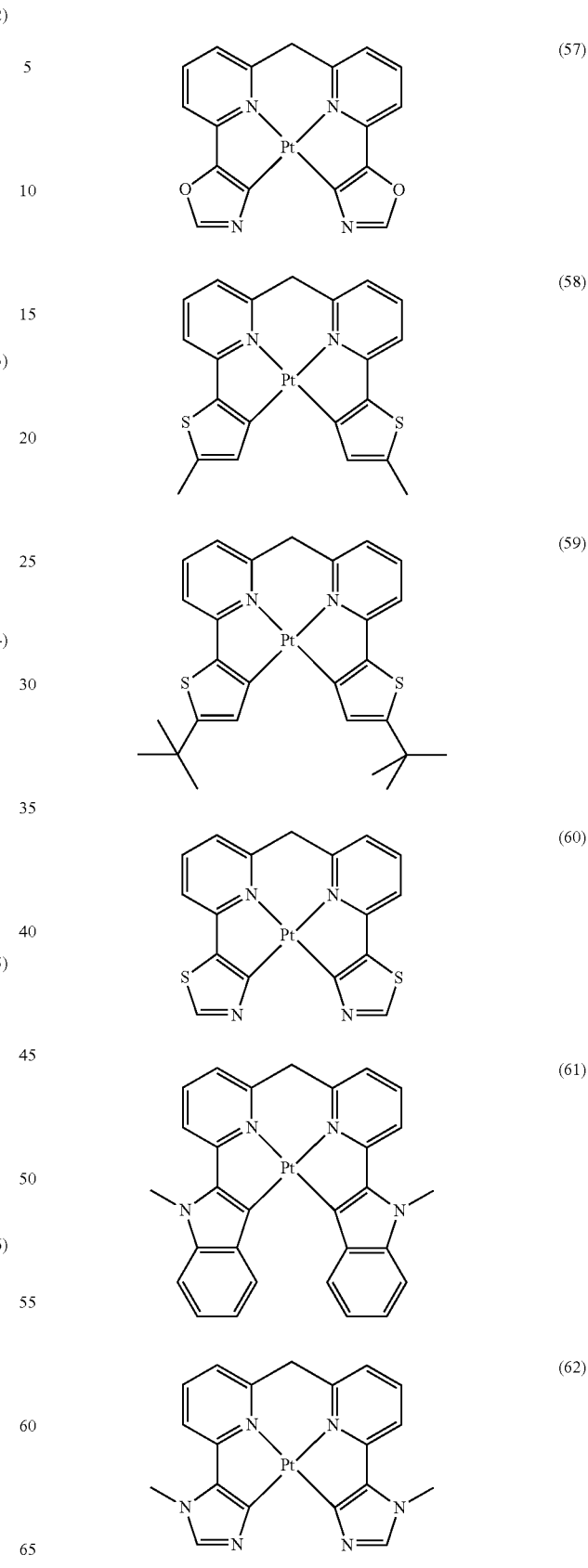

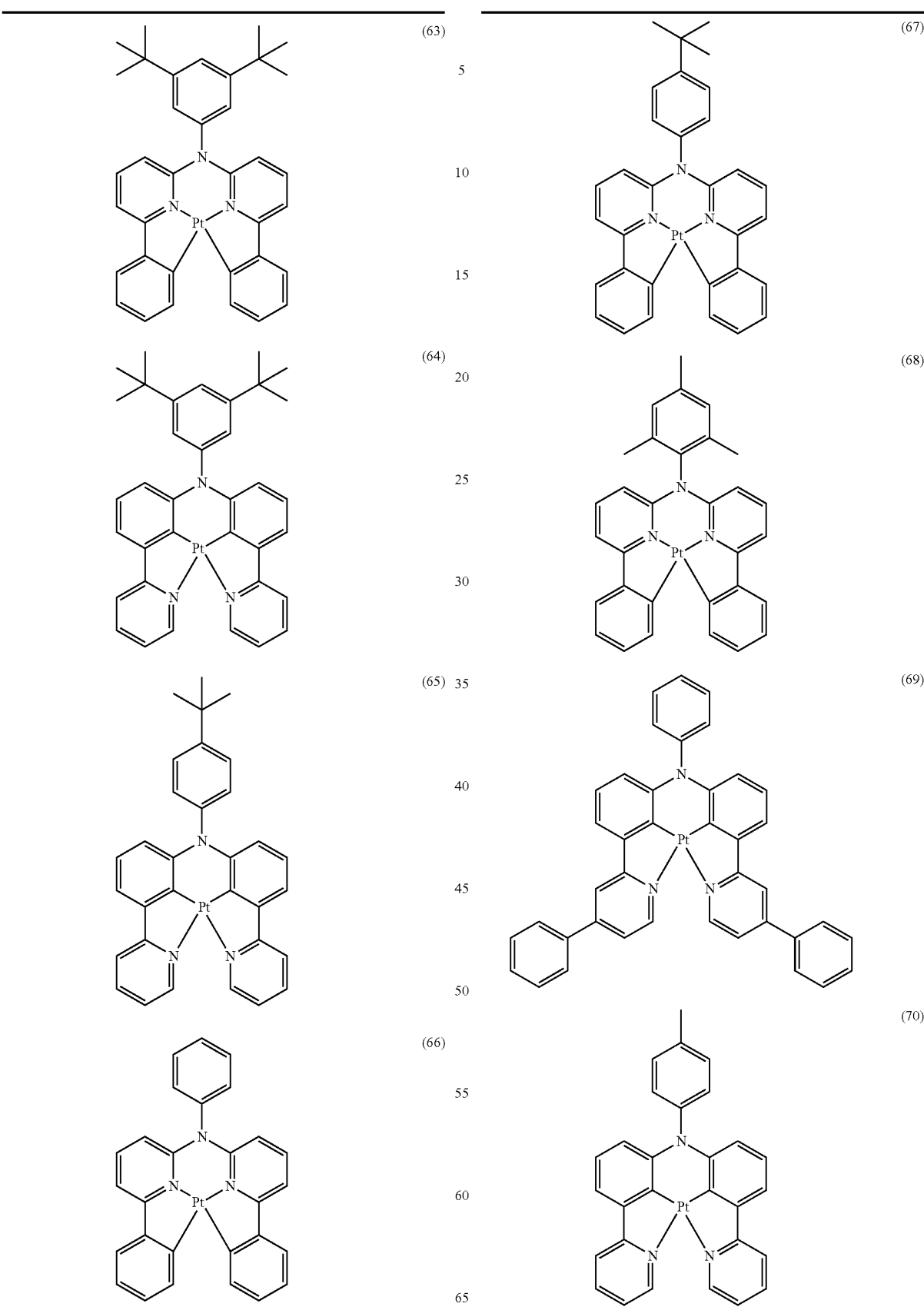

115
-continued
(71)
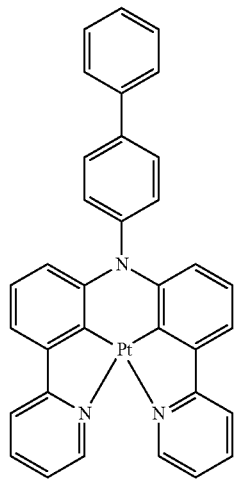
(72)
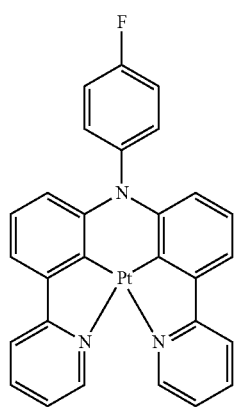
(73)
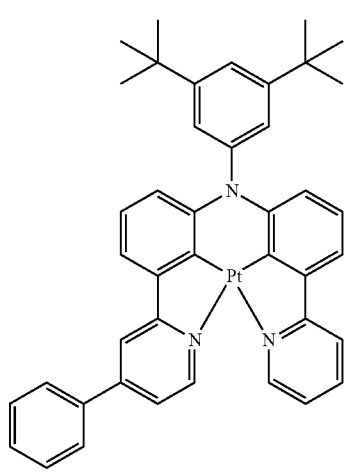
116
-continued
(74)
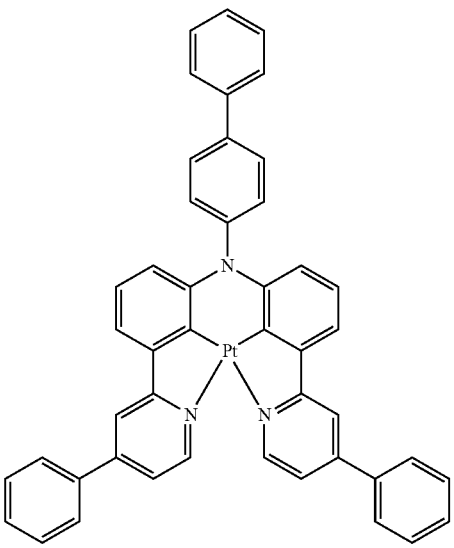
(75)
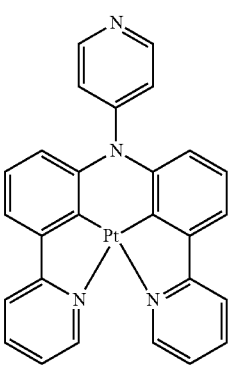
(76)
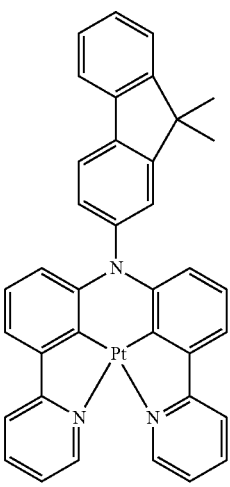

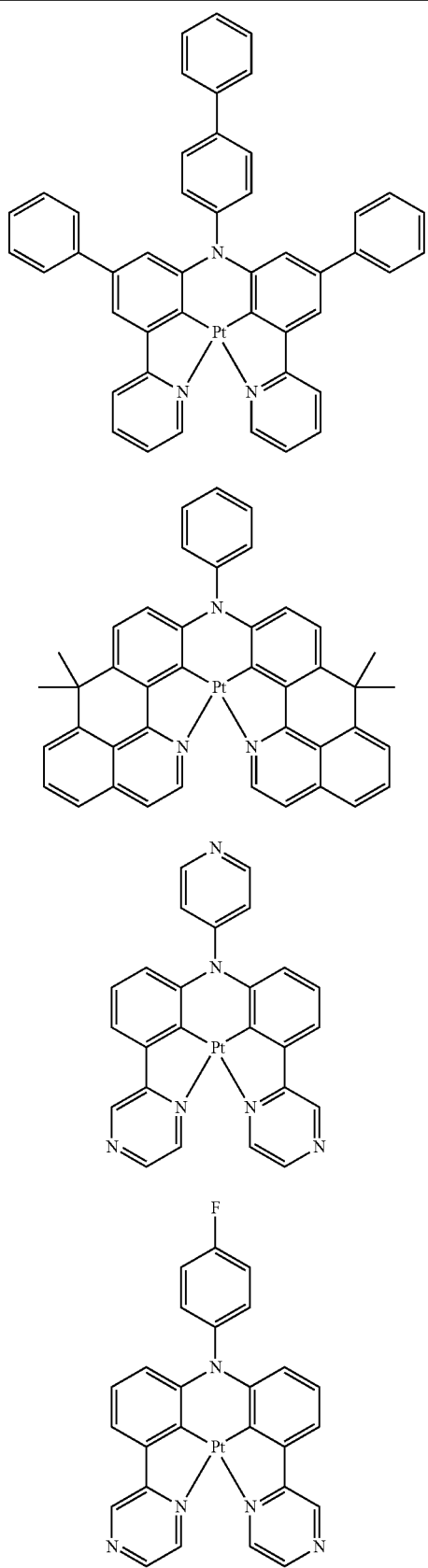
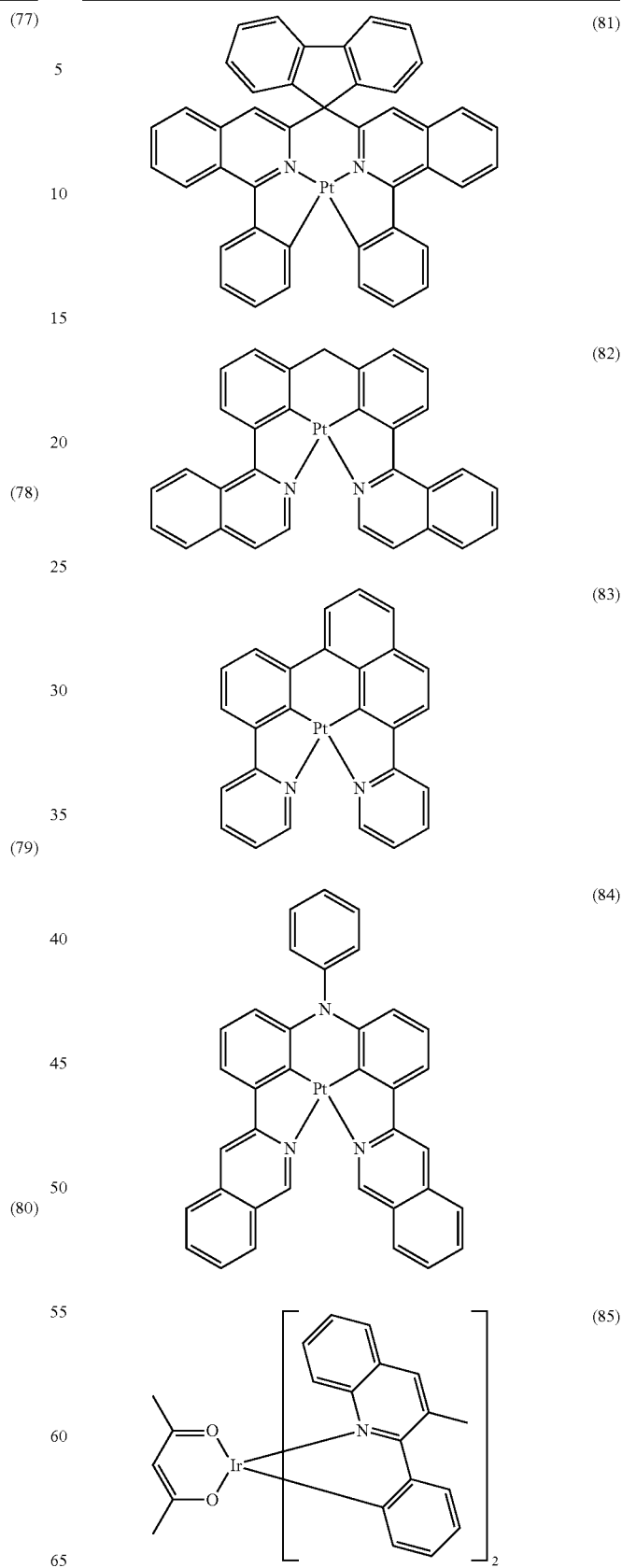

-continued
(86)
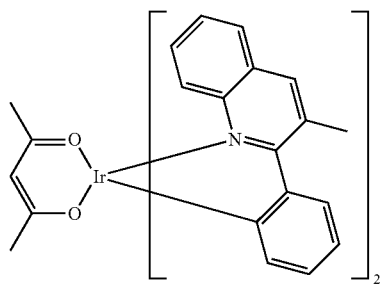
(87)
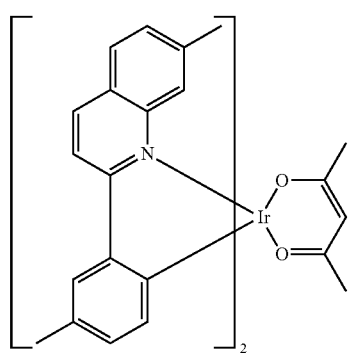
(88)
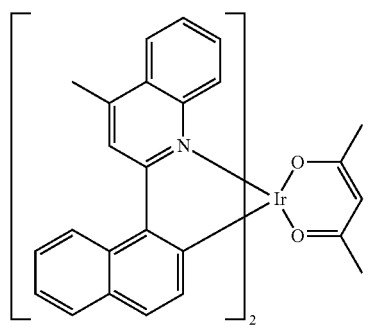
(89)
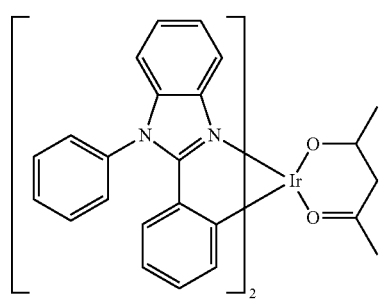
-continued
(90)
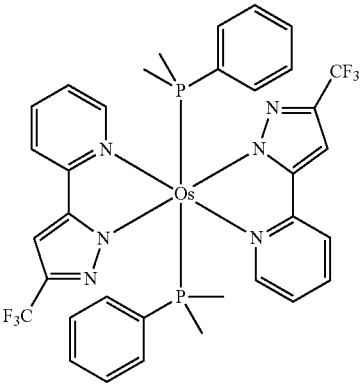
(91)
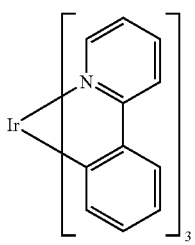
(92)
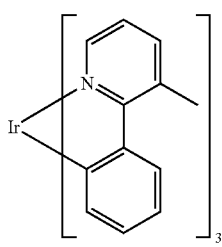
(93)
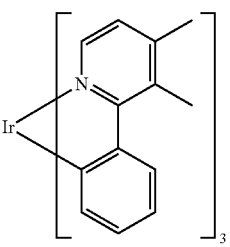
(94)
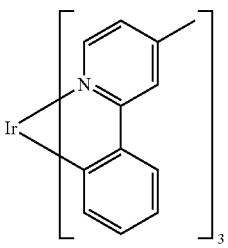

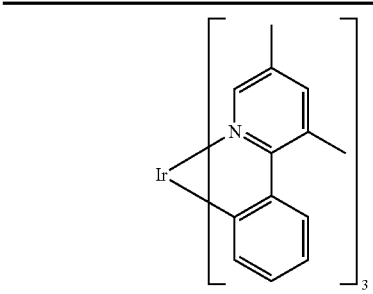
(95)
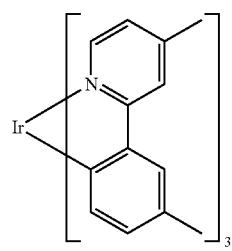
(96)
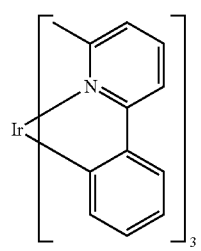
(97)
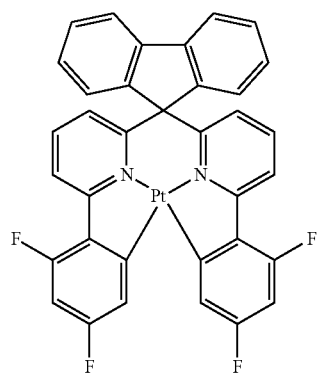
(98)
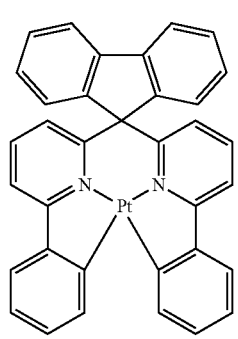
(99)
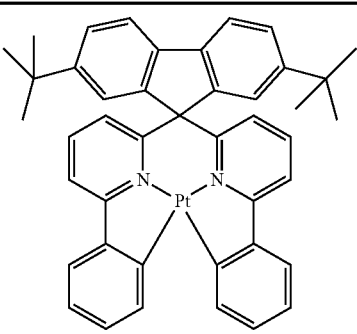
(100)
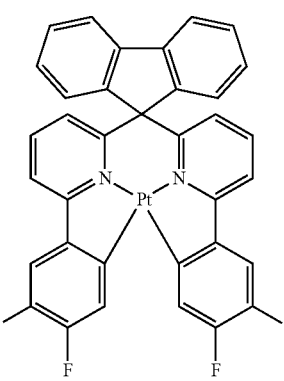
(101)
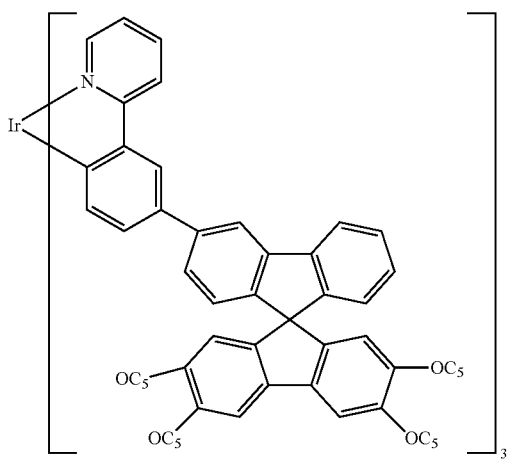
(102)
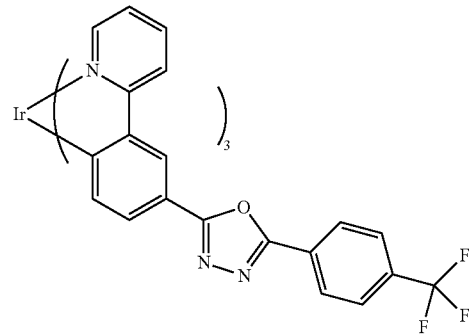
(103)

-continued
(104)
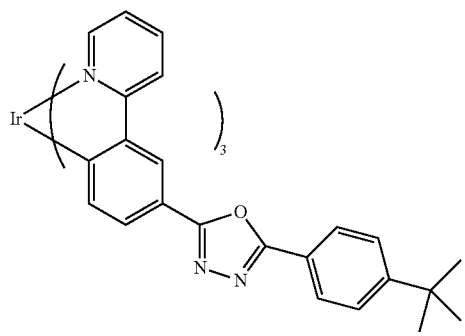
(105)
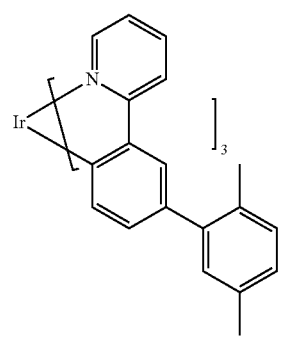
(106)
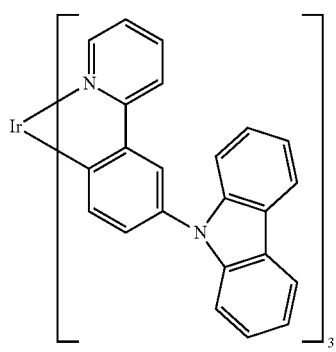
(107)
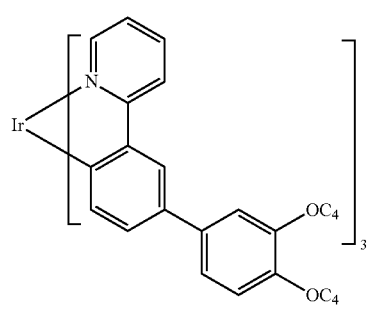
-continued
(108)
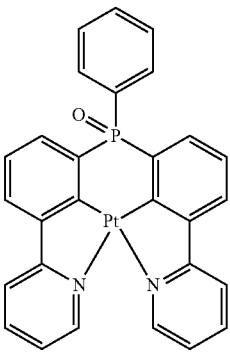
(109)
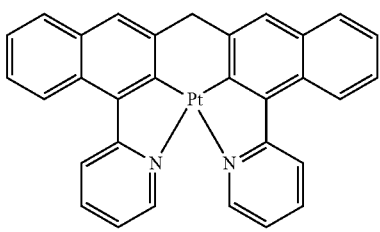
(110)
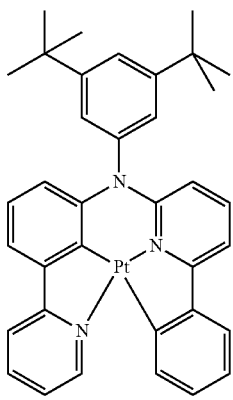
(111)
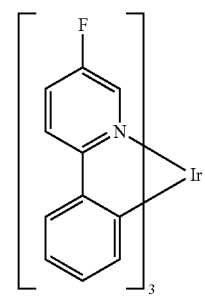
(112)
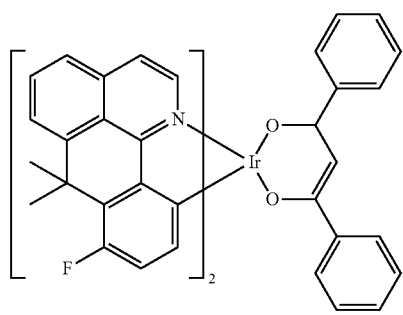

-continued
(113)
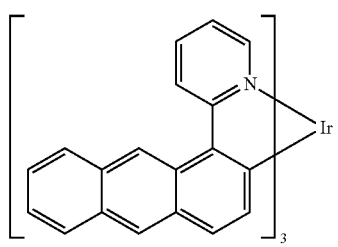
(114)
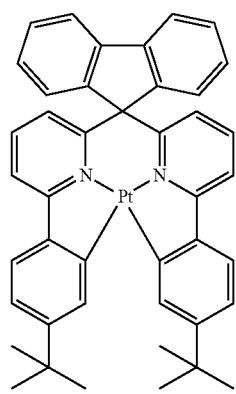
(115)
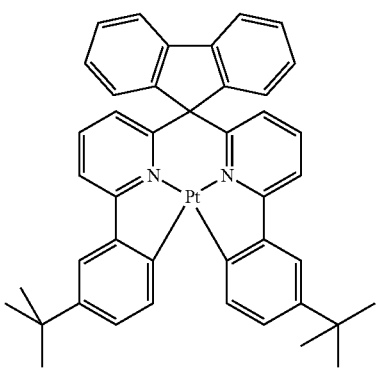
(116)
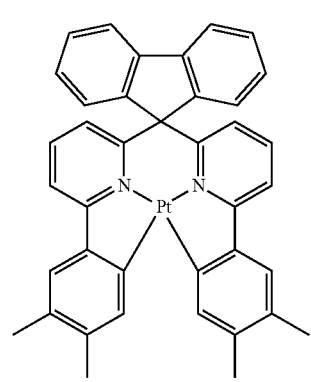
-continued
(117)
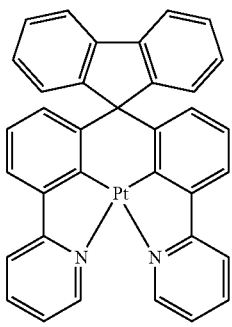
(118)
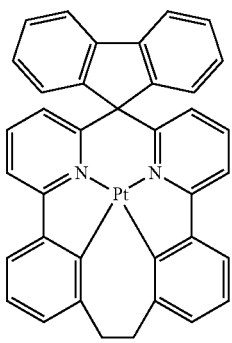
(119)
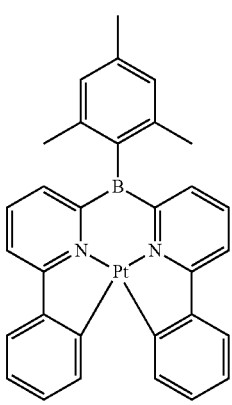
(120)

| 127 -continued | 128 -continued |
|---|---|
| (121) 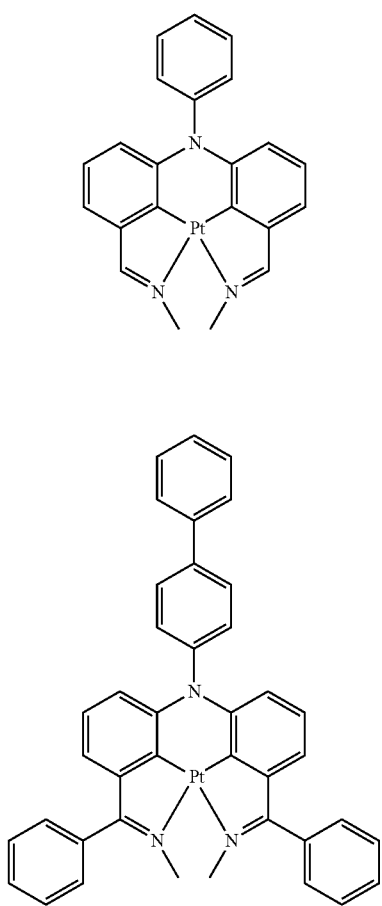 (122) (123) 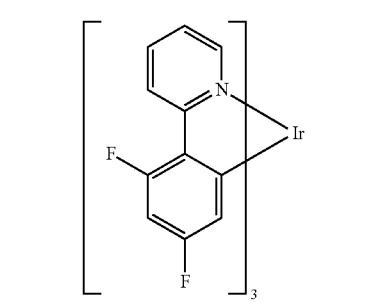 (124) 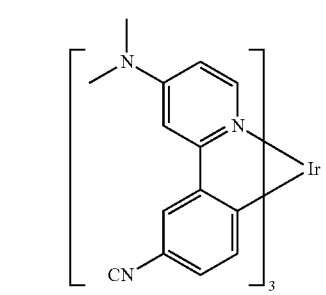 | (125) 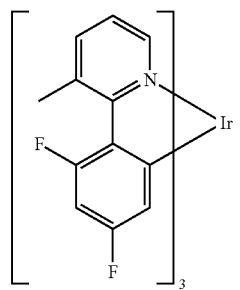 (126) 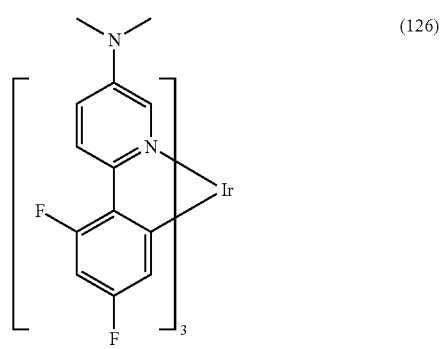 (127) 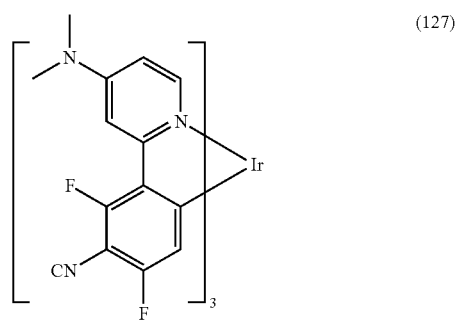 (128) 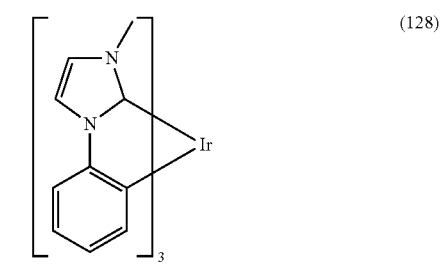 (129) 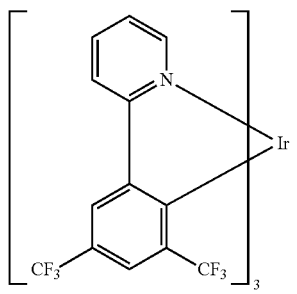 |

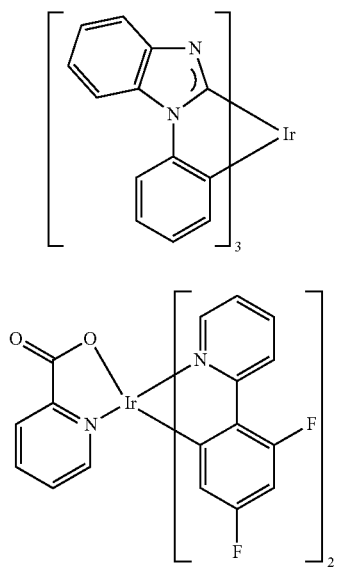
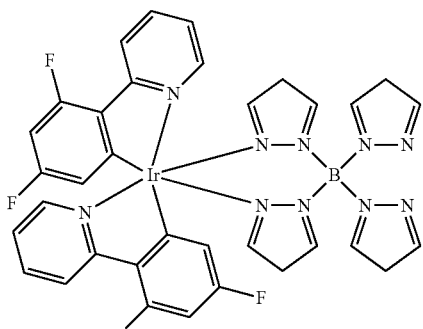
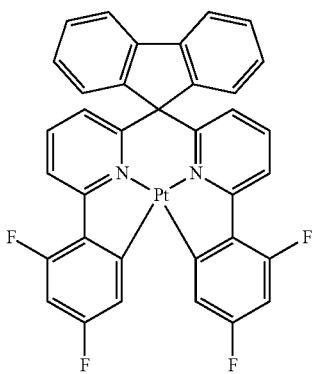
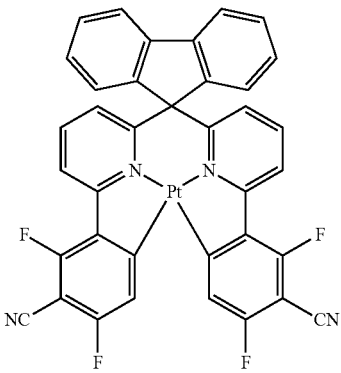
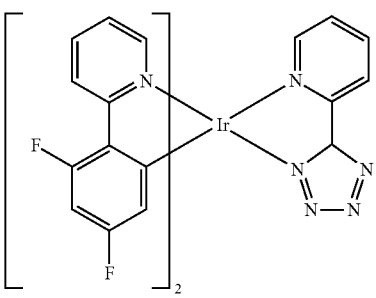

131
-continued
(139)
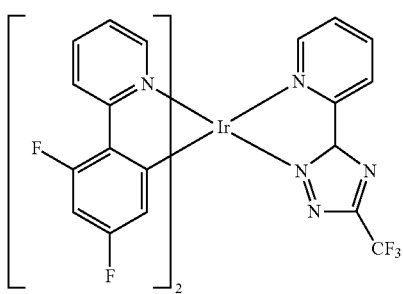
(140)
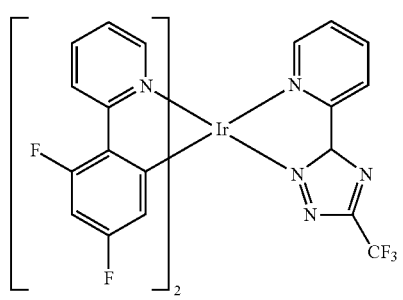
(141)
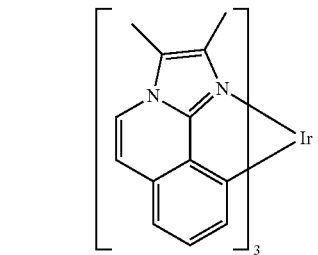
(142)
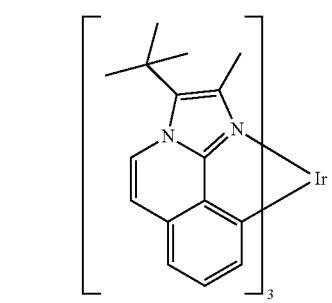
(143)
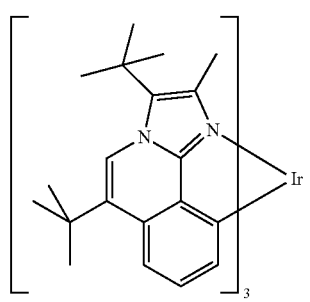
132
-continued
(144)
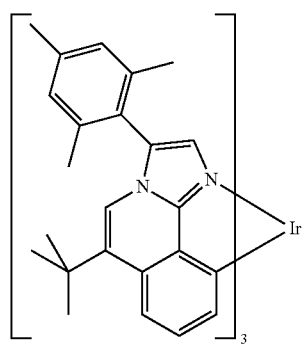
(145)
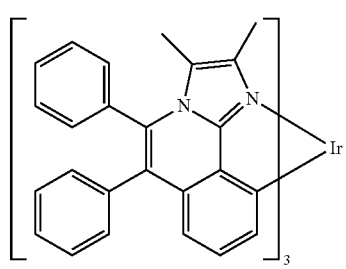
(146)
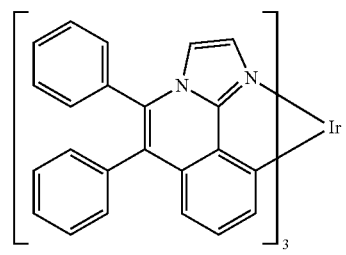
(147)
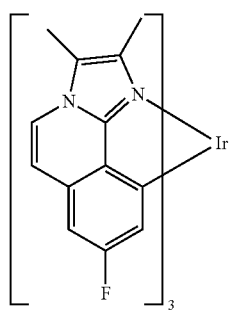
(148)
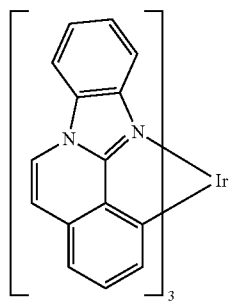

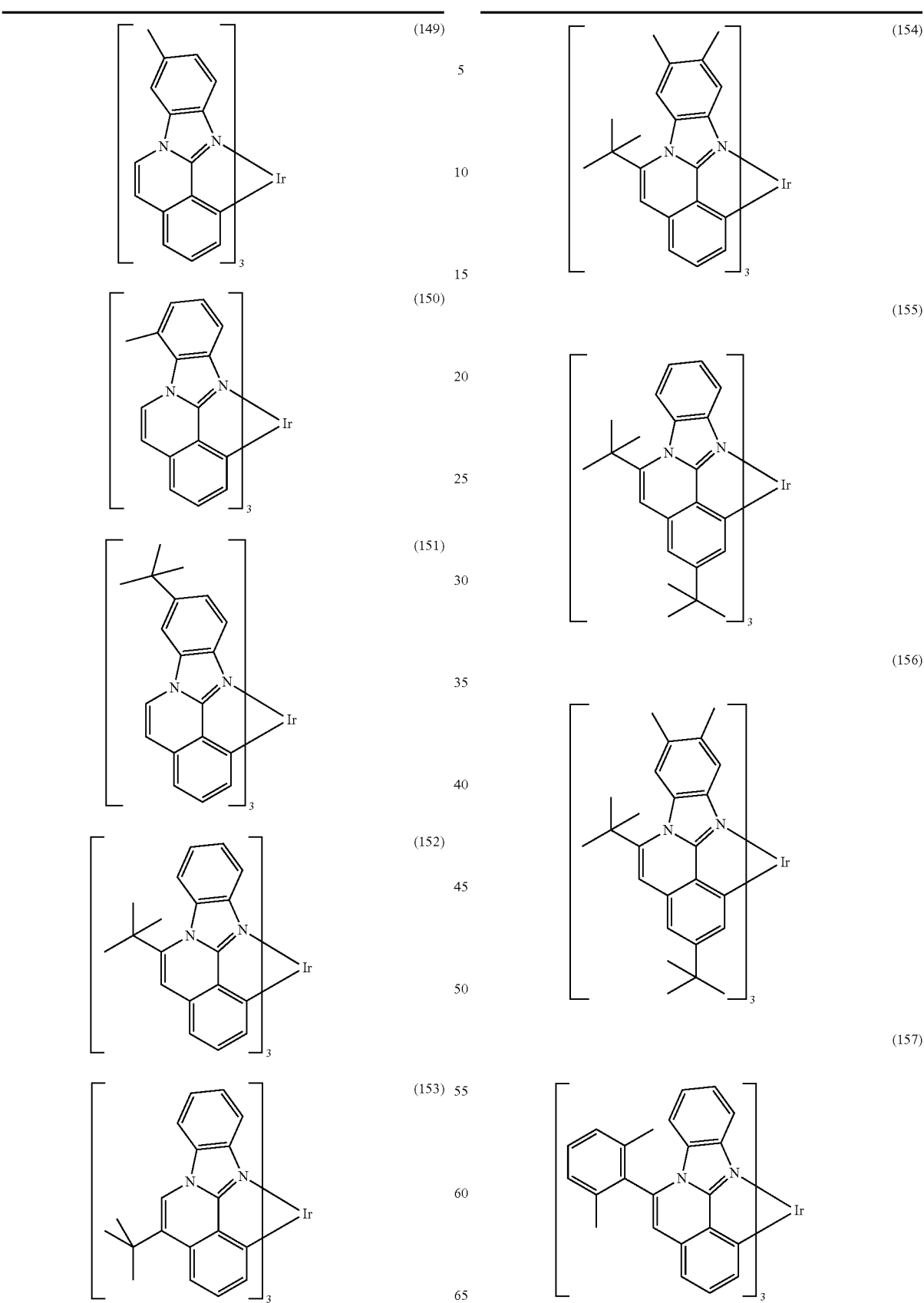

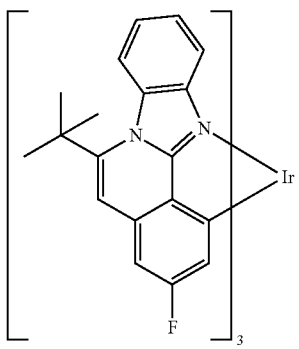 (158)
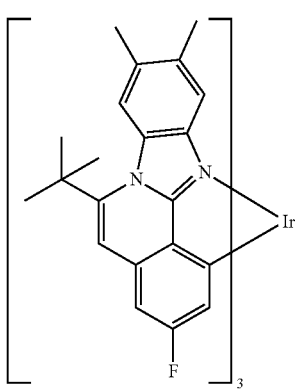 (159)
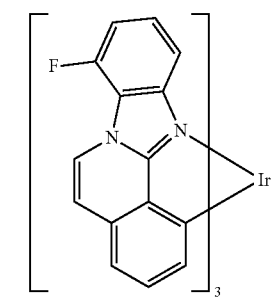 (160)
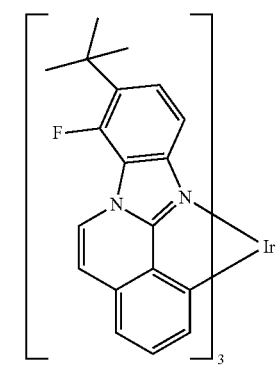 (161)
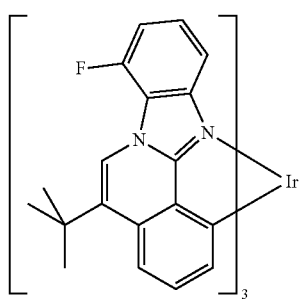 (162)
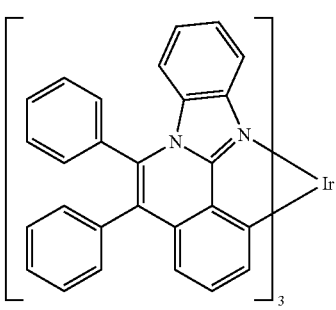 (163)
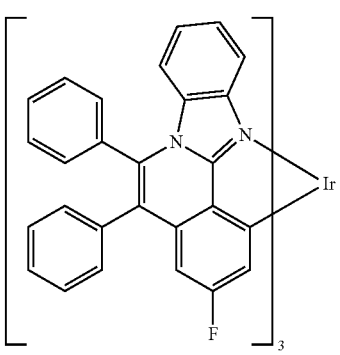 (164)
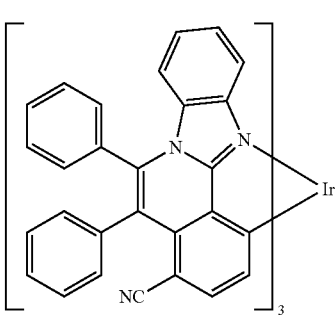 (165)
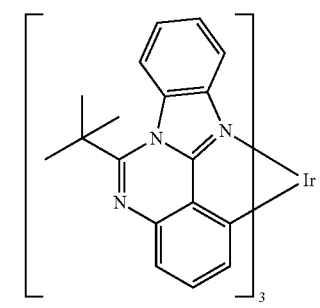 (166)

137
-continued
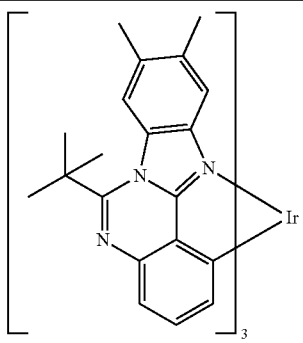
(167)
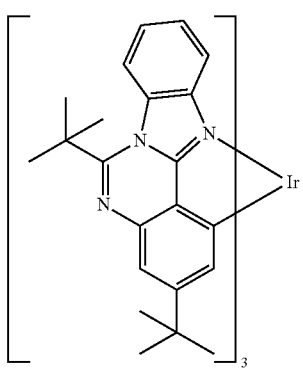
(168)
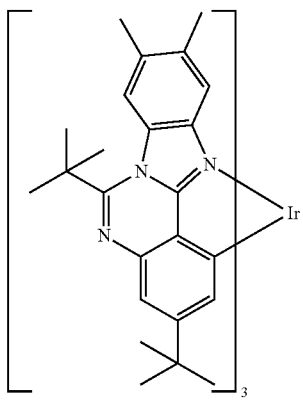
(169)
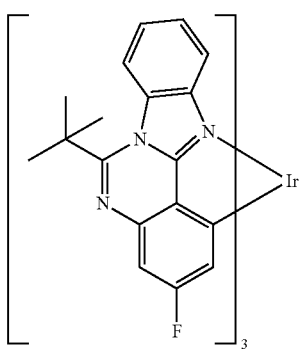
(170)
138
-continued
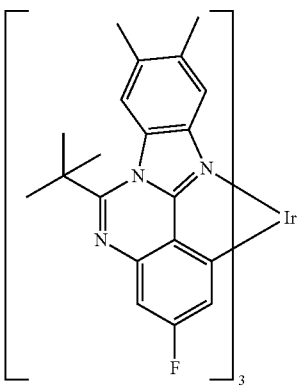
(171)
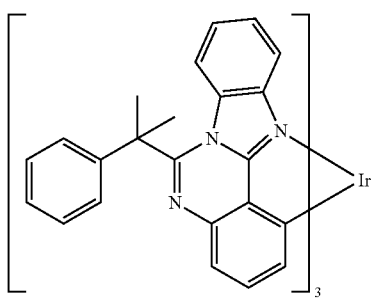
(172)
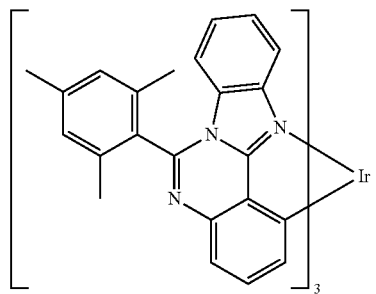
(173)
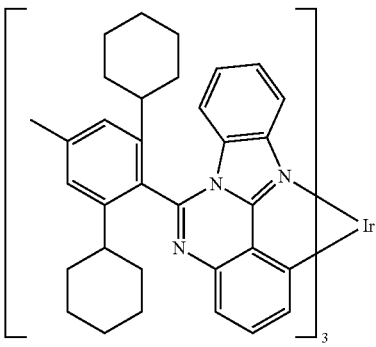
(174)

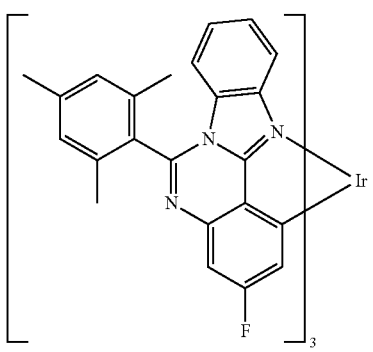 (175)
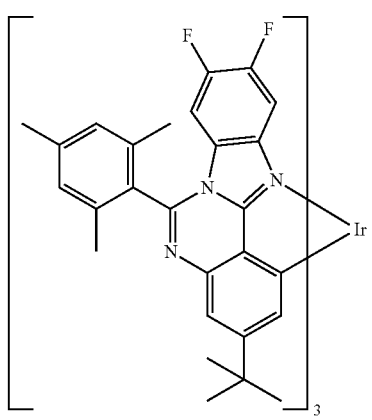 (176)
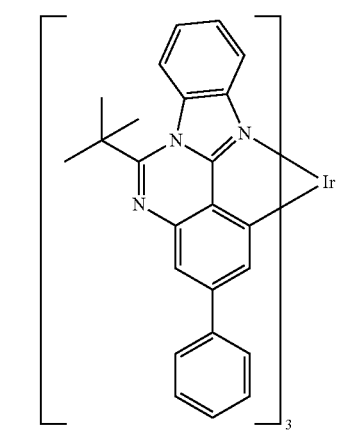 (177)
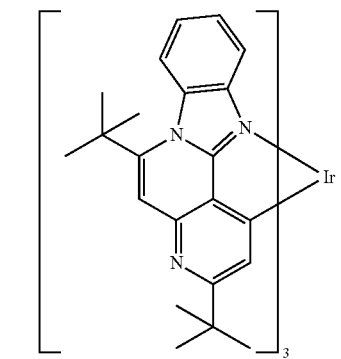 (178)
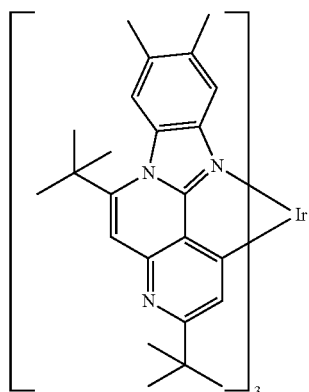 (179)
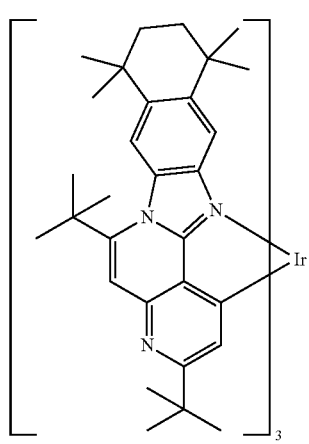 (180)
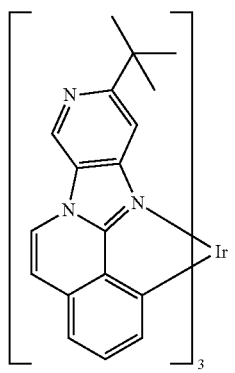 (181)
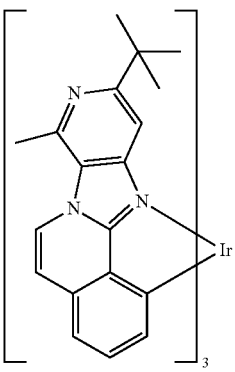 (182)

| 141 -continued | 142 -continued |
|---|---|
| (183) 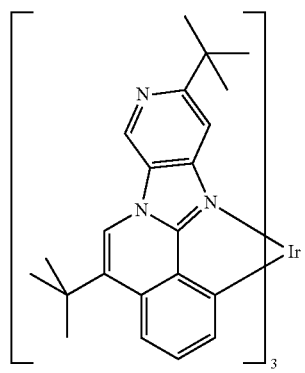 | (187) 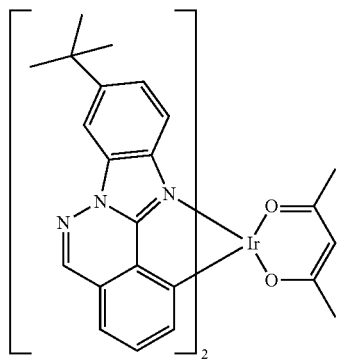 |
| (184) 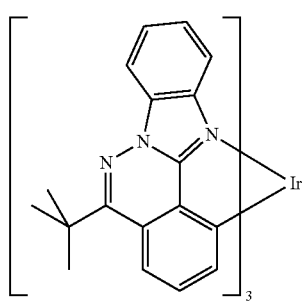 | (188) 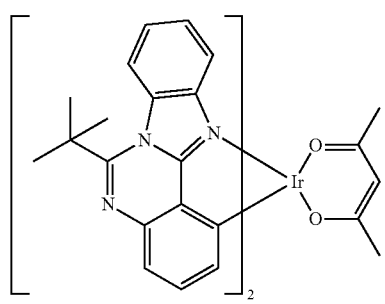 |
| (185) 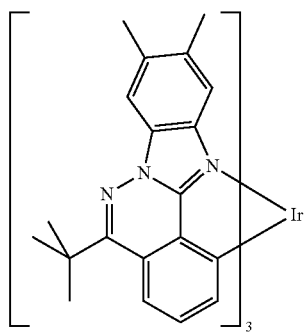 | (189) 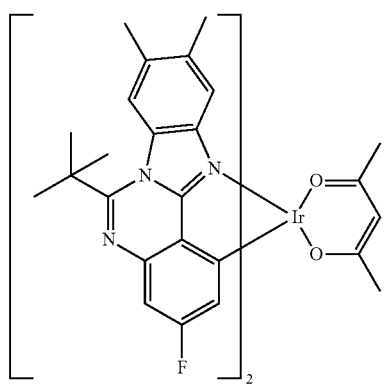 |
| (186) 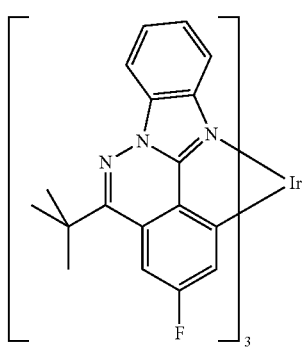 | (190) 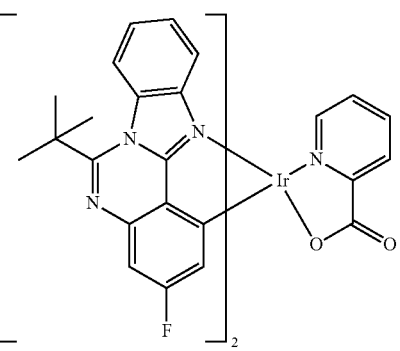 |

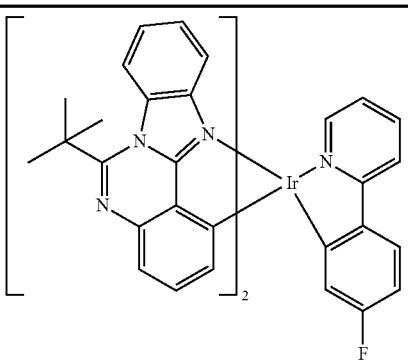

(191)

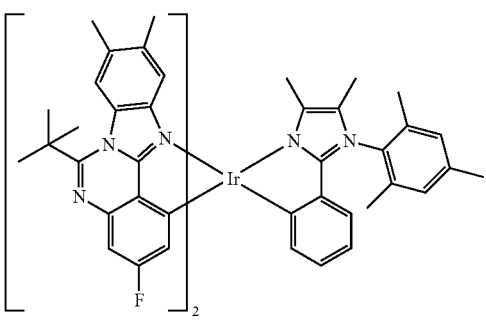

(192)

Apart from cathode, anode and the at least one emitting layer, which has been described above, the organic electroluminescent device may also comprise further layers. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, interlayers, which, for example, control the charge balance in the device, may be present. In particular, such interlayers may be appropriate as intermediate layer between two emitting layers, in particular as intermediate layer between a fluorescent layer and a phosphorescent layer. Furthermore, the layers, in particular the charge-transport layers, may also be doped. The doping of the layers may be advantageous for improved charge transport. However, it should be pointed out that each of the above-mentioned layers does not necessarily have to be present and the choice of the layers is always dependent on the compounds used. The use of layers of this type is known to the person skilled in the art, and he will be able, without inventive step, to use for this purpose all materials in accordance with the prior art which are known for layers of this type.

It is furthermore possible to use more than one emitting layer, for example two or three emitting layers, where these preferably have different emission colours. A preferred embodiment of the invention relates to a white-emitting organic electroluminescent device. This is characterised in that it emits light having CIE colour coordinates in the range from 0.28/0.29 to 0.45/0.48. The general structure of a white-emitting electroluminescent device of this type is disclosed, for example, in WO 2005/011013.

With the structure according to the invention, white-emitting organic electroluminescent devices are accessible particularly well, since the organic electroluminescent device according to the invention results in a colour shift of the emission band to longer wavelengths compared with the emission of the pure emitter in solution and furthermore results in broader emission bands, where this emission has very high efficiency. It is likewise possible, depending on the matrix material used, to obtain both the emission of the pure emitter and also at the same time a longer-wave emission.

Thus, it is possible, for example for the generation of white emission, to dope a blue- or blue/green-phosphorescent emitter A in a layer into a compound with which none of the above-mentioned conditions (1) or (2) are satisfied, and to dope the same emitter A in a further layer, which is, for example, adjacent to the first layer, into a compound B with which either the above-mentioned conditions (1) or the above-mentioned conditions (2) are satisfied. The first layer then exhibits the blue or blue-green emission of emitter A, and the second layer exhibits a longer-wave emission having a broad emission band, resulting overall in white emission having good colour coordinates and high efficiency.

It is likewise possible, for the generation of white emission, to dope a blue- or blue/green-phosphorescent emitter in a layer into a compound with which none of the above-mentioned conditions (1) or (2) are satisfied, and to dope another emitter A in a further layer, which is, for example, adjacent to the first layer, into a compound B with which either the above-mentioned conditions (1) or the above-mentioned conditions (2) are satisfied. The first layer then exhibits the blue or blue-green emission of emitter A, and the second layer exhibits a longer-wave emission, for example yellow emission, having a broad emission band, resulting overall in white emission having good colour coordinates and high efficiency.

It is furthermore possible, for the generation of white emission, to dope a blue- or blue/green-phosphorescent emitter A in a layer into a mixture of two or more different compounds, where none of the above-mentioned conditions (1) or (2) are satisfied with at least one of the compounds and either the above-mentioned conditions (1) or the above-mentioned conditions (2) are satisfied with at least one further compound B. This layer then exhibits both the blue or blue-green emission of emitter A and also a longer-wave emission having a broad emission band, resulting overall in white emission having good colour coordinates. Since this is an organic electroluminescent device having only one emission layer, a device structure of this type is also particularly suitable for the production of the electroluminescent device from solution.

It is therefore preferred to use the organic electroluminescent device structure according to the invention for the generation of white emission. The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). Organic alkali-metal complexes, for example lithium quinolinate, are also suitable here. The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. At least one of the electrodes here must be transparent or partially transparent in order to facilitate the coupling-out of light. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, in combination with the emitting layer according to the invention. The person skilled in the art is aware of what materials he can employ for these layers or functions, and he will be able to employ these materials without an inventive step in the device structure of the organic electroluminescent device according to the invention.

Preference is furthermore given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the initial pressure may also be even lower, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example phosphorescent compound A, compound B and optionally further compounds C.

The organic electroluminescent device can also be produced as hybrid system by applying one or more layers from solution and applying one or more further layers by vapour deposition.

The present invention thus furthermore relates to a process for the production of an organic electroluminescent device according to the invention, characterised in that at least one layer is applied using a sublimation process and/or in that at least one layer is applied using the OVPD process and/or in that at least one layer is applied from solution or by any desired printing process.

For processing from solution, solutions or formulations of the corresponding compounds are necessary. The present invention therefore furthermore relates to a formulation, preferably a solution, a suspension or a miniemulsion, comprising at least one phosphorescent compound A and at least one further compound B, where the above-mentioned relationships apply to compounds A and B.

These processes are generally known to the person skilled in the art and can be applied by him without inventive step to the organic electroluminescent devices according to the invention.

The organic electroluminescent device can be used for various applications, in particular for display applications or as light source, for example for lighting applications or for medical or cosmetic applications.

The organic electroluminescent devices according to the invention have the following surprising advantages over the prior art:

1. The organic electroluminescent device according to the invention exhibits emission whose emission colour has been shifted to longer wavelengths compared with the emission of the emitter in solution. Thus, a specific choice of the matrix material enables the colour location of the emission and the width of the emission band of the organic electroluminescent device to be adjusted.
2. The organic electroluminescent device according to the invention has very high efficiency. This is surprising since an emission from states which are attributable to intermolecular interactions generally only has very low transfer probability and therefore only low efficiency.
3. With the device structure according to the invention, white-emitting electroluminescent devices are accessible using only a single emitter by using different matrix materials in the same layer or in different layers. This represents an industrial advantage in the production of the electroluminescent device, since fewer different materials are necessary.

The invention is described in greater detail by the following examples without wishing to restrict it thereby. The person skilled in the art will be able to produce further organic electroluminescent devices according to the invention without an inventive step.

EXAMPLES

Determination of the HOMO/LUMO Positions and the Triplet Level

The HOMO and LUMO positions of compounds A and B and the triplet level $T_1$ of compounds. B are determined via quantum-chemical calculations. To this end, the "Gaussian03W" software package (Gaussian Inc.) is used. For the calculation of organic substances without metals (called "org." method in Table 4), firstly a geometry optimisation is carried out using the "Ground State/Semi-empirical/Default Spin/AM1" method (charge 0/spin singlet). An energy calculation is then carried out on the basis of the optimised geometry. The "TD-SCF/DFT/Default Spin/B3PW91" method with the "6-31G(d)" base set (charge 0/spin singlet) is used here. For organometallic compounds (called "M-org." method in Table 4), the geometry is optimised via the "Ground State/Hartree-Fock/Default Spin/LanL2 MB" method (charge 0/spin singlet). The energy calculation is carried out analogously to the organic substances as described above, with the difference that the "LanL2DZ" base set (pseudo=LanL2) is used for the metal atom and the "6-31G(d)" base set is used for the ligands. The energy calculation gives the HOMO HEh or LUMO LEh in hartree units. The HOMO and LUMO values in electron volts are determined therefrom as follows, with these relationships arising from the calibration with reference to cyclic voltammetry measurements:

$$HOMO(eV)=((HEh*27.212)-0.9899)/1.1206 \text{ eV}$$

$$LUMO(eV)=((LEh*27.212)-2.0041)/1.385 \text{ eV}$$

For the purposes of this application, these values are to be regarded as the energetic position of the HOMO level or LUMO level of the materials. As an example, an HOMO of −0.17519 hartrees and an LUMO of −0.04192 hartrees are obtained from the calculation for the substance HTM, which corresponds to a calibrated HOMO of −5.14 eV and a calibrated LUMO of −2.27 eV.

The triplet level $T_1$ of compound B and, where appropriate, of compound C is defined as the energy of the triplet state having the lowest energy, which is obtained from the quantum-chemical calculation.

The triplet level $T_1$ of phosphorescent compound A is obtained from the measurement of the photoluminescence maximum of the corresponding compound in toluene ($10^{-5}$ molar solution) at room temperature.

Table 4 shows the HOMO and LUMO values and the triplet levels $T_1$ of the various materials. In the case of the organometallic compounds, the triplet level in Table 4 is determined by measurement of the photoluminescence maximum of the corresponding compound in toluene ($10^{-5}$ molar solution) at room temperature. In the case of the organic compounds, the triplet level is generally not possible by measurement of the photoluminescence at room temperature, therefore the quantum-chemical calculations are used for this purpose, as described above.

Production of OLEDs

OLEDs according to the invention and OLEDs in accordance with the prior art are produced by a general process in accordance with WO 2004/058911, which is adapted to the circumstances described here (layer-thickness variation, materials used).

The structure of various unoptimised OLEDs is presented in Examples 1 to 19 below (see Table 1). Glass plates coated with structured ITO (indium tin oxide) in a thickness of 150 nm are coated with 20 nm of PEDOT (poly(3,4-ethylenedioxy-2,5-thiophene), applied by spin coating from water; purchased from H. C. Starck, Goslar, Germany) for improved processing. These coated glass plates form the substrates to which the OLEDs are applied. The OLEDs have basically the following layer structure: substrate/optional hole-injection layer (HIL)/hole-transport layer (HTL)/electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm.

In order to produce vacuum-processed OLEDs, all materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as M3:M2:TEB-1 (55%:35%:10%) here means that material M3 is present in the layer in a proportion by volume of 55%, M2 is present in the layer in a proportion of 35% and TEB-1 is present in the layer in a proportion of 10%. Analogously, the charge-transport layers may also consist of a mixture of two or more materials. Table 1 shows by way of example components having electron-transport layers which comprise 2 materials (Examples 7 to 13). The precise structure of the OLEDs is shown in Table 1. The materials used for the production of the OLEDs are shown in Table 3.

The OLEDs are characterised by standard methods. For this purpose, the current efficiency (measured in cd/A), the external quantum efficiency (EQE, figure in %) and the voltage (measured in V) are determined from current/voltage/luminous density characteristic lines (IUL characteristic lines). In addition, electroluminescence spectra (EL spectra) are measured. All figures relate to the corresponding values at a luminous density of at 1000 cd/m². Table 2 contains the data obtained for Examples 1 to 19.

Figure 1:
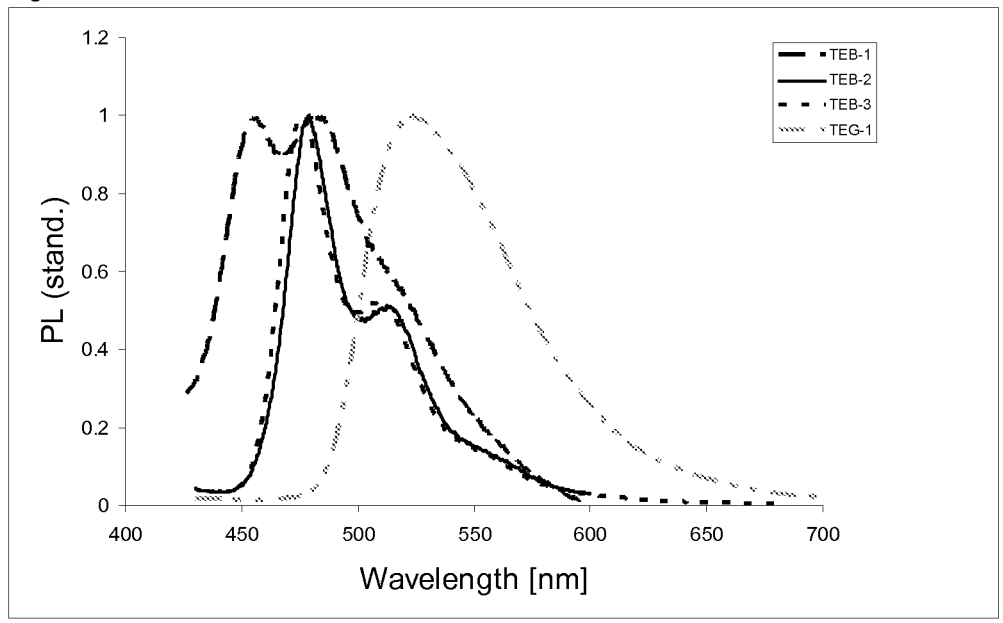
FIG. 1 shows the standardised photoluminescence spectra of emitters TEB-1, TEB-2, TEB-3 and TEG-1 used in a $10^{-5}$ molar solution in toluene. These spectra are used to determine the triplet level.
Figure 2:
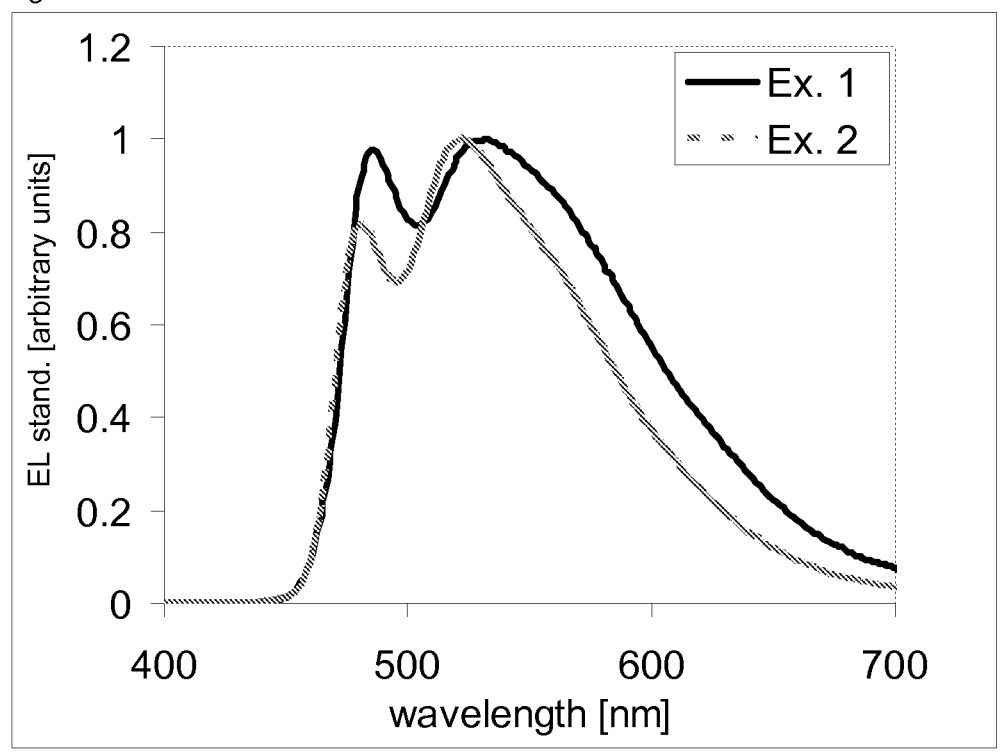
FIG. 2 shows the standardised electroluminescence spectra for Examples 1 and 2. In both examples, the concentration of emitter TEB-2 or TEB-3 in matrix M1 is 10%. The fact that the effect of a broad band occurs at approximately the same level for both emitters allows the conclusion that aggregates of emitter molecules with one another are not involved, since TEB-3 is significantly more sterically hindered owing to its tert-butyl substituent and has a correspondingly lower tendency towards aggregation.
Figure 3:
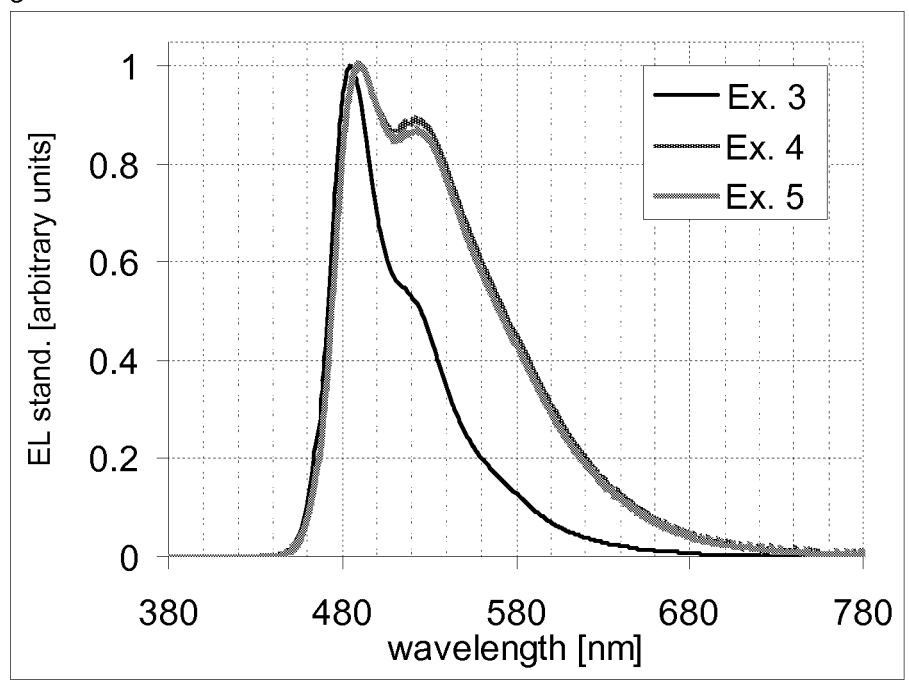
FIG. 3 shows the standardised electroluminescence spectra for Examples 3 to 5. The emitter concentration of TEB-2 here is kept constant in each case, matrices M12 and M2 are used in Examples 3 and 4 with an otherwise identical device structure. The first-mentioned combination (Ex. 3) does not satisfy conditions (1) or (2), whereas the EML of TEB-2 in M2 (Ex. 4) does. This spectrum therefore exhibits the effect according to the invention. The same EML applied to EBM1 by vapour deposition exhibits virtually the same spectrum and very similar efficiencies, which shows that interface effects can also be excluded as the cause of the broad band.
Figure 4:
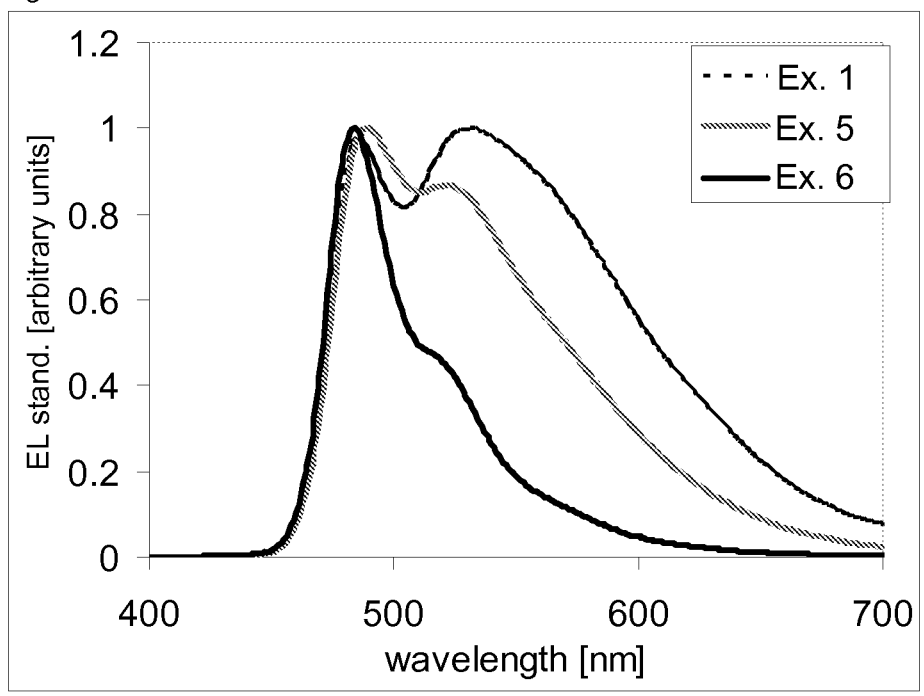
FIG. 4 shows the standardised electroluminescence spectra for Examples 1, 5 and 6. The concentration of emitter TEB-2 here is kept constant at 10%, but matrices having a different LUMO level are used. With increasing modulus of LUMO, the width of the emission and its efficiency (EQE) increases. The lowest efficiency is exhibited by the pure triplet emission of the emitter, which is a surprising result.
Figure 5:
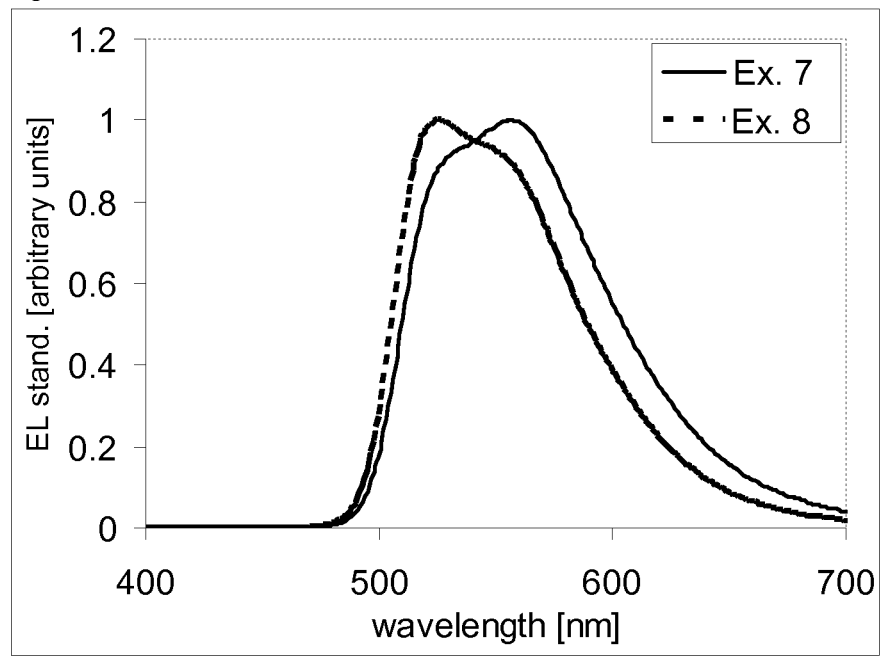
FIG. 5 shows the standardised electroluminescence spectra for Examples 7 and 8. Here, in each case 10% of TEG-1 is used as emitter. In matrix M4, the emitter exhibits the typical green EL spectrum (Ex. 7), in matrix M5 a broadened EL spectrum (Ex. 8), or an EL spectrum with increased intensity in the longer-wave spectral region. This example shows that the effect is not restricted to blue emitters and can thus also be used for the production of devices with other mixed colours.
Figure 6:
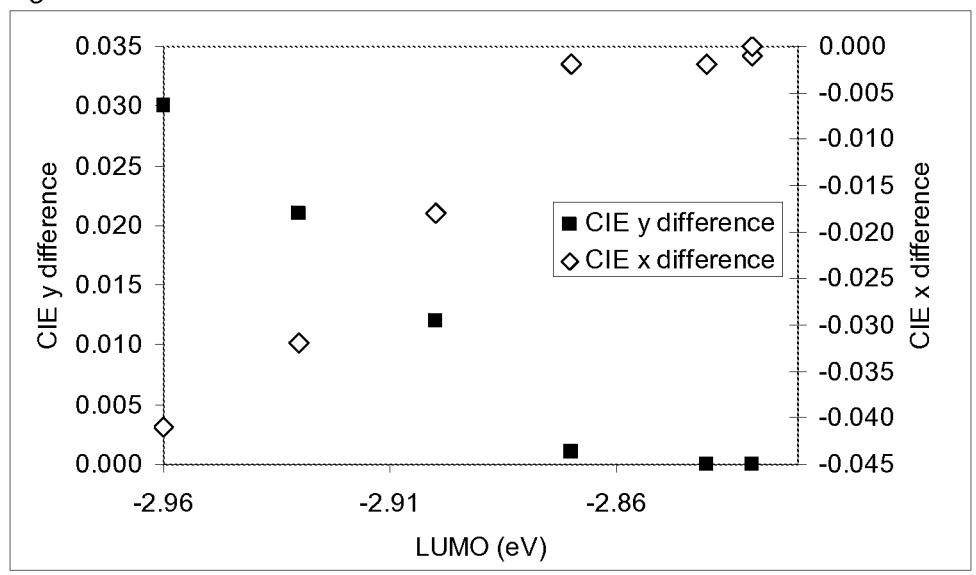
FIG. 6 shows the difference of CIEx and CIEy from the electroluminescence spectra of TEG-1 in matrices M4 to M9 from CIEx and CIEy of TEG-1 in matrix M4 (Examples 7 to 12). This difference is in each case plotted against the LUMO values of the matrices. It can be seen for LUMO values greater than ≈−2.87 eV the difference is equal to zero. For smaller LUMO values, a difference greater than zero is found, which means that the spectra are broadened. If the difference of this limiting value from the HOMO of emitter TEG-1 is calculated in accordance with relationship (1), a ΔE of 2.35 eV is obtained, which is smaller than that of the emission maximum in toluene of 2.37 eV.
Figure 7:
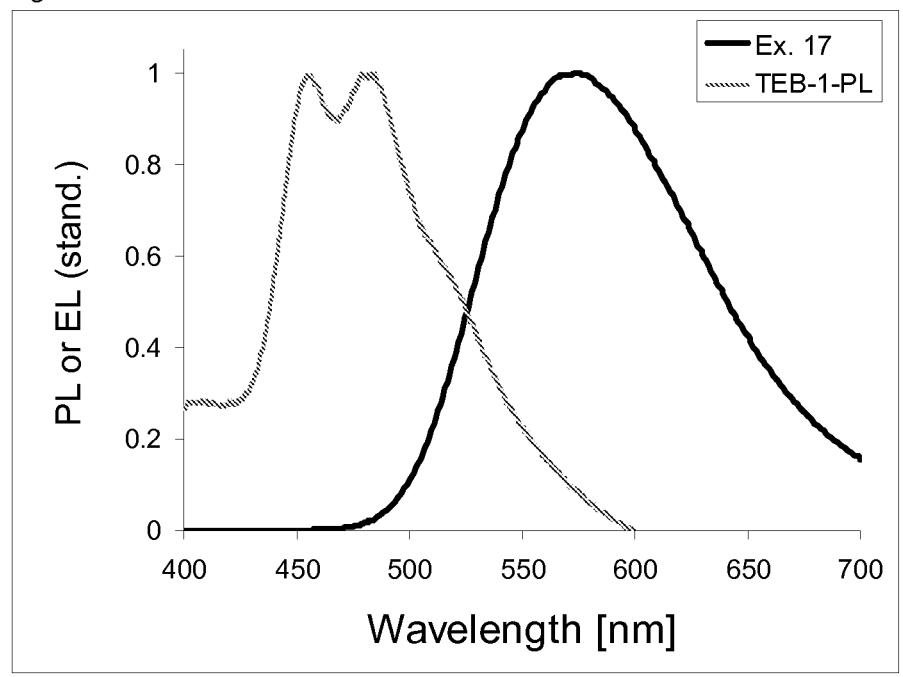
FIG. 7 shows the standardised electroluminescence spectrum for Example 17. Emitter TEB-1 in matrix M1 (Ex. 17) here exhibits virtually exclusively the broad band without actual triplet emission. For comparison, the PL spectrum of the emitter in solution has been copied as reference into the EL spectrum.
Figure 8:
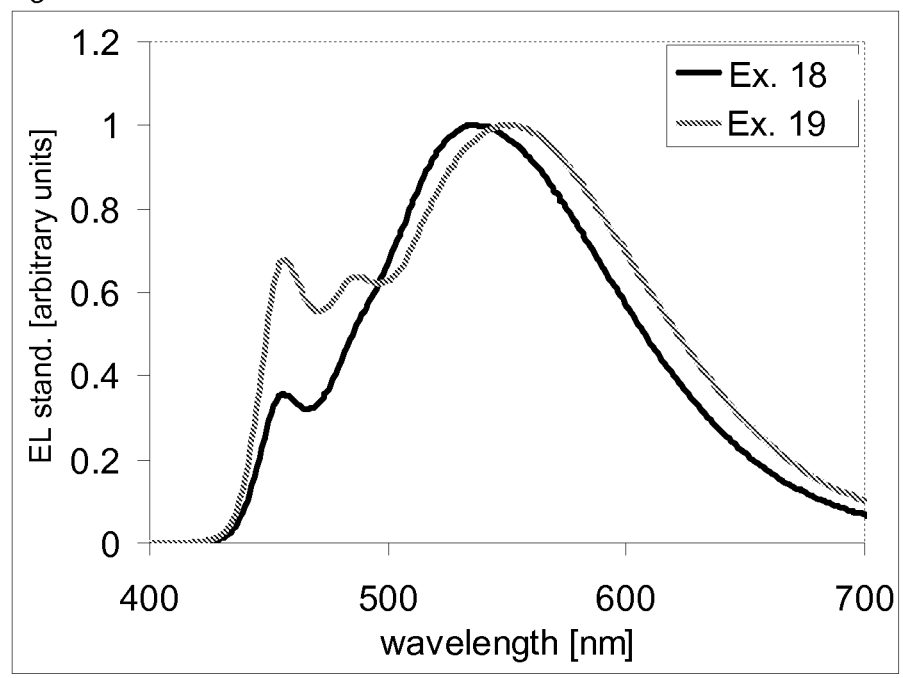
FIG. 8 shows the standardised electroluminescence spectra for Examples 18 and 19. Here, the two matrices M1 and M3 are mixed with one another within a layer (Ex. 18) or two emission layers each comprising one of the two matrices are introduced successively into an OLED (Ex. 19). This enables the two electroluminescence spectra to be generated in total, which results in a white emission.
Figure 9:
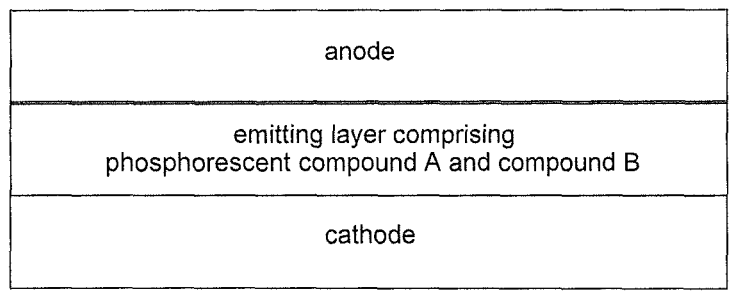

Example 13 to Example 16 show OLEDs comprising further emitters (TEB-4 to TEB-7) in various matrices, which likewise exhibit a broadened emission or a broad band, as revealed by the OLED data in Table 2.

TABLE 1

Structure of the OLEDs

| Ex. | HIL Thickness | HTL Thickness | EBL Thickness | EML1 Thickness | EML2 or HBL Thickness | ETL Thickness | EIL Thickness |
|---|---|---|---|---|---|---|---|
| 1 | HIM 20 nm | HTM 5 nm | EBM1 15 nm | M1:TEB-2 (90%:10%) 40 nm | M1 10 nm | AIQ 20 nm | LiF 2 nm |
| 2 | HIM 20 nm | HTM 5 nm | EBM1 15 nm | M1:TEB-3 (90%:10%) 40 nm | M1 10 nm | AIQ 20 nm | LiF 2 nm |
| 3 comp. | HIM 20 nm | HTM 5 nm | EBM2 15 nm | M12:TEB-2 (90%:10%) 40nm | M1 10 nm | AIQ 20 nm | LiF 2 nm |
| 4 | HIM 20 nm | HTM 5 nm | EBM2 15 nm | M2:TEB-2 (90%:10%) 40 nm | M1 10 nm | AIQ 20 nm | LiF 2 nm |
| 5 | HIM 20 nm | HTM 5 nm | EBM1 15 nm | M2:TEB-2 (90%:10%) 40 nm | M1 10 nm | AIQ 20 nm | LiF 2 nm |
| 6 | HIM 20 nm | HTM 5 nm | EBM1 15 nm | M3:TEB-2 (90%:10%) 40 nm | M1 10 nm | AIQ 20 nm | LiF 2 nm |
| 7 | HIM 70 nm | HTM 90 nm | — | M4:TEG-1 (90%:10%) 30 nm | — | ETM1:LiQ 40 nm | — |
| 8 | HIM 70 nm | HTM 90 nm | — | M5:TEG-1 (90%:10%) 30 nm | — | ETM1:LiQ 40 nm | — |
| 9 | HIM 70 nm | HTM 90 nm | — | M6:TEG-1 (90%:10%) 30 nm | — | ETM1:LiQ 40 nm | — |
| 10 | HIM 70 nm | HTM 90 nm | — | M7:TEG-1 (90%:10%) 30 nm | — | ETM1:LiQ 40 nm | — |
| 11 | HIM 70 nm | HTM 90 nm | — | M8:TEG-1 (90%:10%) 30 nm | — | ETM1:LIQ 40 nm | — |
| 12 | HIM 70 nm | HTM 90 nm | — | M9:TEG-1 (90%:10%) 30 nm | — | ETM1:LiQ 40 nm | — |
| 13 | HIM 20 nm | HTM 5 nm | EBM1 15 nm | M1:TEB-4 (90%:10%) 40 nm | — | ETM1:LiQ 30 nm | — |
| 14 | HIM 20 nm | HTM 5 nm | EBM1 15 nm | M10:TEB-5 (90%:10%) 40 nm | M10 10 nm | AIQ 20 nm | LiF 2 nm |
| 15 | HIM 20 nm | HTM 5 nm | EBM1 15 nm | ETM2:TEB-6 (90%:10%) 40 nm | — | ETM2 30 nm | LiQ 2 nm |
| 16 | HIM 20 nm | HTM 5 nm | EBM1 15 nm | M11:TEB-7 (90%:10%) 40 nm | — | M11 10 nm | LiQ 2 nm |
| 17 | HIM 20 nm | HTM 5 nm | EBM1 15 nm | M1:TEB-1 (90%:10%) 40 nm | — | ETM2 30 nm | LiQ 2 nm |
| 18 | HIM 20 nm | HTM 5 nm | EBM1 15 nm | M3:M1:TEB-1 (85%:10%:5%) 40 nm | — | ETM2 30 nm | LiQ 2 nm |
| 19 | HIM 20 nm | HTM 5 nm | EBM1 15 nm | M3:TEB-1 (90%:10%) 20 nm | M1:TEB-1 (90%:10%) 20 nm | ETM2 30 nm | LIQ 2 nm |

TABLE 2
OLED data for OLEDs from Table 1
| Ex. | Efficiency (cd/A) at 1000 cd/m² | EQE (%) at 1000 cd/m² | Voltage (V) at 1000 cd/m² | CIE x/y at 1000 cd/m² |
|---|---|---|---|---|
| 1 | 23.4 | 8.3 | 5.4 | 0.34/0.51 |
| 2 | 40.8 | 13.7 | 4.3 | 0.31/0.52 |
| 3 | 18.8 | 7.7 | 5.7 | 0.19/0.45 |
| 4 | 33.0 | 11.5 | 5.1 | 0.29/0.52 |
| 5 | 33.8 | 11.8 | 5.8 | 0.28/0.52 |
| 6 | 19.7 | 8.6 | 6.7 | 0.17/0.42 |
| 7 | 51.8 | 14.7 | 3.6 | 0.37/0.60 |
| 8 | 36.3 | 10.5 | 3.3 | 0.40/0.57 |
| 9 | 40.8 | 12.1 | 3.7 | 0.39/0.58 |
| 10 | 35.4 | 9.9 | 3.3 | 0.38/0.59 |
| 11 | 48.3 | 13.6 | 3.5 | 0.36/0.60 |
| 12 | 56.9 | 16.1 | 3.3 | 0.36/0.60 |
| 13 | 32.3 | 14.0 | 5.2 | 0.52/0.47 |
| 14 | 16.4 | 10.4 | 7.6 | 0.30/0.50 |
| 15 | 29.4 | 9.7 | 4.7 | 0.33/0.53 |
| 16 | 24.1 | 8.4 | 3.9 | 0.30/0.53 |
| 17 | 38.2 | 14.0 | 5.1 | 0.47/0.51 |
| 18 | 23.4 | 8.2 | 6.2 | 0.34/0.48 |
| 19 | 24.2 | 9.6 | 6.5 | 0.34/0.43 |
TABLE 3
Structural formulae of the materials used
HIM
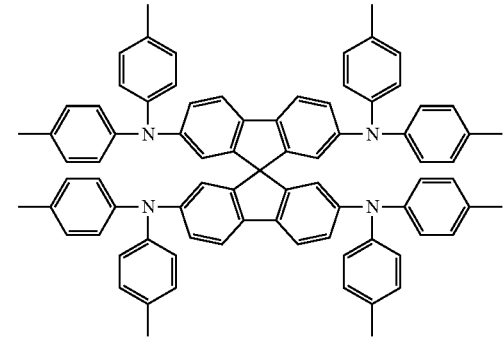
HTM
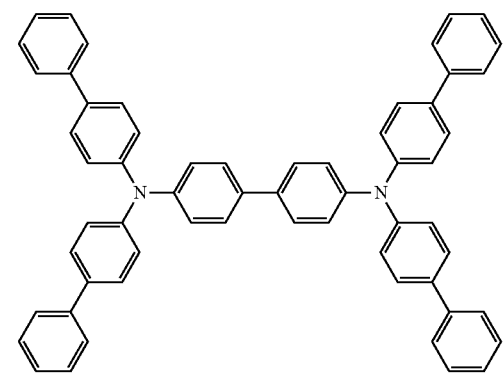 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
TEG-1
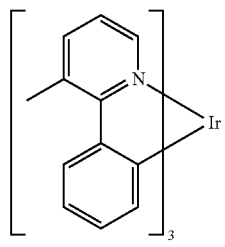
TABLE 3-continued
Structural formulae of the materials used
NPB
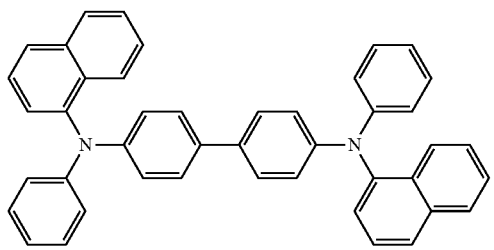 [SMILES: c1ccc(N(c2ccc(-c3ccc(N(c4ccccc4)c4cccc5ccccc45)cc3)cc2)c2cccc3ccccc23)cc1]
EBM1
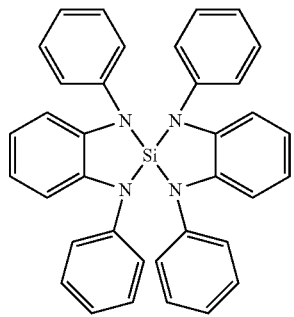 [SMILES: c1ccc(N2c3ccccc3N(c3ccccc3)[Si]23N(c2ccccc2)c2ccccc2N3c2ccccc2)cc1]
EBM2
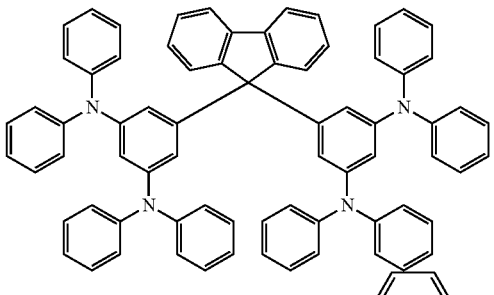
M1
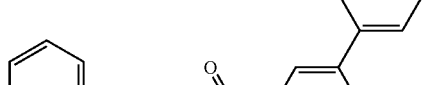
M2
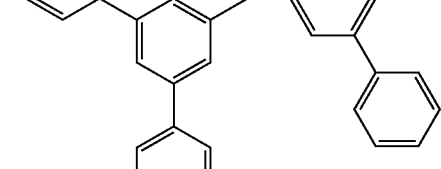

TABLE 3-continued
Structural formulae of the materials used
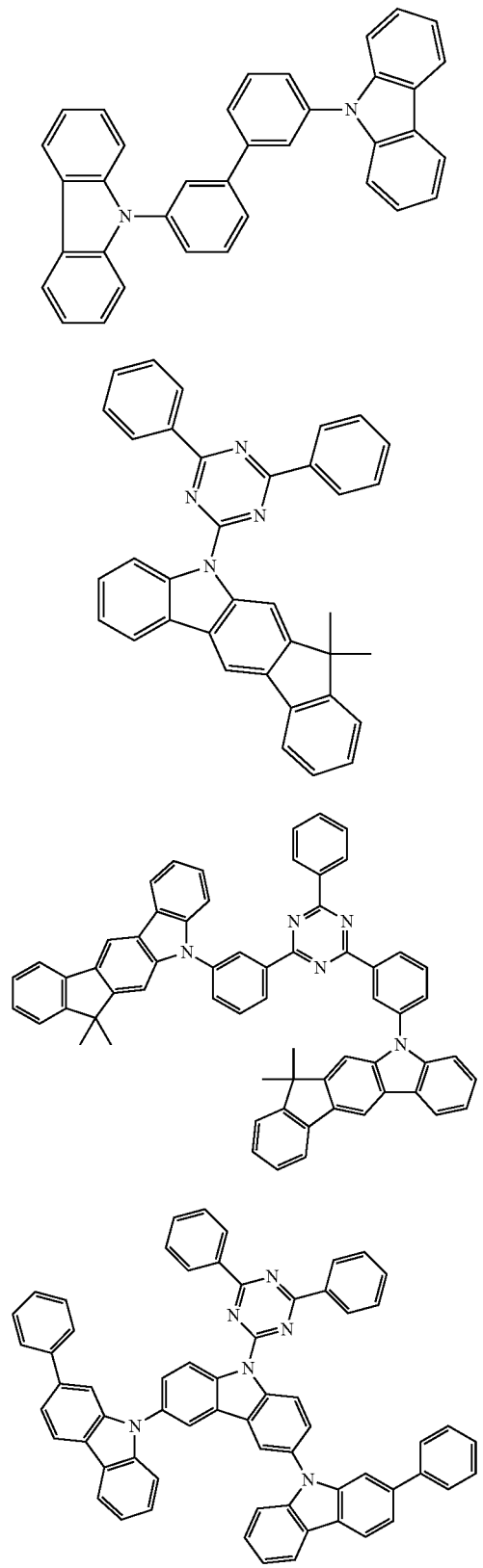
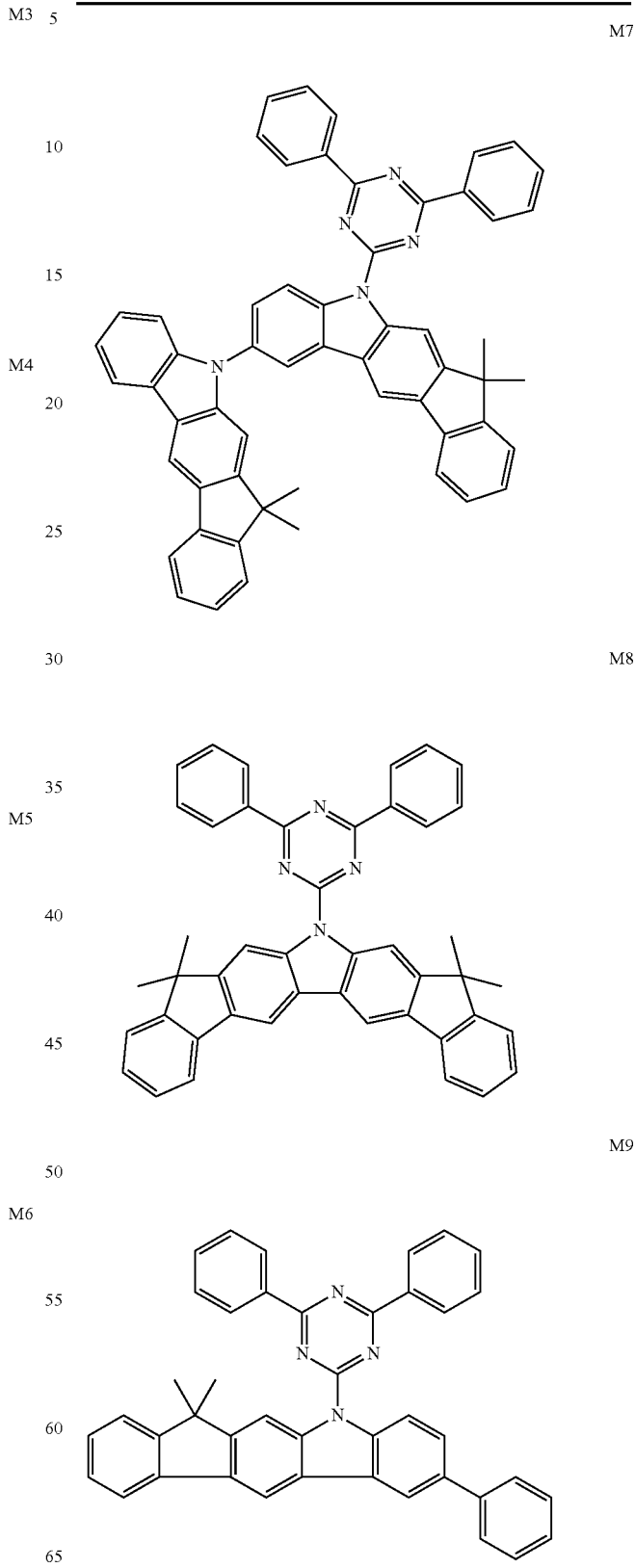

TABLE 3-continued
Structural formulae of the materials used
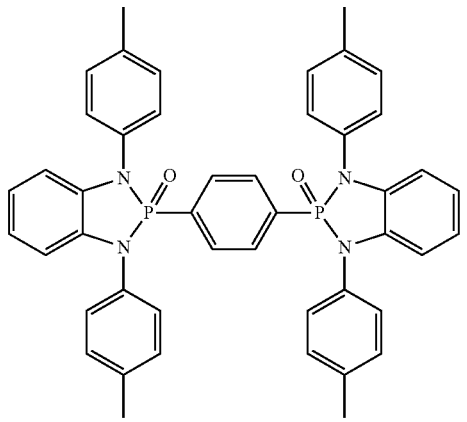 [SMILES: Cc1ccc(N2c3ccccc3N(c3ccc(C)cc3)P2(=O)c2ccc(P3(=O)N(c4ccc(C)cc4)c4ccccc4N3c3ccc(C)cc3)cc2)cc1]
M10
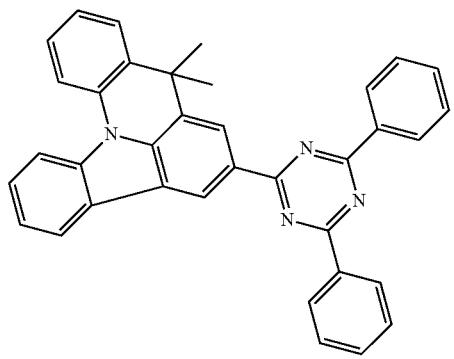 [SMILES: CC1(C)c2ccccc2-n2c3ccccc3c3cc(-c4nc(-c5ccccc5)nc(-c5ccccc5)n4)cc1c32]
M11
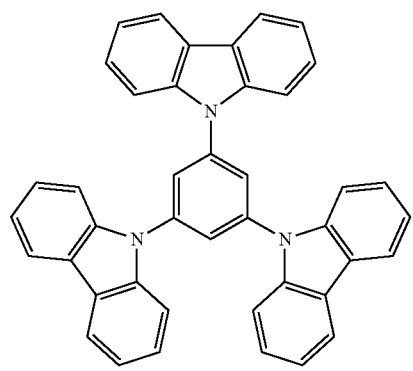 [SMILES: c1ccc2c(c1)c1ccccc1n2-c1cc(-n2c3ccccc3c3ccccc32)cc(-n2c3ccccc3c3ccccc32)c1]
M12
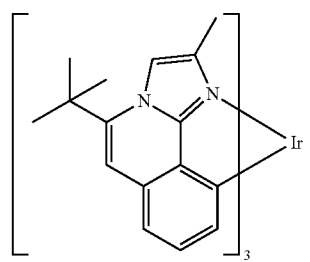
TEB-1
TABLE 3-continued
Structural formulae of the materials used
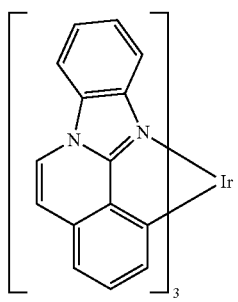
TEB-2
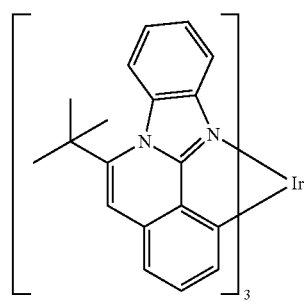
TEB-3
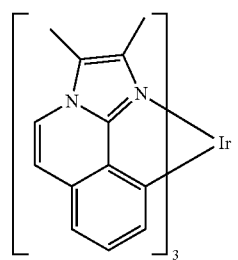
TEB-4
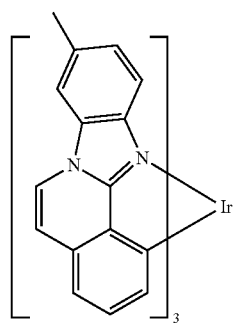
TEB-5
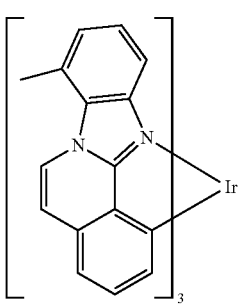
TEB-6

TABLE 3-continued

Structural formulae of the materials used

TEB-7

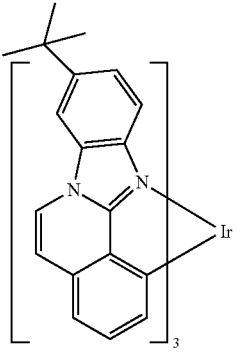

Alq

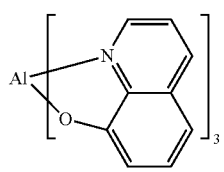

ETM1

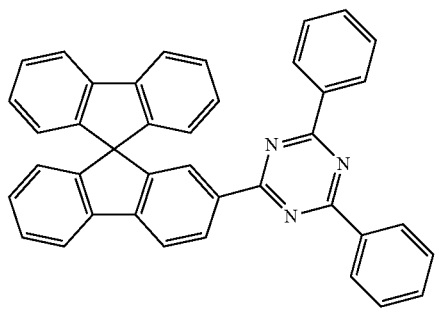 [SMILES: c1ccc(-c2nc(-c3ccccc3)nc(-c3ccc4c(c3)C3(c5ccccc5-c5ccccc53)c3ccccc3-4)n2)cc1]

ETM2

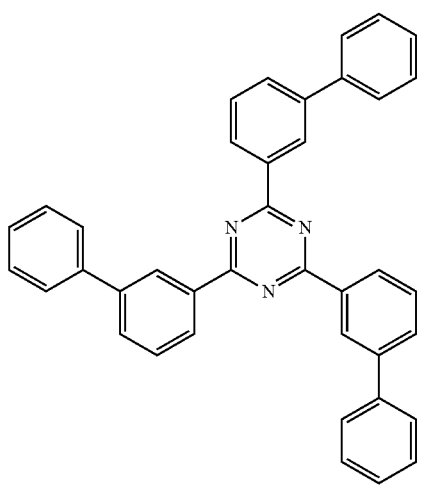 [SMILES: c1ccc(-c2cccc(-c3nc(-c4cccc(-c5ccccc5)c4)nc(-c4cccc(-c5ccccc5)c4)n3)c2)cc1]

LiQ

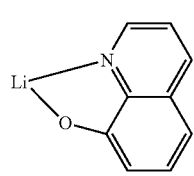

TABLE 4

HOMO/LUMO values and triplet level of the materials

| Material | HOMO (eV) | LUMO (eV) | TN (eV) | Method |
|---|---|---|---|---|
| NPB | −5.16 | −2.28 | 2.45 | org. |
| HTM | −5.14 | −2.27 | 2.52 | org. |
| EBM1 | −5.43 | −1.81 | 3.25 | org. |
| EBM2 | −5.17 | −2.16 | 2.80 | org. |
| ETM2 | −6.47 | −2.80 | 3.01 | org. |
| M1 | −6.38 | −2.79 | 2.77 | org. |
| M2 | −5.62 | −2.75 | 2.75 | org. |
| M3 | −5.78 | −2.29 | 3.09 | org. |
| M4 | −5.79 | −2.83 | 2.69 | org. |
| M5 | −5.59 | −2.96 | 2.65 | org. |
| M6 | −5.69 | −2.93 | 2.81 | org. |
| M7 | −5.47 | −2.90 | 2.71 | org. |
| M8 | −5.75 | −2.87 | 2.67 | org. |
| M9 | −5.81 | −2.84 | 2.70 | org. |
| M10 | −5.63 | −2.63 | 2.91 | org. |
| M11 | −5.71 | −2.71 | 2.79 | org. |
| M12 | −5.91 | −2.25 | 3.03 | org. |
| TEB-1 | −4.95 | −1.66 | 2.72* | organom. |
| TEB-2 | −5.23 | −2.14 | 2.59* | organom. |
| TEB-3 | −5.13 | −2.05 | 2.60* | organom. |
| TEB-4 | −4.95 | −1.71 | 2.65* | organom. |
| TEB-5 | −5.16 | −2.07 | 2.59* | organom. |
| TEB-6 | −5.18 | −2.06 | 2.57* | organom. |
| TEB-7 | −5.16 | −2.07 | 2.61* | organom. |
| TEG-1 | −5.21 | −2.26 | 2.37* | organom. |

*Determination from photoluminescence spectrum

The invention claimed is:

1. An organic electroluminescent device comprising anode, cathode and at least one emitting layer which comprises at least one phosphorescent compound A and at least one compound B, wherein the following relationships (1) or the following relationships (2) apply to compounds A and B:

$T_1(B) \geq \Delta E$, where $\Delta E = |HOMO(A)| - |LUMO(B)|$;     a)

$T_1(A) \geq \Delta E$, where $\Delta E = |HOMO(A)| - |LUMO(B)|$;     b)

$|HOMO(B)| > |HOMO(A)|$; and     c)

$|LUMO(B)| > |LUMO(A)|$;     d) (1)

or $T_1(B) \geq \Delta E$, where $\Delta E = |HOMO(B)| - |LUMO(A)|$;     a)

$T_1(A) \geq \Delta E$, where $\Delta E = |HOMO(B)| - |LUMO(A)|$;     b)

$|LUMO(A)| > |LUMO(B)|$; and     c)

$|HOMO(A)| > |HOMO(B)|$;     d) (2)

where $T_1(A)$ or $T_1(B)$ each represents the lowest triplet energy in eV of compound A or B respectively;

and where HOMO(A) or HOMO(B) each represents the energy level of the HOMO in eV relative to vacuum of compound A or B respectively;

and where LUMO(A) or LUMO(B) each represents the energy level of the LUMO in eV relative to vacuum of compound A or B respectively;

the following materials are excluded from the invention as compound B:

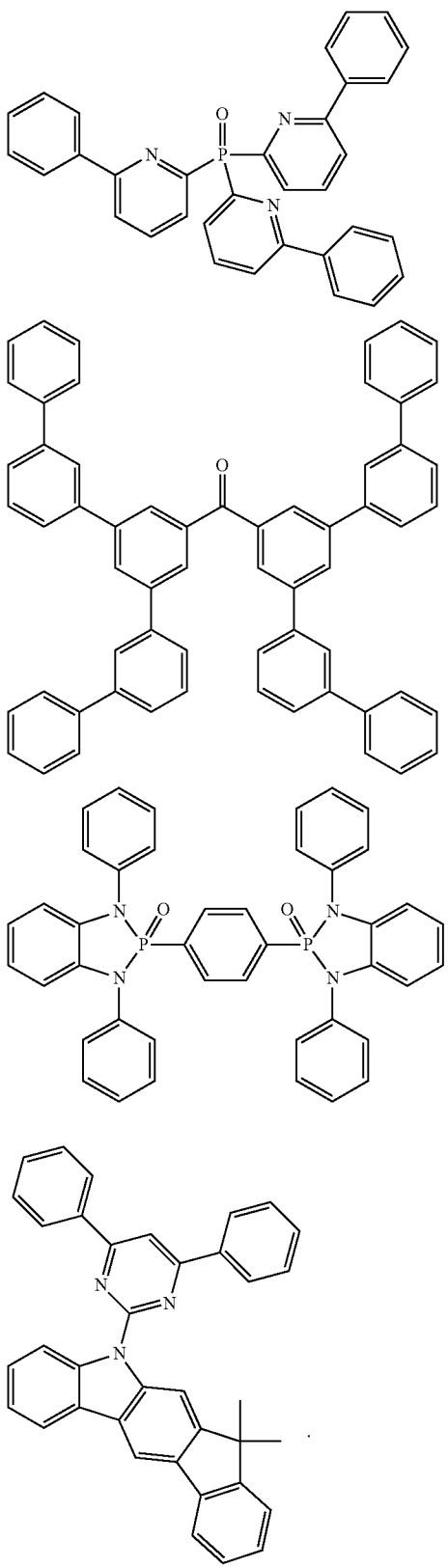

more further materials C, where the following applies to each of these materials C:

$T_1(C) \geq T_1(A)$  a)

$T_1(C) \geq T_1(B)$  b)

|HOMO(C)| > |HOMO(A)| and |HOMO(C)| > |HOMO(B)|;  c)

|LUMO(C)| < |LUMO(A)| and |LUMO(C)| < |LUMO(B)|  d).

3. The organic electroluminescent device according to claim 1, wherein compound B and, if present, C has a glass-transition temperature $T_G$ of greater than 70° C.

4. The organic electroluminescent device according to claim 1, wherein compound B and, if present, C has a glass-transition temperature $T_G$ of greater than 90° C.

5. The organic electroluminescent device according to claim 1, wherein the proportion of phosphorescent compound A in the emitting layer is 0.1 to 50% by vol.

6. The organic electroluminescent device according to claim 1, wherein the proportion of phosphorescent compound A in the emitting layer is 1 to 30% by vol and ΔE is greater than 2.05 eV and $T_1(A)$ is greater than 2.5 eV.

7. The organic electroluminescent device according to claim 1, wherein ΔE is greater than 1.90 eV.

8. The organic electroluminescent device according to claim 1, wherein $T_1(A)$ is greater than 2.3 eV.

9. The organic electroluminescent device according to claim 1, wherein if the relationship (1) mentioned in claim 1 is satisfied, |HOMO(B)| is at least 0.05 eV greater than |HOMO(A)|, and in that, if the relationship (2) mentioned in claim 1 is satisfied, |LUMO(A)| is at least 0.05 eV greater than |LUMO(B)|.

10. The organic electroluminescent device according to claim 1, wherein if the relationship (1) mentioned in claim 1 is satisfied, |HOMO(B)| is at least 0.1 eV greater than |HOMO(A)|, and in that, if the relationship (2) mentioned in claim 1 is satisfied, |LUMO(A)| is at least 0.1 eV greater than |LUMO(B)|.

11. The organic electroluminescent device according to claim 1, wherein if relationship (1) is satisfied, compound B is selected from the group consisting of aromatic ketones, aromatic phosphine oxides, aromatic sulfoxides, aromatic sulfones, triazine derivatives, pyrimidine derivatives, pyridine derivatives, zinc complexes, aluminium complexes, diazaphospholes, azaboroles, boronic esters, boranes and triphenylene derivatives.

12. The organic electroluminescent device according to claim 11, wherein the aromatic ketone is a compound of the following formula (1a) and the aromatic phosphine oxide is a compound of the following formula (1b),

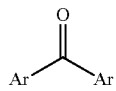

formula (1a)

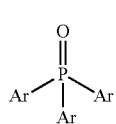

formula (1b)

2. The organic electroluminescent device according to claim 1, wherein the emitting layer only consists of compounds A and B or in that the emitting layer comprises one or more further materials C:

where the following applies to the symbols used:
Ar is on each occurrence, identically or differently, an aromatic or heteroaromatic ring system having 5 to 60 aromatic ring atoms, which may in each case be substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, N(R$^2$)$_2$, N(Ar$^1$)$_2$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more non-adjacent CH$_2$ groups is optionally replaced by R$^2$C=CR$^2$, C≡C, Si(R$^2$)$_2$, C=O, C=S, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which is optionally substituted by one or more radicals $R^2$, or a combination of these systems; two or more adjacent substituents $R^1$ here may also form a mono- or polycyclic, aliphatic or aromatic ring system with one another;

$Ar^1$ is on each occurrence, identically or differently, an aromatic or heteroaromatic ring system having 5 to 40 aromatic ring atoms, which is optionally substituted by one or more radicals $R^2$;

$R^2$ is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents $R^2$ here may also form a mono- or polycyclic, aliphatic or aromatic ring system with one another;

and in that the triazine derivative is a compound of the following formula (6) or (7),

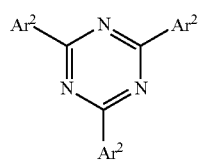
formula (6)

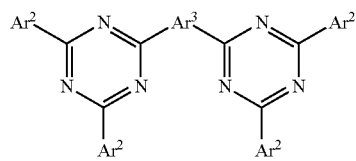
formula (7)

where $R^1$ has the meaning given above and the following applies to the other symbols used:

$Ar^2$ is, identically or differently on each occurrence, a monovalent aromatic or heteroaromatic ring system having 5 to 60 aromatic ring atoms, which may in each case be substituted by one or more radicals $R^1$;

$Ar^3$ is a divalent aromatic or heteroaromatic ring system having 5 to 60 aromatic ring atoms, which is optionally substituted by one or more radicals $R^1$;

and in that the pyrimidine derivative is a compound following formula (25), (26) or (27),

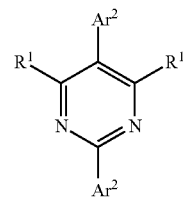
formula (25)

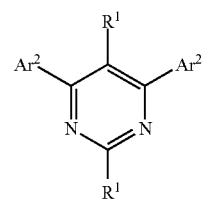
formula (26)

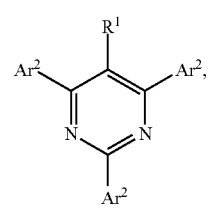
formula (27)

where the symbols used have the meaning given above.

13. The organic electroluminescent device according to claim 1, wherein, if relationship (2) is satisfied, compound B is selected from the group consisting of carbazole derivatives, triarylamine derivatives, bridged carbazole derivatives, indolocarbazole derivatives, indenocarbazole derivatives, azacarbazole derivatives, dibenzofuran and dibenzothiophene derivatives and diazasilole derivatives and tetraazasilole derivatives.

14. The organic electroluminescent device according to claim 10, wherein the aromatic amines and carbazoles are compounds of the following formulae (28) to (33),

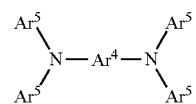
formula (28)

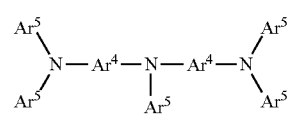
formula (29)

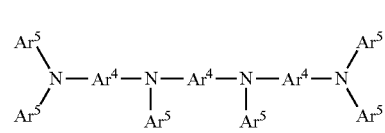
formula (30)

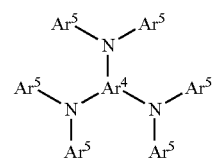
formula (31)

-continued

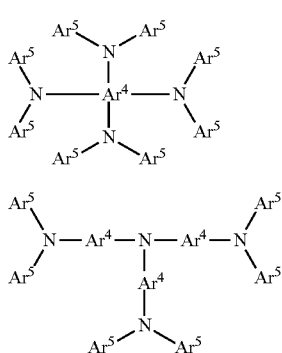

formula (32)

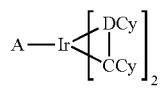

formula (33)

wherein

R$^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, N(R$^2$)$_2$, N(Ar$^1$)$_2$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, C=O, C=S, C=NR, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 40 aromatic ring atoms, which is optionally substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms is optionally replaced by F; two or more adjacent substituents R$^2$ here may also form a mono- or polycyclic, aliphatic or aromatic ring system with one another;

Ar$^4$ is on each occurrence, identically or differently, a divalent, trivalent or tetravalent aromatic or heteroaromatic ring system having 5 to 60 aromatic ring atoms, which is optionally substituted by one or more radicals R$^1$; and Ar$^5$ is on each occurrence, identically or differently, a monovalent aromatic or heteroaromatic ring system having 5 to 60 aromatic ring atoms, which is optionally substituted by one or more radicals R$^1$, two groups Ar$^5$ here which are bonded to the same nitrogen atom or one group Ar$^4$ with one group Ar$^5$ which are bonded to the same nitrogen atom is optionally linked to one another by a single bond or a bridge selected from the group consisting of B(R$^1$), C(R$^1$)$_2$, Si(R$^1$)$_2$, C=O, C=NR$^1$, C=C(R$^1$)$_2$, O, S, S=O, SO$_2$, N(R$^1$), P(R$^1$) and P(=O) R$^1$.

15. The organic electroluminescent device according to claim 1, wherein phosphorescent compound A is a compound of the formulae (43) to (46), A—Ir⟨[DCy|CCy]⟩$_2$  formula (43)

Ir⟨[DCy|CCy]⟩$_3$  formula (44)

A—Pt⟨DCy|CCy⟩  formula (45)

Pt⟨[DCy|CCy]⟩$_2$  formula (46)

where R$^1$ has the same meaning as defined in claim 9 and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents R$^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents R$^1$;

A is, identically or differently on each occurrence, a monoanionic, bidentate chelating ligand, preferably a diketonate ligand or a picolinate;

or in that phosphorescent compound A is a compound of the formula (47),

M(L)$_p$(L')$_q$  formula (47)

containing a moiety M(L)$_p$ of the formula (48) or formula (49):

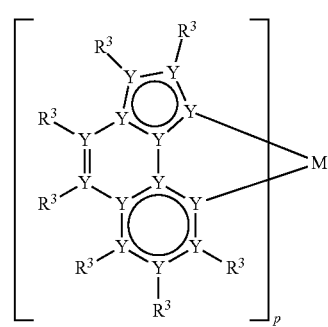

formula (48)

-continued

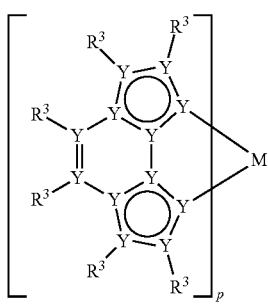

formula (49)

where the following applies to the symbols and indices used:

M is a metal;

Y is selected on each occurrence, identically or differently, from the group consisting of C and N; all Y here together represent a 14 π electron system;

$R^3$ is on each occurrence, identically or differently, H, D, F, Cl, Br, I, $N(R^4)_2$, CN, $NO_2$, $Si(R^4)_3$, $B(OR^4)_2$, C(=O)$R^4$, P(=O)$(R^4)_2$, S(=O)$R^4$, S(=O)$_2R^4$, $OSO_2R^4$, a straight-chain alkyl, alkoxy, thioalkoxy or imine group having 1 to 40 C atoms or an alkenyl or alkynyl group having 2 to 40 C atoms or a branched or cyclic alkyl, alkoxy or thioalkoxy group having 3 to 40 C atoms, where the above-mentioned alkyl, alkoxy, thioalkoxy, imine, alkenyl or alkynyl groups may each be substituted by one or more radicals $R^4$, where one or more non-adjacent $CH_2$ groups is optionally replaced by $R^4C=CR^4$, C≡C, $Si(R^4)_2$, C=O, C=S, C=$NR^4$, P(=O)$(R^4)$, SO, $SO_2$, $NR^4$, O, S or $CONR^4$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^4$, or an aryloxy or heteroaryloxy group having 5 to 60 aromatic ring atoms, which is optionally substituted by one or more radicals $R^4$, or an aralkyl or heteroaralkyl group having 5 to 60 aromatic ring atoms, which is optionally substituted by one or more radicals $R^4$, or a diarylamino group, diheteroarylamino group or arylheteroarylamino group having 10 to 40 aromatic ring atoms, which is optionally substituted by one or more radicals $R^4$; two or more adjacent radicals $R^3$ here may also form a mono- or polycyclic, aliphatic, aromatic and/or benzo-fused ring system with one another;

with the proviso that $R^3$ represents a free electron pair if the group Y to which this radical $R^3$ is bonded is a nitrogen atom having a saturated valence;

$R^4$ is on each occurrence, identically or differently, H, D, F, Cl, Br, I, $N(R^2)_2$, CN, $NO_2$, $Si(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $Si(R^2)_2$, C=O, C=S, C=$NR^2$, P(=O)$(R^2)$, SO, $SO_2$, $NR^2$, O, S or $CONR^2$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, which is optionally substituted by one or more radicals $R^2$, or a diarylamino group, diheteroarylamino group or arylheteroarylamino group having 10 to 40 aromatic ring atoms, which is optionally substituted by one or more radicals $R^2$; two or more adjacent radicals $R^4$ here may form a mono- or polycyclic, aliphatic or aromatic ring system with one another; $R^2$ here has the meaning given above;

L' is, identically or differently on each occurrence, a co-ligand;

p is 1, 2 or 3;

q is 0, 1, 2, 3 or 4;

a plurality of ligands L here may also be linked to one another or L is optionally linked to L' via any desired bridge V and thus form a tridentate, tetradentate, pentadentate or hexadentate ligand system.

16. The organic electroluminescent device according to claim 15, wherein M is Ir or Pt.

17. The organic electroluminescent device according to claim 1, wherein the device emits white light.

18. A process for the production of an organic electroluminescent device according to claim 1, which comprises applying at least one layer using a sublimation process and/or in that at least one layer is applied using the OVPD process and/or in that at least one layer is applied from solution or by a printing process.

19. A formulation comprising at least one phosphorescent compound A and at least one compound B, where the relationships mentioned in claim 1 apply to compounds A and B.

* * * * *